United States Patent [19]

Sekiyama et al.

[11] Patent Number: 5,657,242
[45] Date of Patent: Aug. 12, 1997

[54] METHOD OF DETERMINING ROUTES FOR A PLURALITY OF WIRING CONNECTIONS AND A CIRCUIT BOARD PRODUCED BY SUCH A METHOD

[75] Inventors: Yutaka Sekiyama; Yasuyuki Fujihara; Terumine Hayashi, all of Hitachi; Hiromi Tanaka, Juuou-machi; Jiro Kusuhara, Hatano, all of Japan

[73] Assignee: Hitachi, Ltd., Tokyo, Japan

[21] Appl. No.: 10,070

[22] Filed: Jan. 25, 1993

[30] Foreign Application Priority Data

Jan. 23, 1992 [JP] Japan .................................. 4-010259

[51] Int. Cl.$^6$ .................................................. G06F 17/50
[52] U.S. Cl. ........................................... 364/491; 364/490
[58] Field of Search ..................................... 364/489, 490, 364/491

[56] References Cited

U.S. PATENT DOCUMENTS

| | | | |
|---|---|---|---|
| 4,535,388 | 8/1985 | Kraus et al. | 361/414 |
| 4,571,451 | 2/1986 | Linsker et al. | 174/68.5 |
| 4,577,276 | 3/1986 | Dunlop et al. | 364/491 |
| 4,593,362 | 6/1986 | Bergeron et al. | 364/488 |
| 4,593,363 | 6/1986 | Burstein et al. | 364/491 |
| 4,613,941 | 9/1986 | Smith et al. | 364/490 |
| 4,615,011 | 9/1986 | Linsker | 364/491 |
| 4,777,606 | 10/1988 | Fournier | 364/491 |
| 4,782,193 | 11/1988 | Linsker et al. | 174/68.5 |
| 5,187,671 | 2/1993 | Cobb | 364/490 |
| 5,359,538 | 10/1994 | Hui et al. | 364/491 |

FOREIGN PATENT DOCUMENTS

| | | |
|---|---|---|
| 54-79472 | 6/1979 | Japan . |
| 2-90368 | 3/1990 | Japan . |
| 2-127772 | 5/1990 | Japan . |

OTHER PUBLICATIONS

IEEE Int'l Conf. on Computer Aided Design, Nov. 7, 1988, Tzeng et al., "Codar: A Congestion–Directed General Area Router", pp. 30–33.

IBM Journal of Research and Development, vol. 28, No. 5, 1984, Linsker, "An Iterative–Improvement Penalty–Function Driven Wire Routing System".

R. Linsker, "An iterative improvement penalty–function–driven wire routing system," IBM J. Res. Dev., vol. 28 No. 5, Sep. 1984.

*Primary Examiner*—Kevin J. Teska
*Assistant Examiner*—Thai Phan
*Attorney, Agent, or Firm*—Antonelli, Terry, Stout & Kraus, LLP.

[57] ABSTRACT

In order to determine the routes of wiring connections on a multi-layer circuit board, to form a suitable wiring pattern without local congestions of the wiring connections, the wiring region of the circuit board is considered as one or more areas. For each area, a preferred wiring direction is determined for each layer of the circuit board. Those preferred directions for the layers may be determined by proposing initial preferred wiring directions for each layer, determining whether there is congestion of the wiring connections in any area, and changing the wiring direction for one or more layers of such an area to reduce the congestion. Alternatively, the wiring directions can be determined for each layer without there being an initial wiring direction which is common to all areas. Furthermore, an excess number value may be obtained, which is the sum by which the desired number of wiring connections of an area exceed a predetermined value, for a series of candidate wiring directions of the layers of the area, and then the candidate is selected which has the minimum excess value.

28 Claims, 43 Drawing Sheets

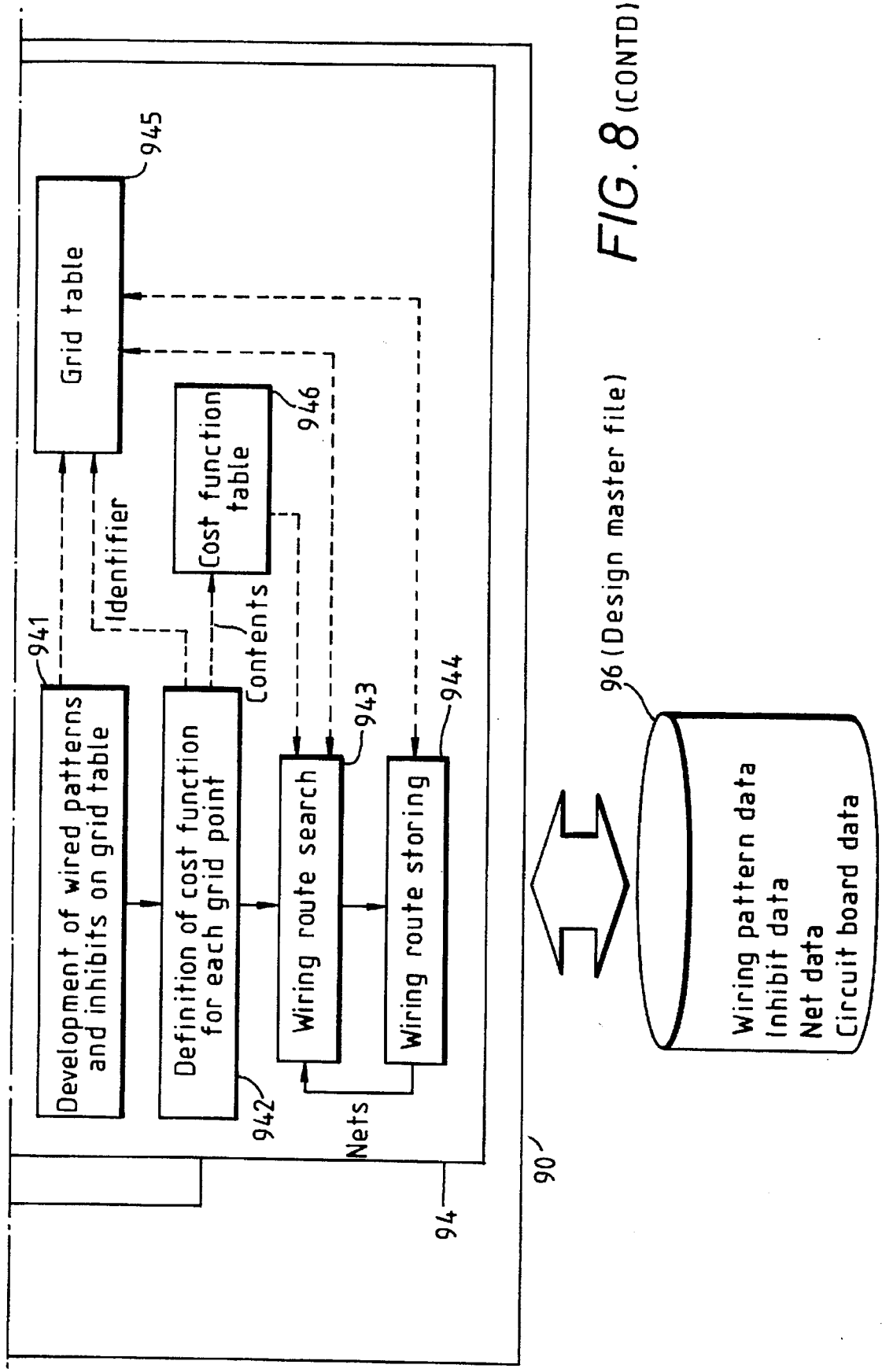
FIG. 8 (CONTD)

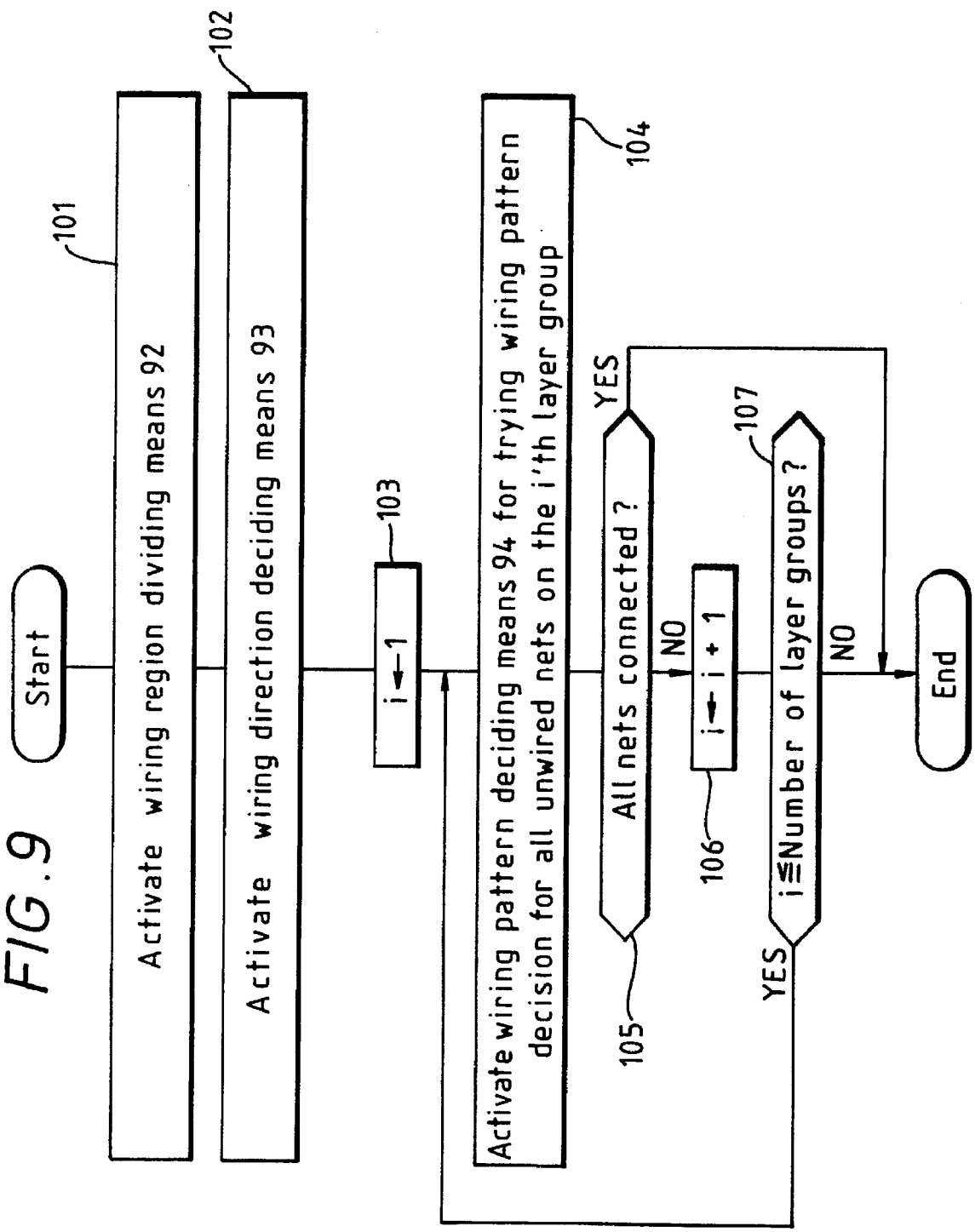

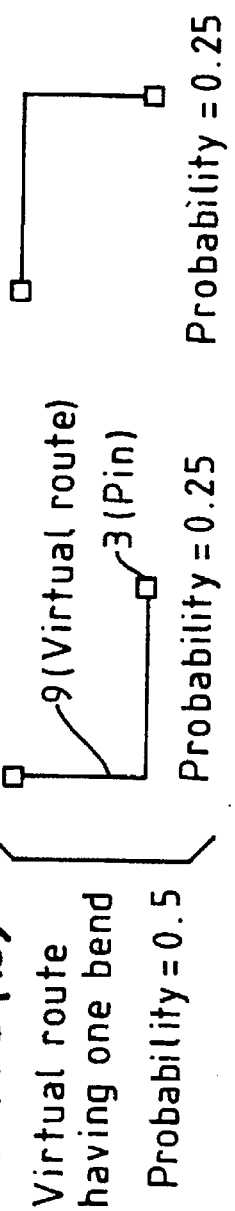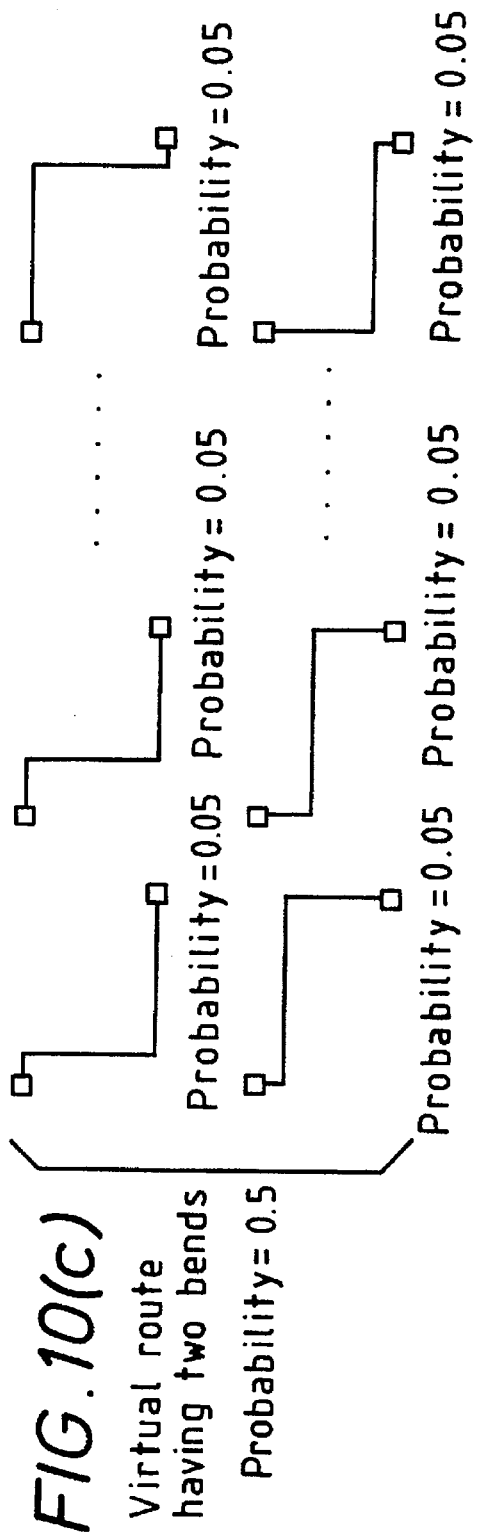
FIG. 10(a)
FIG. 10(b) Virtual route having one bend
FIG. 10(c) Virtual route having two bends Required number of x direction nets Required number of y direction nets

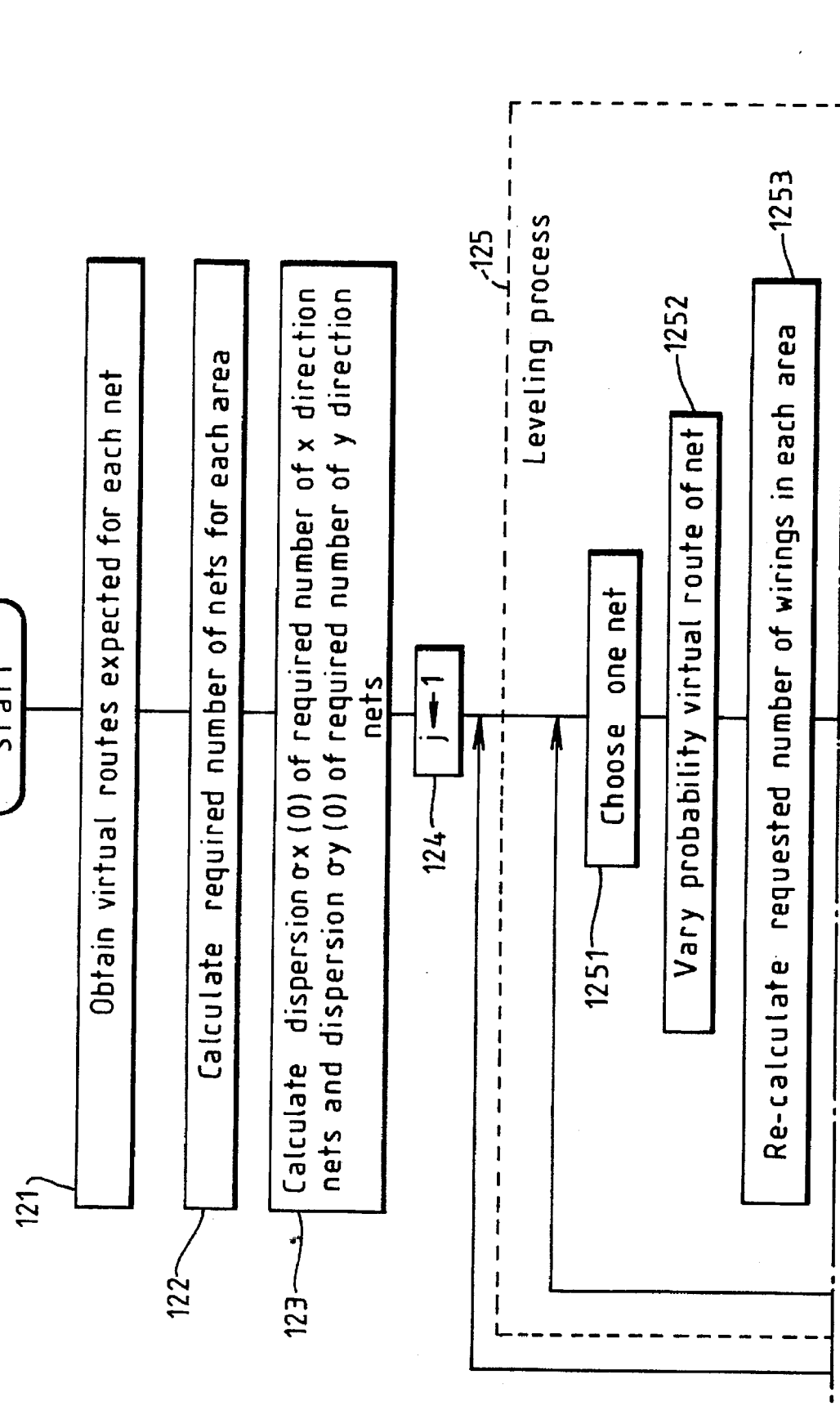

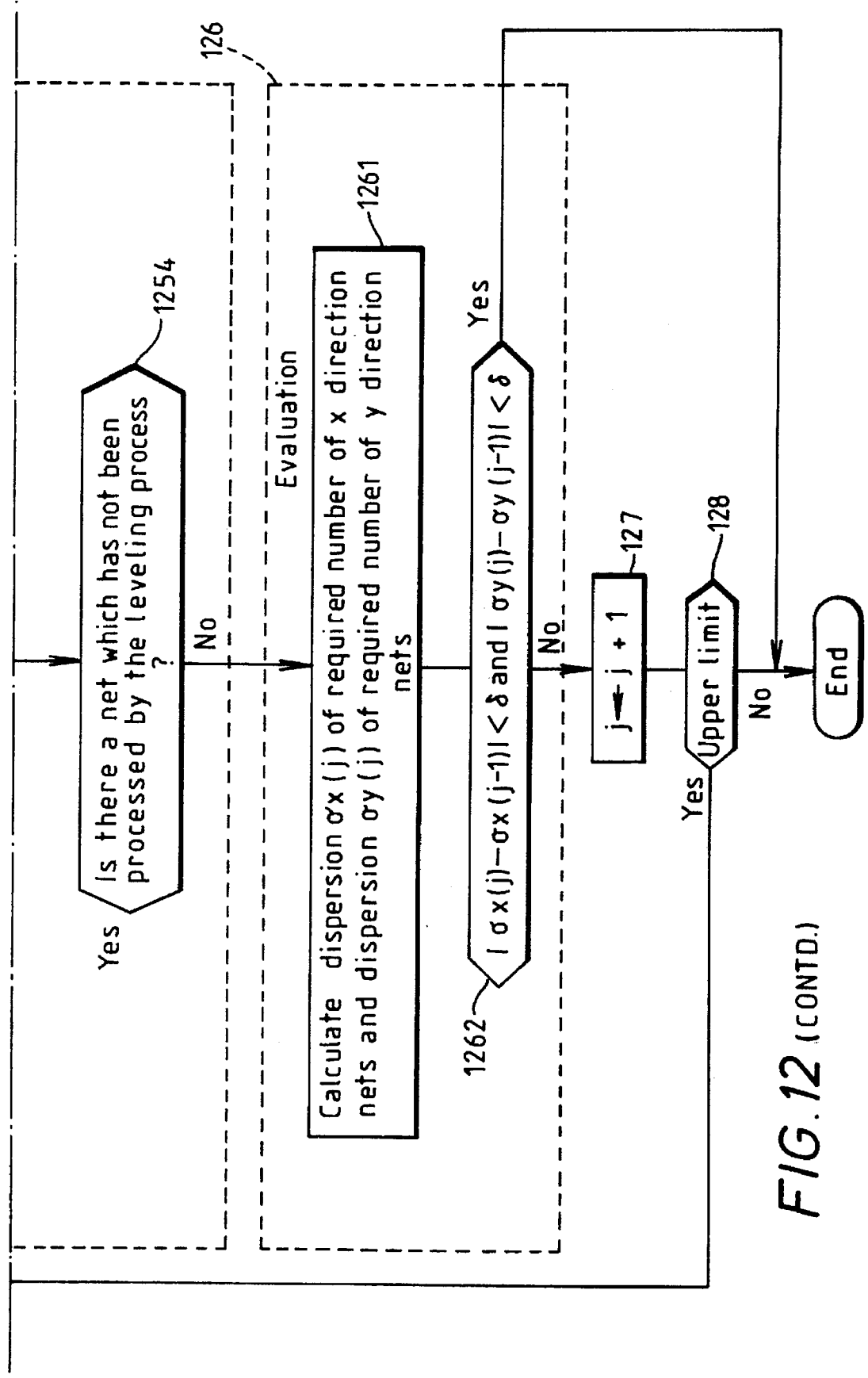
FIG. 12 (CONTD.)

x direction required number = 18 and y direction required number = 7

| Candidate wiring direction | x x x x | x x x y | x x x y (Standard) | x y x y | x y y y |
|---|---|---|---|---|---|
| x Direction wiring capacity | 20 | 15 | 10 | 5 | 0 |
| y Direction wiring capacity | 0 | 5 | 10 | 15 | 20 |
| x Direction passing number | 18 | 15 | 10 | 5 | 0 |
| y Direction passing number | 0 | 5 | 7 | 7 | 7 |
| 1) x Direction excess number | 0 | 3 | 8 | 13 | 18 |
| 2) y Direction excess number | 7 | 2 | 0 | 0 | 0 |
| 1)+2) | 7 | 5 | 8 | 13 | 18 |

⇑ Selection

FIG. 14b x direction required number = 12 and y direction required number = 9

| Candidate wiring direction | x x x | x x y | x y x y (Standard) | x y y | y y y y |
|---|---|---|---|---|---|
| x Direction wiring capacity | 20 | 15 | 10 | 5 | 0 |
| y Direction wiring capacity | 0 | 5 | 10 | 15 | 20 |
| x Direction passing number | 12 | 12 | 10 | 5 | 0 |
| y Direction passing number | 0 | 5 | 9 | 9 | 9 |
| 1) x Direction excess number | 0 | 0 | 2 | 7 | 12 |
| 2) y Direction excess number | 9 | 4 | 0 | 0 | 0 |
| 1)+2) | 9 | 4 | 2 | 7 | 12 |

↑ Selection

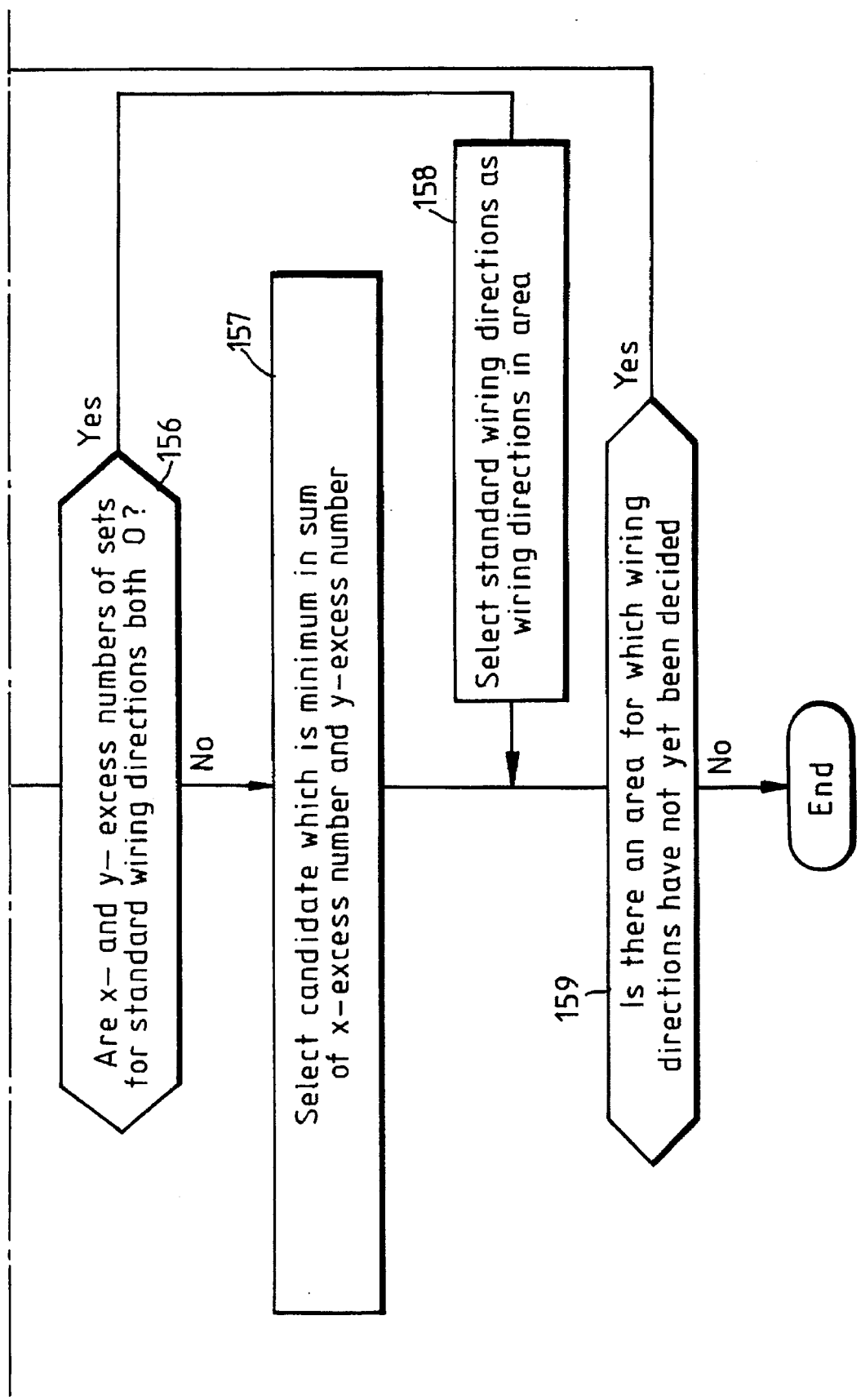

FIG.16(a) Required number 5 (Area), 2 (Wiring region)

| | | | | | |
|---|---|---|---|---|---|
| 1.2 / 2.4 | 2.5 / 1.7 | 3.1 / 3.2 | 1.7 / 2.5 | 3.6 / 2.2 | 1.8 / 1.8 |
| 2.5 / 3.2 | 3.6 / 3.9 | 0.7 / 3.5 | 8.0 / 1.4 | 9.5 / 1.6 | 3.2 / 1.3 |
| 1.8 / 7.7 | 2.9 / 9.2 | 3.5 / 2.7 | 5.8 / 2.6 | 4.6 / 2.3 | 3.1 / 1.2 |
| 2.7 / 8.4 | 0.8 / 7.6 | 3.4 / 2.3 | 2.9 / 1.2 | 2.4 / 0.8 | 1.2 / 0.7 |
| 1.1 / 2.1 | 2.8 / 3.0 | 1.4 / 2.9 | 3.7 / 1.4 | 1.9 / 1.3 | 0.3 / 0.1 |

- x direction required number (numerator)
- y direction required number (denominator)

FIG.16(b)
Excess numbers of nets for use of standard wiring direction: (x direction on 1st layer and y direction on 2nd layer)

→ I, ↓ J

| | | | | | |
|---|---|---|---|---|---|
| 0 | 0 | 0 | 0 | 0 | 0 |
| 0 | 0 | 0 | 3.0 | 4.5 | 0 |
| 2.7 | 4.2 | 0 | 0.8 | 0 | 0 |
| 3.4 | 2.6 | 0 | 0 | 0 | 0 |
| 0 | 0 | 0 | 0 | 0 | 0 |

FIG.16(c)

Excess numbers of nets for use of candidate xx (in direction x on both 1st and 2nd layers)

| 2.4 | 1.7 | 3.2 | 2.5 | 2.2 | 1.8 |
|-----|-----|-----|-----|-----|-----|
| 3.2 | 3.9 | 3.5 | 1.4 | 1.6 | 1.3 |
| 7.7 | 9.2 | 2.7 | 2.6 | 2.3 | 1.2 |
| 8.4 | 7.6 | 2.3 | 1.2 | 0.8 | 0.7 |
| 2.1 | 3.0 | 2.9 | 1.4 | 1.3 | 0.1 |

FIG.16(d)

Excess numbers of nets for use of candidate yy (in direction on both 1st and 2nd layers)

| 1.2 | 2.5 | 3.1 | 1.7 | 3.6 | 1.8 |
|-----|-----|-----|-----|-----|-----|
| 2.5 | 3.6 | 0.7 | 8.0 | 9.5 | 3.2 |
| 1.8 | 2.9 | 3.5 | 5.8 | 4.6 | 3.1 |
| 2.7 | 0.8 | 3.4 | 2.9 | 2.4 | 1.2 |
| 1.1 | 2.8 | 1.4 | 3.7 | 1.9 | 0.3 |

FIG.16(e)
Wiring directions decided
6X (1st layer)

| x | x | x | x | x | x |
|---|---|---|---|---|---|
| x | x | x | x | x | x |
| y | y | x | x | x | x |
| y | y | x | x | x | x |
| x | x | x | x | x | x |

A

FIG.16(f)
Wiring directions decided
6Y (2nd layer)

| y | y | y | y | y | y |
|---|---|---|---|---|---|
| y | y | y | x | x | y |
| y | y | y | y | y | y |
| y | y | y | y | y | y |
| y | y | y | y | y | y |

B

FIG.18(a) Cost function table

| Direction<br>Cost function identifier | E | N | W | S | NE | NW | SW | SE | U | D |
|---|---|---|---|---|---|---|---|---|---|---|
| 1 | 1 | 6 | 1 | 6 | 6 | 6 | 6 | 6 | 3 | 3 |
| 2 | 6 | 1 | 6 | 1 | 6 | 6 | 6 | 6 | 3 | 3 |
| 3 | 1 | 6 | 6 | 6 | 6 | 6 | 6 | 6 | 3 | 3 |
| 4 | 6 | 1 | 6 | 6 | 6 | 6 | 6 | 6 | 3 | 3 |
| 5 | 6 | 6 | 1 | 6 | 6 | 6 | 6 | 6 | 3 | 3 |
| 6 | 6 | 6 | 6 | 1 | 6 | 6 | 6 | 6 | 3 | 3 |

946

6 (Wiring layer)

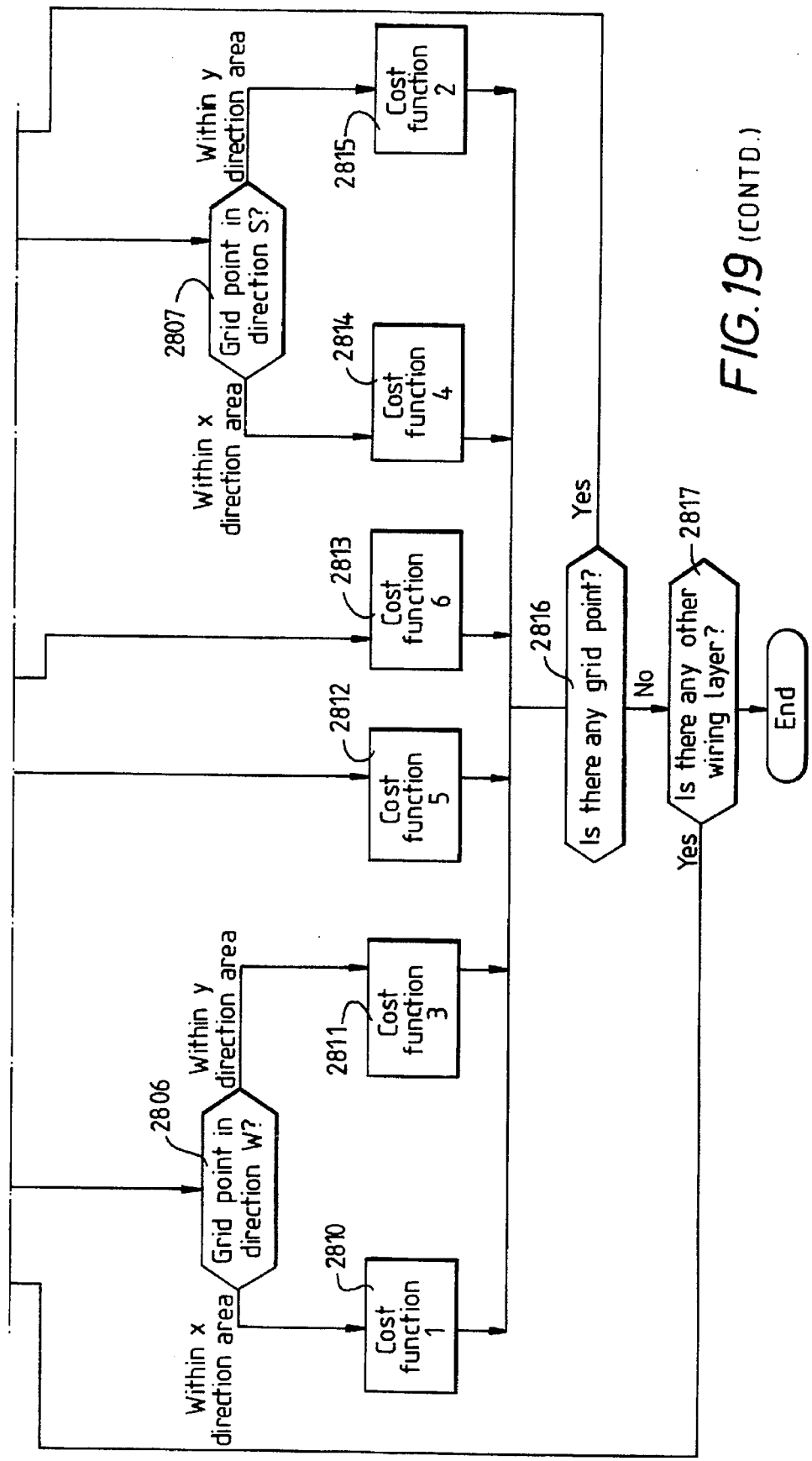
FIG.19 (CONTD.)

FIG. 20

FIG. 20 (CONTD.)
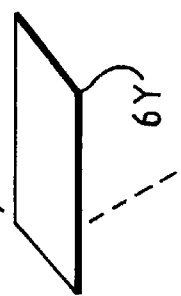

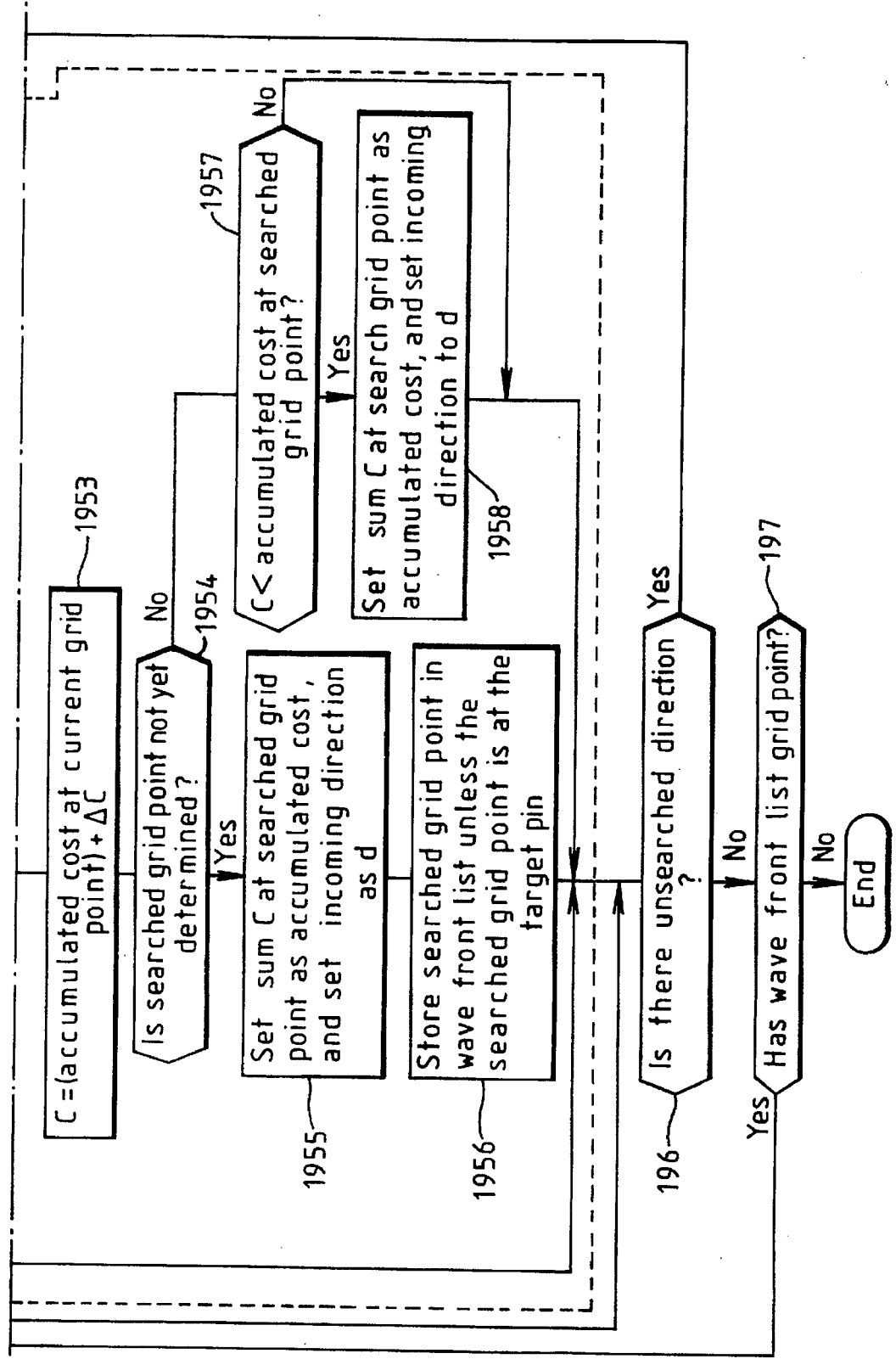

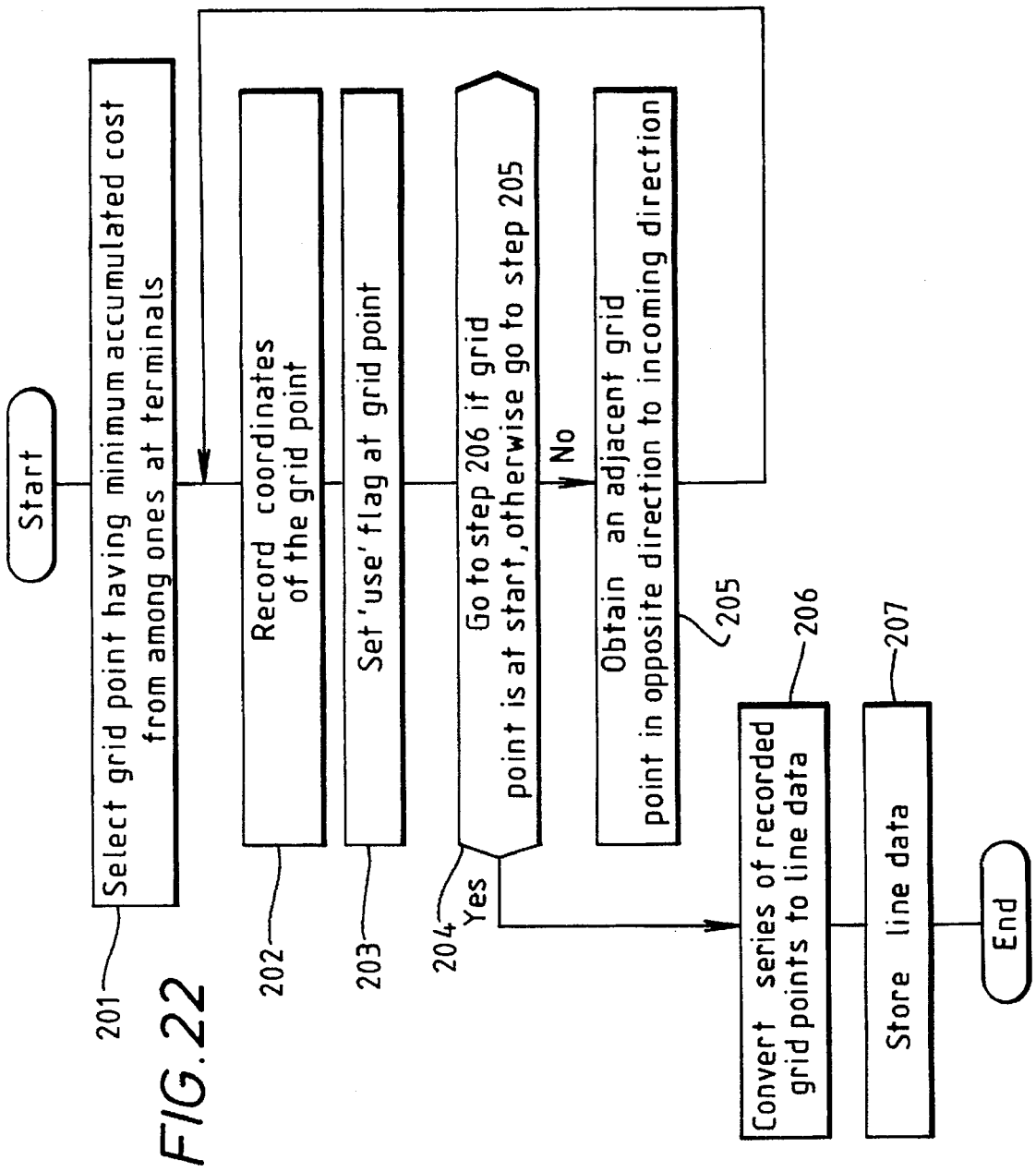

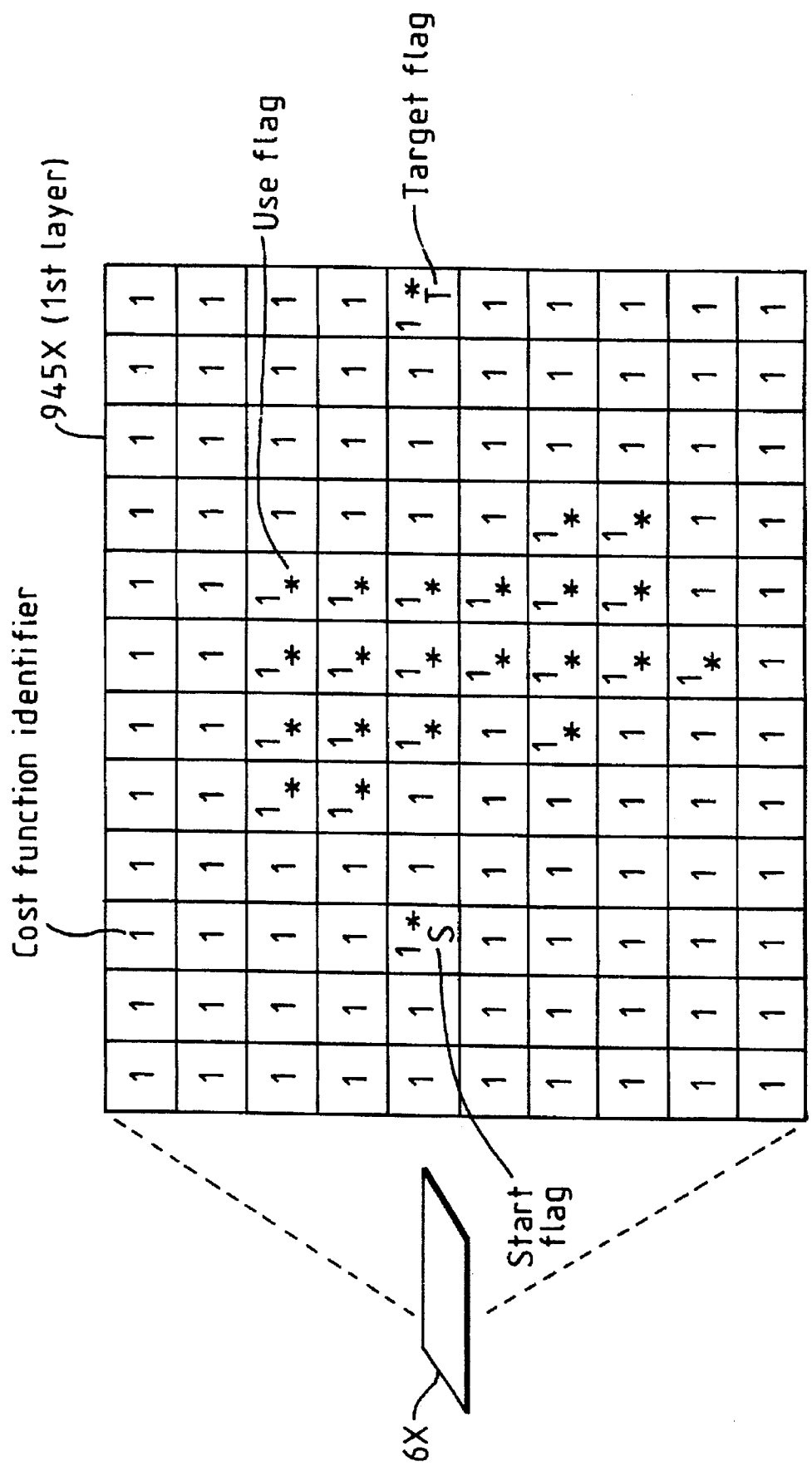

| 9 ↑ | 8 ↑ | 4 ↑ | 8 ↑ | 12 ⊗ | 13 ⊗ | 14 ⊗ | 15 ⊗ | 16 ⊗ | 17 ⊗ | 18 ⊗ | 19 ⊗ |
|---|---|---|---|---|---|---|---|---|---|---|---|
| 8 ↑ | 7 ↑ | 3 ↑ | 7 ↑ | 11 ⊗ | 12 ⊗ | 13 ⊗ | 14 ⊗ | 15 ⊗ | 16 ⊗ | 17 ⊗ | 18 ⊗ |
| 7 ↑ | 6 ↑ | 2 ↑ | 6 ↑ | 12 → | 13 → | 14 → | 15 → | 16 → | 17 ↑ | 18 ↑ | 19 ↓ |
| 6 ↑ | 5 ↑ | 1 ↑ | 5 ↑ | 11 ↓ | 12 ↓ | 13 ↓ | 14 ↓ | 15 ↓ | 16 ↓ | 18 ↓ | 20 ↓ |
| 5 ⊗ | 4 ⊗ | 0 * S | 4 ⊗ | 5 ⊗ | 6 → | 7 → | 8 → | 9 → | 15 → | 17 ⊗ | 21 * → T |
| 6 ↓ | 5 ↓ | 1 ↓ | 5 ↓ | 9 ⊗ | 10 ⊗ | 11 → | 12 → | 13 → | 16 ↓ | 18 ↓ | 22 ⊗ |
| 7 ↓ | 6 ↓ | 2 ↓ | 6 ↓ | 10 ⊗ | 11 → | 12 → | 13 → | 14 → | 17 ↓ | 19 ↓ | 23 ↓ |
| 8 ↓ | 7 ↓ | 3 ↓ | 7 ↓ | 11 ⊗ | 12 ⊗ | 13 → | 14 → | 15 → | 18 ↓ | 20 ↓ | 22 ↓ |
| 9 ↓ | 8 ↓ | 4 ↓ | 8 ↓ | 12 ⊗ | 13 ⊗ | 16 ↓ | 17 ↓ | 18 ↓ | 19 ↓ | 20 ↓ | 21 ↓ |
| 10 ↓ | 9 ↓ | 5 ↓ | 9 ↓ | 13 ⊗ | 14 ⊗ | 15 ⊗ | 16 ⊗ | 17 ⊗ | 18 ⊗ | 19 ⊗ | 20 ⊗ |

⊙ U , ⊗ D

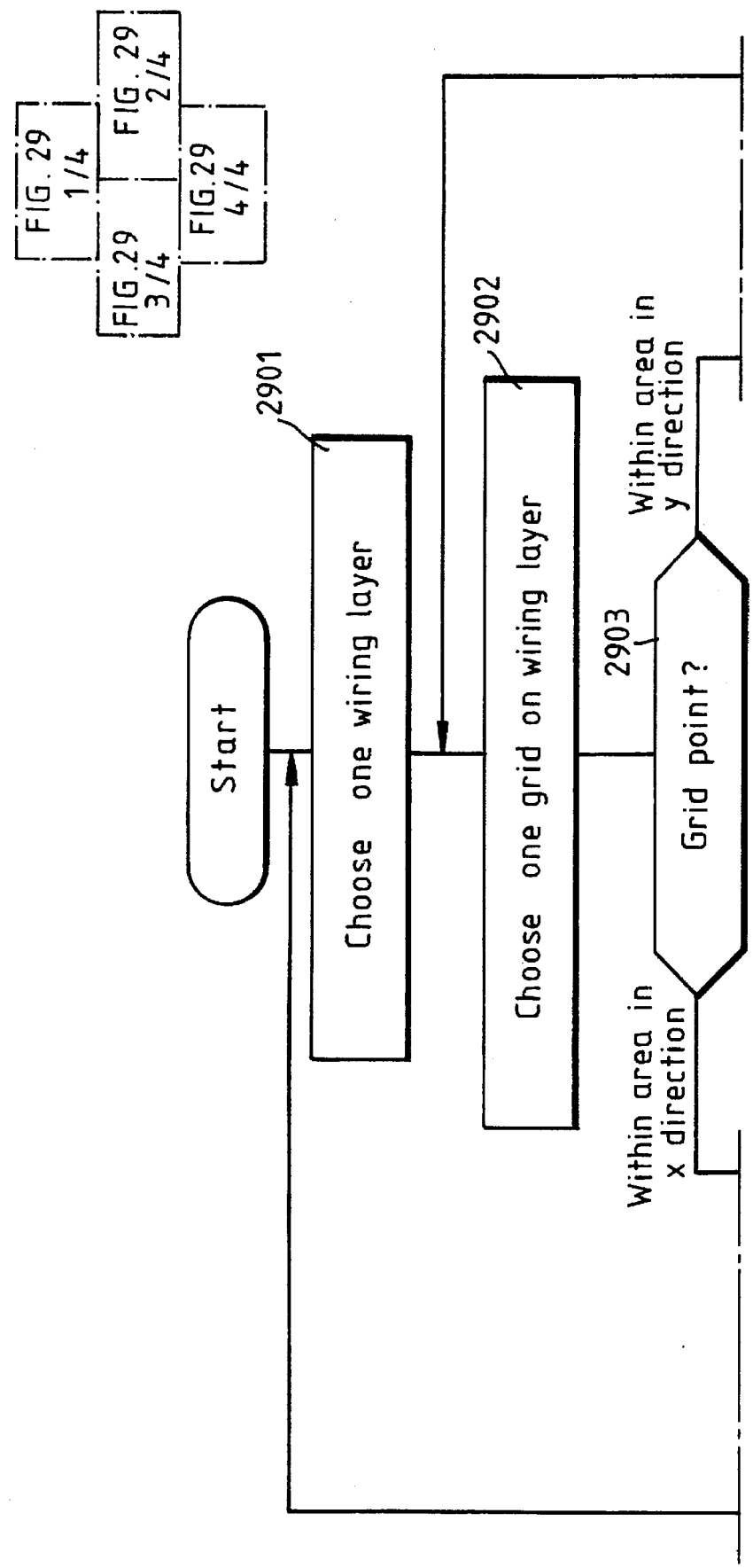
FIG.29 (1/4)

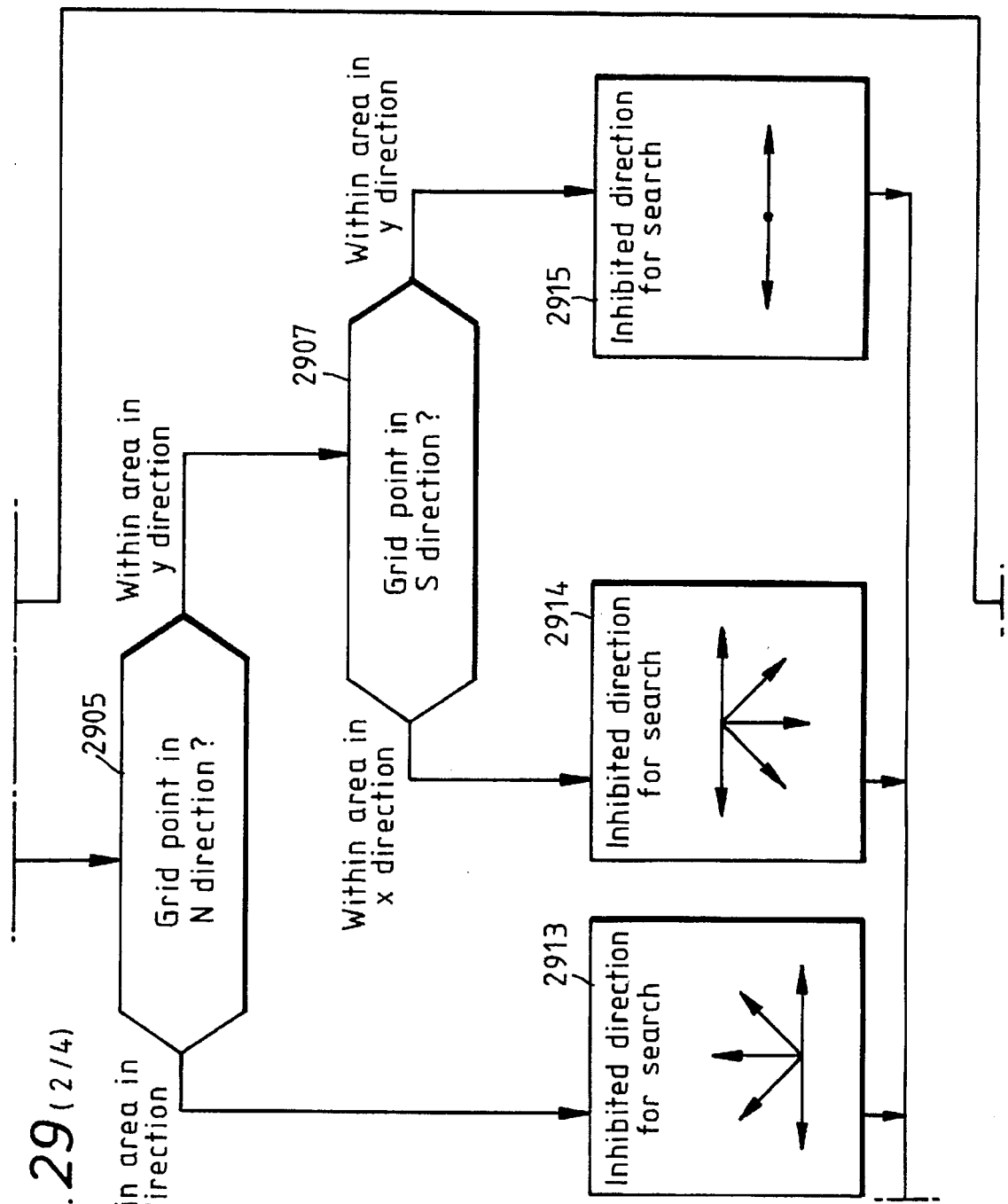

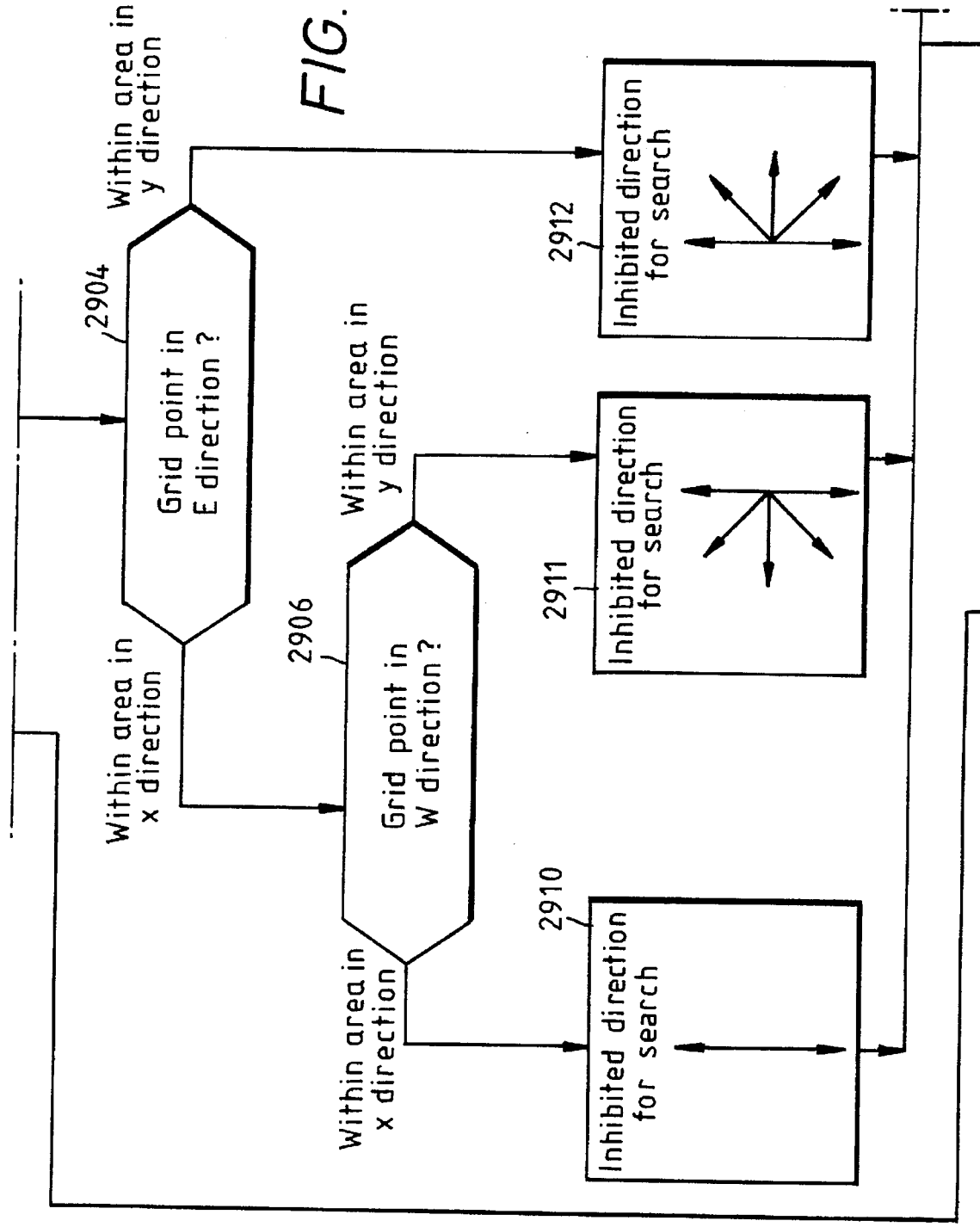
FIG. 29 (3/4)

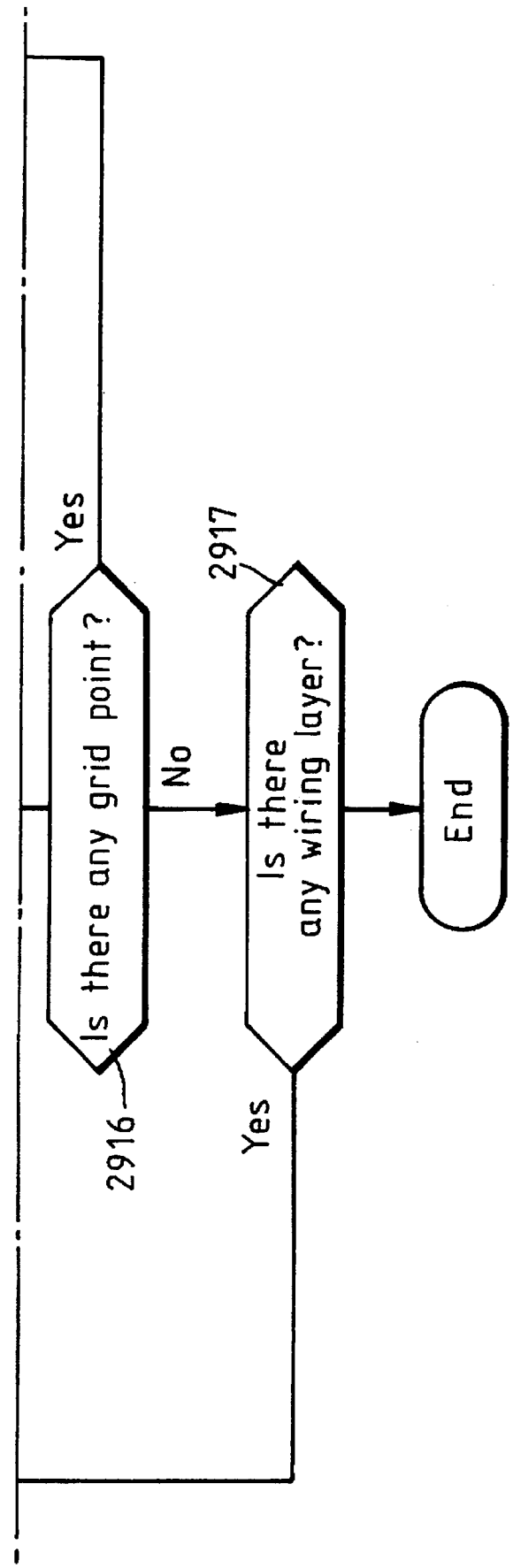
FIG. 29(4/4)

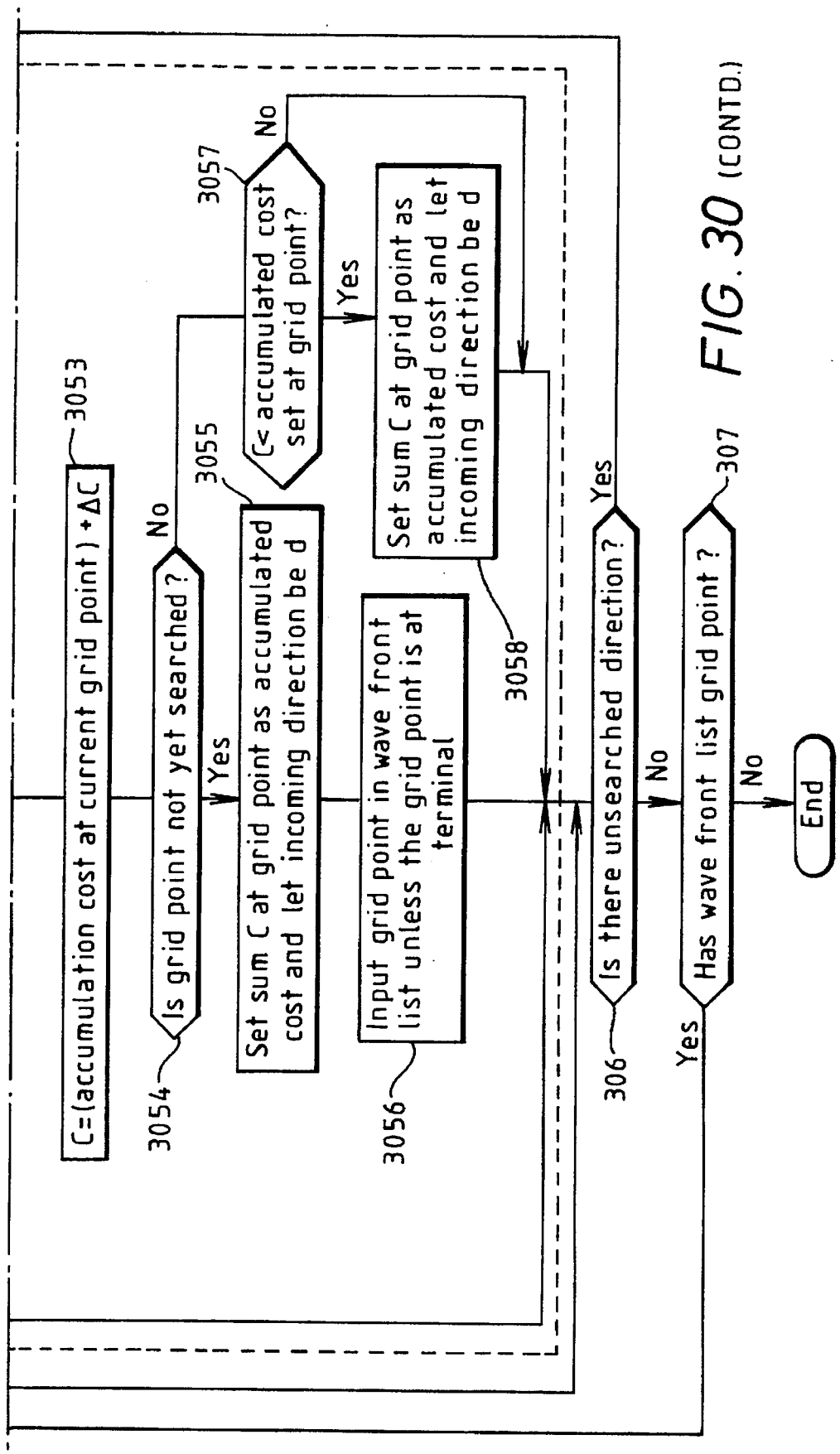
FIG. 30 (CONTD.)

METHOD OF DETERMINING ROUTES FOR A PLURALITY OF WIRING CONNECTIONS AND A CIRCUIT BOARD PRODUCED BY SUCH A METHOD

BACKGROUND OF THE INVENTION

1. Field of the Invention

The present invention relates to a method of determining routes for a plurality of wiring connections on a circuit board. It is particularly concerned with circuit boards having a plurality of layers. The present invention also relates to a circuit board having wiring connections with routes determined by such a method.

2. Summary of the Prior Art

When electronic components, such as semiconductor chips and other electronic devices are mounted on a region of a circuit board, it is necessary to interconnect terminals of such components. For this purpose, wiring connections (also referred to herein as "nets") are formed on the surface of one or more layers of the circuit board in a suitable wiring region. The wiring connections then define the electrical paths for the interconnections of the devices mounted on the circuit board.

It is common for the pattern of the wiring connections to be extremely complicated, and it is not practical to define the path of each wiring connection independently. Instead, rules must be established for determining the pattern of wiring connections, i.e. constraints on the path of the wiring connections.

Normally, the or each layer of the circuit board has a "preferred" direction, i.e. a direction in which the wiring connections should extend over the majority of its length. It is normally not essential for each wiring connection to extend in the preferential direction over its entire length, and parts of the wiring connection may extend in directions other than the preferential direction. However, such parts should be minimized in order to reduce the complexity of the pattern of the wiring connections.

The difficulty of determining the pattern of wiring connections is increased when the circuit board has a plurality of layers, which are normally parallel. Then, wiring connections on respective layers are interconnected by via holes which extend through the circuit board. In such a multi-layer circuit board, it is necessary to define the preferred direction of wiring connections for each layer.

In determining the pattern of wiring connections on the or each layer, there will be restrictions on the number of wiring connections that can pass through any given area of the circuit board, because a gap must be maintained between the wiring connections to prevent electrical contact or cross-talk therebetween. Hence, when determining the pattern of wiring connections, note must be taken of areas of congestion of the wiring connections. In such areas of congestion, the number of wiring connections approaches the maximum number permitted, as determined by the minimum width of the wiring connections, and the minimum spacing therebetween.

When determining the pattern of wiring connections in a multi-layer circuit board, the standard known method is to use a technique called the "xy rule". This rule proposes that alternate layers of the circuit board have preferred wiring directions which are perpendicular. Thus, if the preferred direction of one layer is e.g. parallel to one side of the circuit board, the preferred direction for the or each adjacent layer is parallel to a perpendicular side of the circuit board.

The use of the xy rule is common because it permits a relatively ordered pattern of wiring connections. However, it has been recognized that use of the xy rule is not wholly satisfactory, particularly for patterns of wiring connections with high density. In such cases, it is difficult to avoid congestion of the wiring connections in one or more parts of one or more layers of the circuit board, because the xy rule itself imposes a limit on the patterns of wiring connections that are possible.

Therefore, proposals have been made for arrangements in which the xy rule is not applied. In JP-A-54-79472, it was proposed that a multi-layer circuit board had some layers with a common preferred direction for the wiring connections, and the other layers for which the preferred direction was orthogonal. Then, patterns could be designed in which the majority of the wiring connections extended in the direction corresponding to the majority of the layers.

Furthermore, JP-A-2-127772 proposed optionally, that, one layer of a two-layer circuit board be divided into two or more areas, and each area had a preferred direction which was inclined to the normal orthogonal directions determined by the xy rule, and the other layer be un-divided and have a preferred direction which is one of the normal orthogonal directions. Thus, this disclosure proposed that there was one or more additional preferred directions, in addition to the two orthogonal preferred directions established by the xy rule.

In JP-A-2-90368, it was proposed that on full surface-mounted electronic devices, the preferred wiring direction was perpendicular to the adjacent side of the surface-mounted electronic devices.

Finally, in an article entitled "An Iterative-Improvement Penalty-Function Driven Routing System" by R. L. Linsker, in IBM J. Res. Develop., Vol. 28, No. 5, pages 613–624, published in 1984, it was proposed that an iterature process was carried out, in which the xy rule was ignored, and the pattern of wiring connections was built up by successive iterations.

SUMMARY OF THE PRESENT INVENTION

The applicants have investigated techniques for determining the pattern of wiring connections on a multi-layer wiring board, and have appreciated that the known methods discussed above do not provide an adequate result.

Consider the circuit board shown in FIG. 1 of the accompanying drawings. The circuit board illustrated in FIG. 1 has two layers, and has a wiring region 2 common to the two layers. A plurality of wiring connections (nets) 4 are defined in the wiring region 2 to connect pins such as pins 3, 3'. In FIG. 1, the horizonal direction will be referred to as the x direction and the vertical direction will be referred to as the y direction. It can be seen that, for the circuit board 1 of FIG. 1, there is a part A where the wiring connections need to extend in the x direction, and another part B where they need to extend in the y direction. Thus, local congestion may occur in parts A and B of the wiring region 2 of the circuit board 1.

It can be seen that the xy rule will not provide a satisfactory wiring method. If one layer has its preferred direction in the x direction and the other in the y direction, then there may be local congestion of wiring connections in the part A of the wiring region, since the majority of wiring connections in that area need to be on one layer of the circuit board 1 (the layer for which the preferred direction is in the x direction). Similarly, there may be local congestion of the wiring connections in the part B of the wiring region, since the majority of the wiring connections of that part B need to be on the layer for which the preferred direction is the y direction. If such local congestions occur, it will be difficult to provide suitable wiring connections in the parts A or B since it will not readily be possible to provide some of those connections on another layer within that part of the wiring region 2.

Furthermore, the prior art arrangement discussed above also will not provide a satisfactory solution. Since the circuit board has two layers, the proposal in JP-A-54-79472 will not apply. Even if consideration were given to a more limited application of the idea of that disclosure, by using the two layers of the circuit board 1 in the same preferred direction, this could only solve the problem for one of the parts A, B of the wiring region, and would increase the problem for the other part. Furthermore, the proposal of JP-A-2-127772 will not provide a satisfactory solution, because in spite of the use of a preferred direction on part of the wiring region of the first layer means that there is no direction assignment for the second layer which will reduce the local congestion in both parts A and B.

The proposal in the article by R. L. Linsker may permit a satisfactory solution, but it has been found that the time needed for an iterative processing of a complex pattern of wiring connections is excessively large.

Therefore, it is necessary to take into account that there may be local congestion in different directions in different parts of the wiring region of the circuit board, and the consideration of such local congestion has not been taken into account in the known methods of determining the wiring connection routes, to determine the resulting pattern.

At its most general, the present invention proposes that a predetermined area of the wiring region be considered, and on the basis of an initial proposal for the preferred wiring directions for that area, an investigation is made to determine whether that initial proposal would result in congestion within the area. If congestion would result, then the preferred wiring direction of one or more of the layers is changed from that of the initial proposal, in a way that reduces the local congestion.

Thus, for an area of the wiring region of the circuit board, a respective first one of the plurality of wiring directions is assigned to each layer. This initial assignment may be, for example, according to the xy rule. Thus, the respective first ones of the wiring directions assigned to each layer may be different from layer to layer.

Then, the number of wiring connections needed (desired) in each wiring direction is assessed for the area. On this basis it is possible to determine whether there is likely to be congestion of the wiring connections within an area. Then, if such congestion is likely, the preferred wiring directions of one or more of the layers may be changed from the initial proposal, in a way that reduces local congestion. Thus, suppose that the preferred directions of the layers are initially determined by the xy rule, and suppose further that it is determined, for an area, that there is likely to be local congestion in the x direction. Then, for that area, the xy rule is disregarded and the preferred wiring directions of the layers are selected so that a greater capacity for wiring connections in the x direction is provided within that area, by choosing those preferred wiring directions so that the majority, or all, the preferred directions of the layers were in the x direction.

In the above discussion, consideration was given to one area of the wiring region of the circuit board. The present invention further proposes that the wiring region of the circuit board be divided into a plurality of such areas, with the determination of the preferred wiring directions for the layers determined separately for each area.

With such an arrangement, the assignment of preferred wiring directions for each layer can be different from one area to another, so that congestion in one part of the circuit board, e.g. the part A of the wiring region 2 in FIG. 1, can be addressed independently of the assignment of the preferred wiring directions of the layers in another part of the circuit board, such as part B of the wiring region 2 in FIG. 1. Hence, each part of the circuit board has its own optimum assignment of preferred directions for the layers.

When there are a plurality of areas considered, it is possible for each area to be considered wholly independently of any other area. However, it can be seen that, in FIG. 1, there are some wiring connections which extend over a large part of the circuit board, and so may be affected if different areas have different preferred wiring directions for the layers thereof. Therefore, it is also possible to consider the total effect of the changes in preferred directions for the layers of each area, over all the areas, so that changes to the preferred directions of wiring layers of one area do not worsen the congestion of wiring layers of another area. The preferred wiring directions of the layers of each area may then be determined so that the total congestion is reduced.

The above discussion assumes that there is an initial assignment of the preferred directions of the wiring layers, and that initial assignment is disregarded for one or more areas if necessary. It is also possible, however, for there to be no initial assignment, and instead for the preferred wiring directions of each layer be determined without any initial arrangement common to the areas. Then, the invention may be considered as the selection, for the or each area, and for the or each layer, of a preferred direction for the wiring connections which, together with the selection made for other layers of that area, results in the minimum congestion with that area.

In further developments of the present invention, use is made of an "excess number value" which is the sum of the amounts by which a predicted number of wiring connections exceeds a predetermined value for each of the plurality of wiring directions, and for the or each area, on the basis of an assignment of preferred wiring directions to each of the layers. Then, this operation is repeated for different assignments of preferred wiring directions to the layers, to build up a plurality of excess number values. Then, the preferred wiring directions of the layers are determined for the area, on the basis of that assignment which gives the minimum excess number value.

Expressed in another way, a series of candidate assignment of preferred wiring directions for the layers is obtained, and the excess number value of the candidates compared. The optimum candidate is then the one with the minimum excess number value.

Again, although this idea is applicable to one area, it is preferably applied to a plurality of areas of the wiring region of the circuit board.

Normally, with the present invention, there will be two preferred directions for the wiring layers, which two preferred directions are preferably orthogonal. If the circuit board is generally rectangular (the word "rectangular" herein including "square"), then the two preferred wiring directions may be parallel to two perpendicular sides of the rectangle. However, it is also possible for there to be other preferred directions, e.g. inclined directions, or even for use to be made of two or more preferred directions which are not orthogonal.

A circuit board produced by a method according to the present invention will have a pattern of wiring connections which is unlike any that would be produced by known methods. The preferred wiring directions will be different in different areas of each layer, with those areas corresponding. Whilst the proposal in the article by R. L. Linsker may, by chance, produce a layer with areas with different wiring directions, this occurs entirely unpredictably, and the areas will not correspond from layer to layer. Thus, another aspect of the present invention, which is independent, may thus provide a circuit board with a plurality of layers, with each of the layers being divided into a plurality of corresponding areas, with each area having a preferred direction of wiring connections, and with different areas of each layer having different preferred directions.

BRIEF DESCRIPTION OF THE DRAWINGS

Embodiments of the present invention will now be described in detail, by way of example, with reference to the accompanying drawings, in which:

FIG. 3 shows the reduction of local congestion for the nets of FIG. 2;

FIG. 6(a) shows nets defined according to the xy rule. FIG. 6(b) shows nets defined in areas on two wiring layers in the x direction.

FIG. 7(a) shows nets according to the xy rule. FIG. 7(b) shows nets defined in areas on two wiring layers in the x direction;

FIG. 9 is a flow chart illustrating the processing carried out by the wiring process control means 91 of FIG. 8;

FIGS. 10(a) to 10(c) illustrate probabilities of virtual routes for calculation of the required number of nets. FIG. 10(a) is an example of a virtual route connecting a pair of pins parallel to the standard direction of wiring. FIGS. 10(b) and 10(c) are examples of the routes having up to two bends determined as virtual routes and illustrating the probabilities given thereto;

FIG. 11(a) shows the calculation method for the required number of nets in the x direction. FIG. 11(b) shows the calculation method for the required number of next in the y direction;

FIG. 12 is a flow chart showing in more detail the calculation of the required number of nets;

FIGS. 13(a) and 13(b) show candidate wiring directions in a two-layer circuit board. FIGS. 13(c) and 13(d) show candidate wiring directions in a three-layer circuit board. FIGS. 13(e) and 13(f) show combination of candidates for wiring directions in a four-layer circuit board;

FIGS. 14(a) and 14(b) illustrate a method for selecting the optimum wiring direction from among candidate wiring directions for each wiring layer on the basis of the required number of nets. FIG. 14(a) shows a method of determining the candidate in a area. FIG. 14(b) shows a method of determining the candidate in another area;

FIGS. 16(a) to 16(f) illustrate determination of the wiring directions for a two-layer circuit board. FIG. 16(a) shows the results of calculation of the required numbers of nets. FIGS. 16(b), 16(c), and 16(d) show the results of calculation of excess numbers for three candidates for each area. FIGS. 16(e) and 16(f) show the results of the wiring directions determined for the first layer and second layer, respectively;

FIG. 17(a) relates to the first layer, and FIG. 17(b) relates to the second layer;

FIGS. 18(a) and 18(b) illustrate further the definition of the cost functions. FIG. 18(a) shows the composition of the cost function table and definitions, and FIG. 18(b) is the definitions of the directions;

Figure 20:
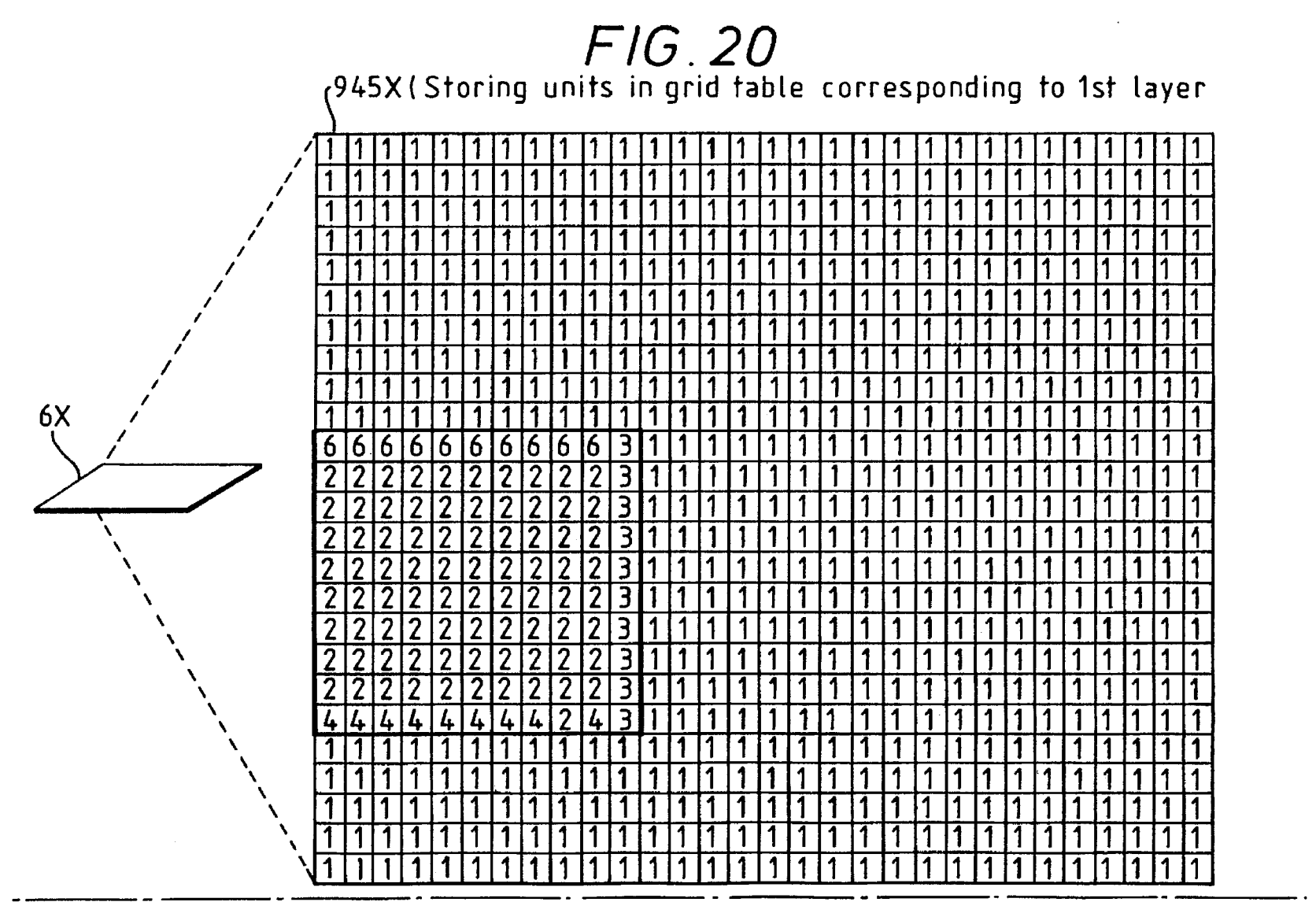

FIG. 20 shows the contents of grid tables, a result of definition of the cost functions. FIG. 20(a) shows the grid table corresponding to the first layer, and FIG. 20(b) shows the grid table corresponding to the second layer;

FIG. 22 is a flow chart illustrating the wiring route storing;

FIG. 22(a) shows the state of the first layer, and FIG. 22(b) shows the state of the second layer;

FIGS. 24(a) and 24(b) shows another example of execution of the wiring route search, and show the contents of the grid table for execution of the wiring route search. FIG. 23(a) shows the contents for the first layer, and FIG. 23(b) is the contents for the second layer;

FIGS. 25(a) and 25(b) is yet another example of execution of the wiring route search, and show the grid table after execution of the wiring route search. FIG. 25(a) corresponds to the first layer, and FIG. 24(b) corresponds to the second layer;

FIG. 25(a) illustrates the first layer, and FIG. 25(b) illustrates the second layer;

FIG. 27(a) defines the wiring directions. FIG. 27(b) shows examples of candidates for the wiring directions.

FIG. 29 is a flow chart for the process of defining inhibited directions for the searching process in relation to the wiring pattern determining process;

FIG. 30(a) shows wiring incapability when the required number of nets in a particular direction is too large, and FIG. 30(b) shows a local concentration of the required number of nets in a particular direction.

DETAILED DESCRIPTION

A) 1. General Principles

Figure 1:
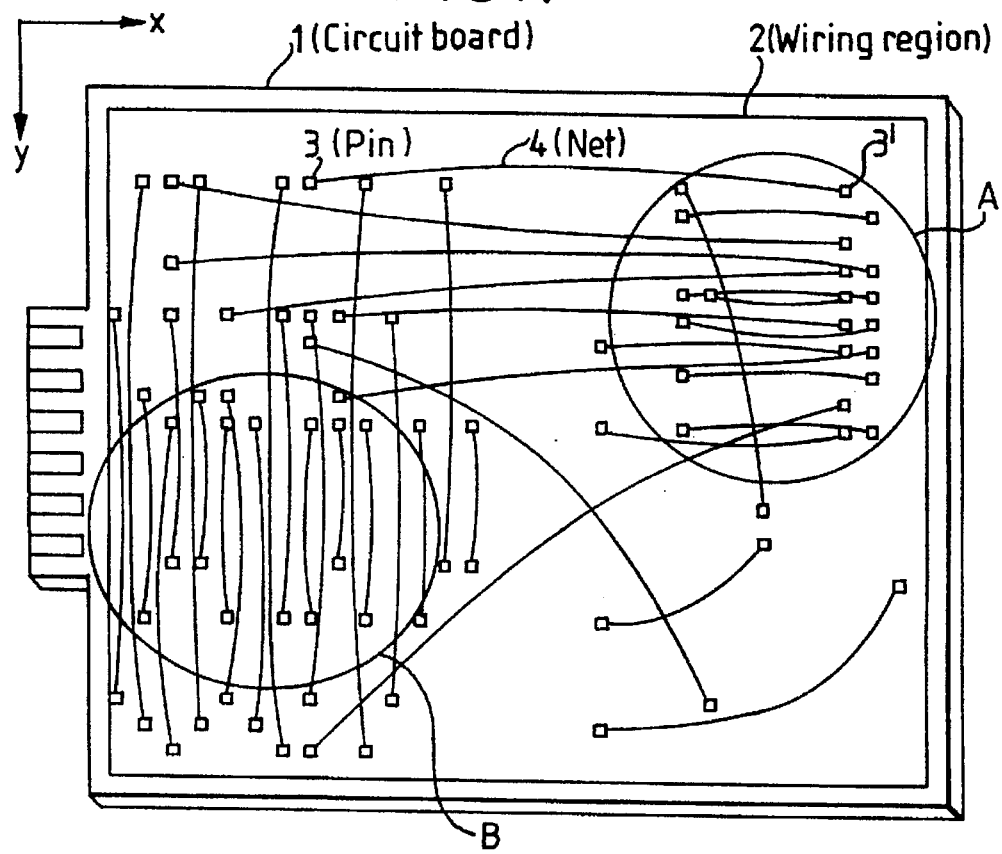
FIG. 1 shows an example of a circuit board, and nets thereon, to which the present invention may be applied.

Before describing specific embodiments of the present invention, the general principles of those embodiments will be described. To decide the wiring routes of a plurality of wiring connections (hereinafter "nets") on a circuit board having a plurality of wiring layers, it is proposed that the wiring area of the circuit board be divided into a plurality of areas. Then the preferred wiring direction for each of the wiring layers, and for each of the areas is determined in dependence on the congestion in each direction in each of the wiring layers, and the wiring route of each of the nets then determined in dependence on that preferred wiring direction for each area and for each layer.

The amount of congestion of the wiring can be determined by first establishing an initial wiring direction for each of the wiring layers. Then virtual routes for each of the nets are determined in dependence on the initial wiring directions. The required (predicted) number of nets in each of area is predicted for each wiring direction on the basis of the virtual routes, and the amount of congestion in each direction in each of the areas is then estimated.

The areas are preferably rectangular, and the initial wiring directions are preferably parallel to two perpendicular sides of the rectangular area. The present invention is not limited to such an arrangement, but includes wiring directions inclined to the sides of the rectangular areas. This may then be extended so that the wiring directions correspond in four symmetrical axes including two axes parallel to two perpendicular sides of the rectangular area.

In determining the wiring direction for each of the area in terms of the amount of congestion in the area, obtained on the basis of a predicted number of nets, a plurality of virtual routes for each of the nets are determined according to the standard wiring directions and a probability for each of the virtual routes. The probabilities of all the virtual routes in areas are summed before predicting the required number of wirings for each of the wiring directions.

In determining the amount of congestion, candidates for the wiring directions for the plurality of wiring layers are listed for each of the areas before obtaining the amount of congestion in each wiring direction in the area in terms of the required number of wirings predicted above. Hence, a combination having the smallest amount of congestion obtained above can be selected, before determining the final wiring direction for each of the wiring layers for each of the areas. In this method, the probability of a virtual route is determined on the basis of a number of enumerative virtual routes of shortest distance.

Thus, if a virtual route is straight, the probability is set to be 1. If the virtual route is bent and the allowable number of bends is n (wherein n is an integer), a group of virtual routes enumerated for each of n bends have a group probability allocated thereto. Thus, the probability of each virtual route is the group probability divided by a number of virtual routes corresponding to the number of the bends of the group. For example, if a virtual route is straight, the probability is set to 1. If an allowable number of bends is not more than 2, a probability of 0.5 is given to each group of virtual routes until one bend, and probability of 0.5 to each group of virtual routes with two bends. The probability of each virtual route in the respective groups is given by a value of the group probability of 0.5 divided by a number of the virtual routes in the group.

In determining the wiring directions on the basis of the probabilities of the virtual routes, it is preferable that a standard deviation representing the dispersion of the required number of wirings for each wiring direction for each of the area is obtained, and the process of changing the probability of the virtual route is iterated so that the standard deviation is minimized.

A method according to the present invention may determine the wiring patterns by preparing a grid table which has grid of the wiring area sectioned into wiring unit areas for each of the wiring layers. Then, the wiring direction of each wiring layer is set in initial directions for each of the areas for each of the grid points in the grid table. Then, pins and use flags are set indicating that a pattern occupies the grid point. A plurality of wiring routes are thus determined from a grid point of the pin belonging to the net to another pin belonging to the net through successively adjacent grid points including grid points of related wiring layers according to the wiring directions set at the grid points. One of the shortest wiring route is selected from among the plurality of wiring routes obtained to be the wiring route for the net. A use flag is then put at the grid point in the grid table corresponding to the wiring route selected. In this method, it is preferable that if adjacent grid points belonging to another wiring layer are concerned in determining whether the wiring route is the shortest or not, the wiring route to any of the adjacent grid points is evaluated to be longer than those to any of adjacent grid points on the same wiring layer.

Figure 2:
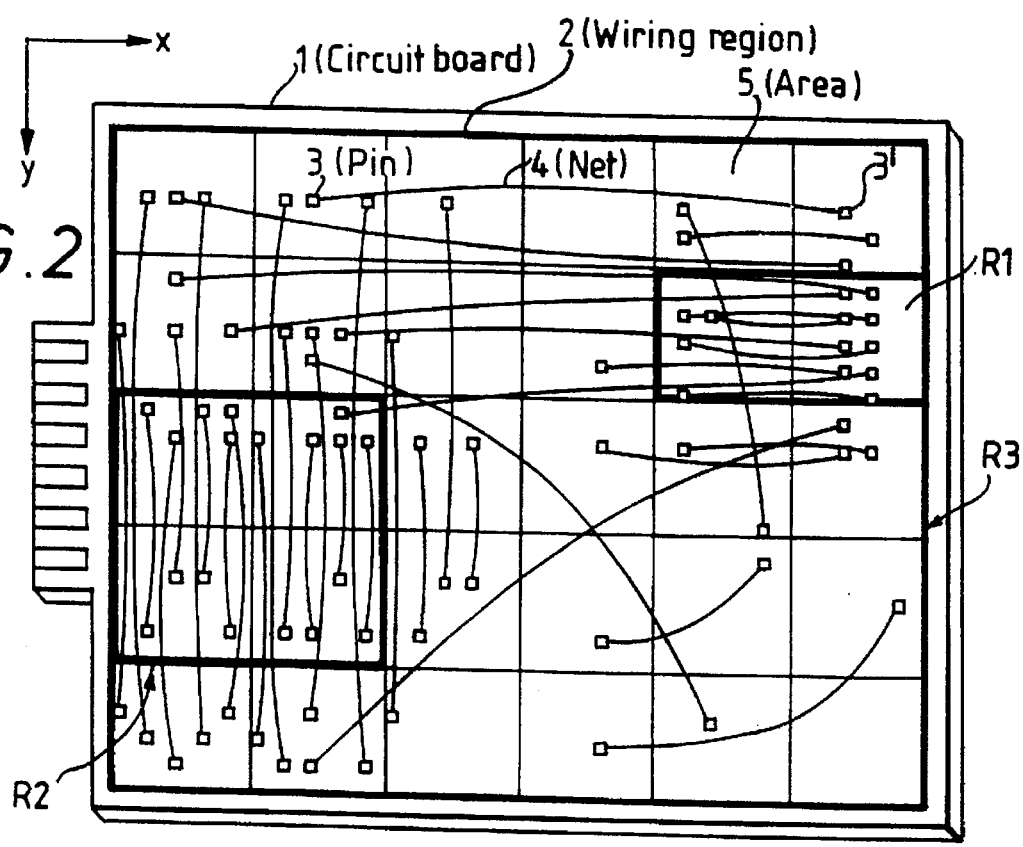
FIG. 2 is an example of nets for which local congestions can be reduced by a method according to the present invention.

The above principles will now be discussed in more detail below with reference to FIGS. 2 to 7. First, it is necessary to identify in what areas and directions congestions occur in advance of wiring pattern determination. A wiring area, as shown in FIG. 2, is divided longitudinally and transversely along two perpendicular sides. The directions of the two perpendicular sides will be referred to as the x and y directions. Each of the areas 5 is analyzed to obtain a predicted (required) number of nets in it in the x and y directions. Then it is necessary to determine whether the xy rule should be disregarded or not in the area, depending on the required number of nets.

In FIG. 2, since region R1 is congested in the x direction, two areas belonging to the region R1 should have wiring in the x direction. Since region R2 is congested in the y direction, four divided areas belonging to the region R2 should have wiring in the y direction. After the wiring directions for the wiring layers have been decided for each area, the wiring pattern of each net is determined according to the wiring directions. In other words, the wiring pattern is chosen so as to prevent the occurrence of wiring patterns in directions different from the wiring directions determined.

Figure 3:
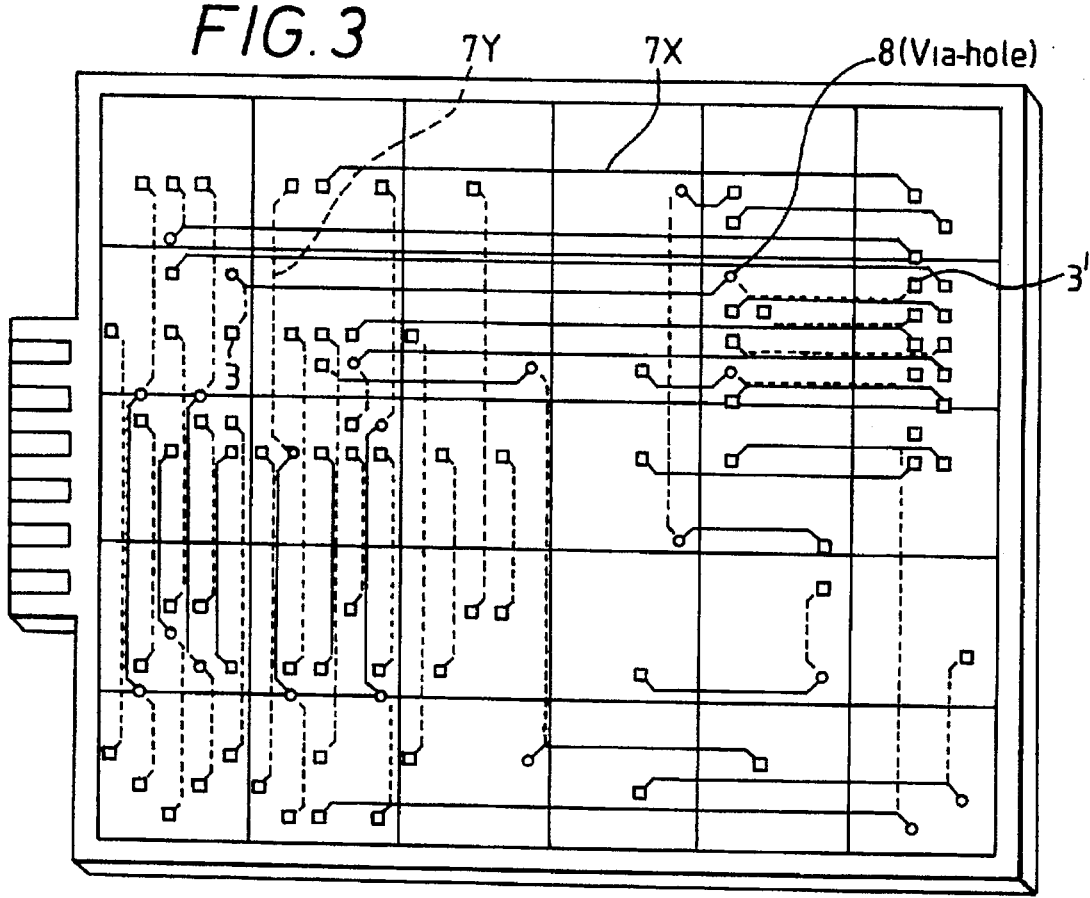
FIG. 3 is an example of the wiring patterns determined in dependence on the wiring directions determined by the method of the present invention.
Figure 4:
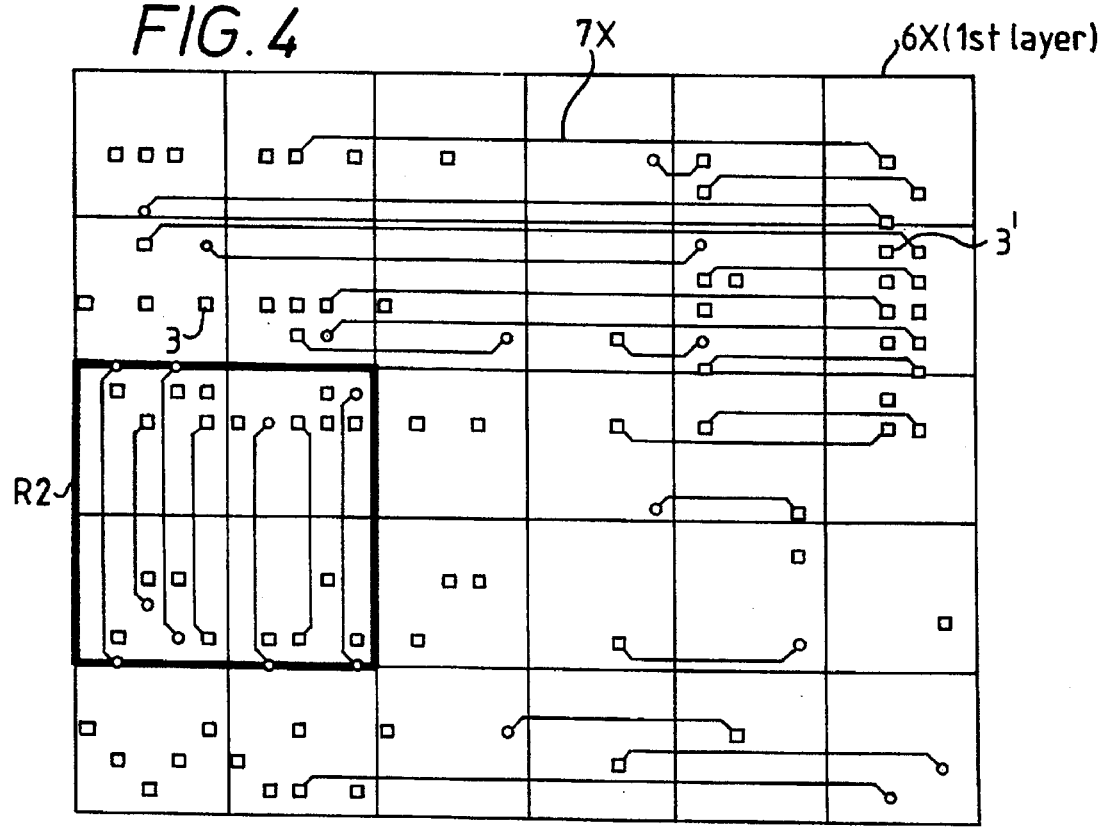
FIG. 4 is the wiring pattern of the first layer in the example of FIG. 3.
Figure 5:
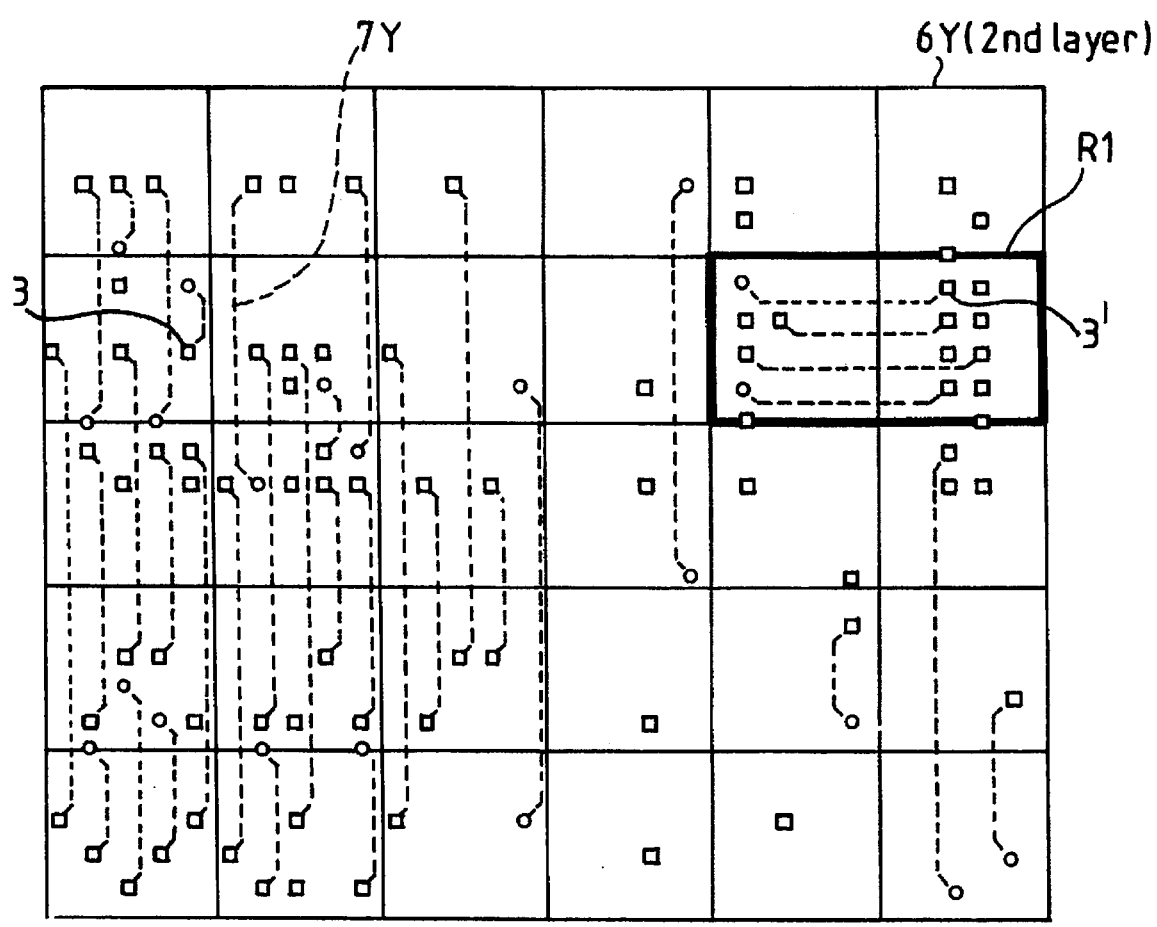
FIG. 5 is the wiring pattern of the second layer in the example of FIG. 3.

FIGS. 3 to 5 show wiring patterns thus obtained. FIG. 3 shows a net 7X on the first wiring layer (hereinafter referred to as the first layer) which is indicated by a solid line and a net 7Y on the second wiring layer (hereinafter referred to as the second layer) which is indicated by a broken line. A via hole 8 is provided to connect the net 7X on the first layer and the net 7Y on the second layer. FIGS. 4 and 5 shows respective individual nets on the first and second layers. As can be seen from FIG. 4, the area R2 is congested in the y direction, and so has wiring patterns in the y direction, with the xy rule being disregarded for the area R2. Similarly, as can be seen in FIG. 5, the area R1 is congested in the x direction and so has wiring patterns in the x direction, again disregarding the xy rule.

The criteria for determining the wiring directions for the wiring layers for each of the areas 5 will now be described with reference to FIGS. 6 and 7. The criteria determine whether the xy rule should be disregarded or not. Assume that one of the areas 5 is congested in the x direction. The xy rule can be disregarded, thereby increasing the wiring capacity in the x direction. This allows some unrouted wirings to pass through the congested area. This is referred to as an "effect" due to disregarding of the xy rule. Disregarding the xy rule, however, may prevent other wiring patterns from pass through the area in the y direction. This is referred to as a "side effect" due to disregarding of the xy rule. Normally the xy rule should in principle, be disregarded only if the "effect" is greater than the "side effect."

Figure 6A:
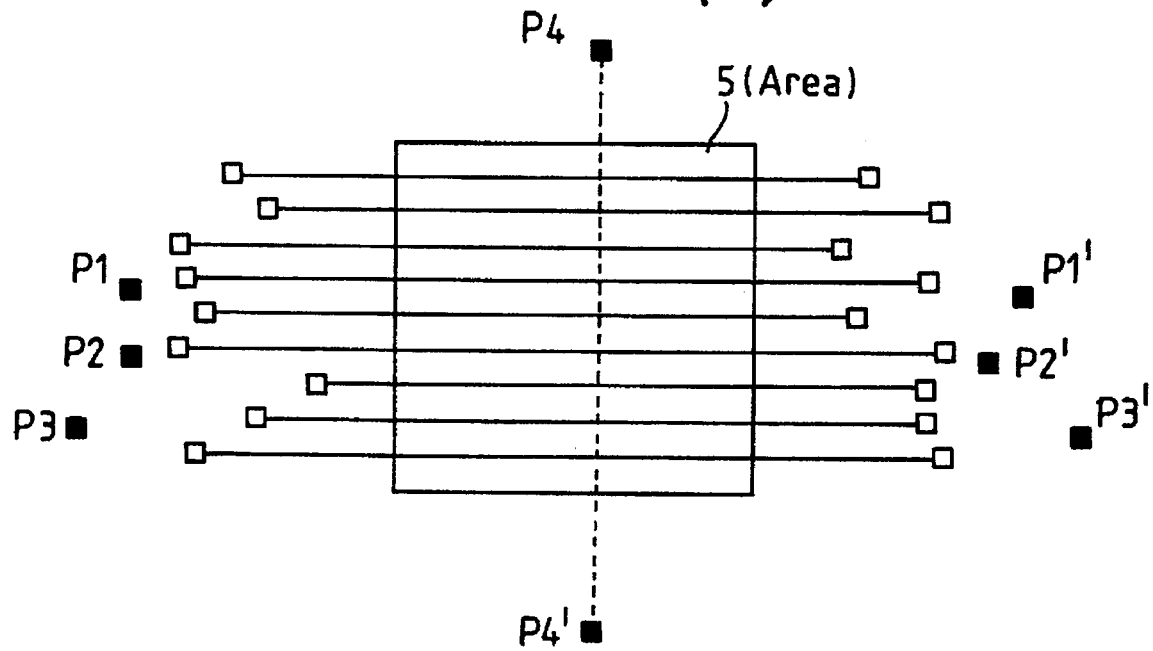
FIGS. 6(a) and 6(b) illustrate an example of criteria for determining the wiring directions.
Figure 6B:
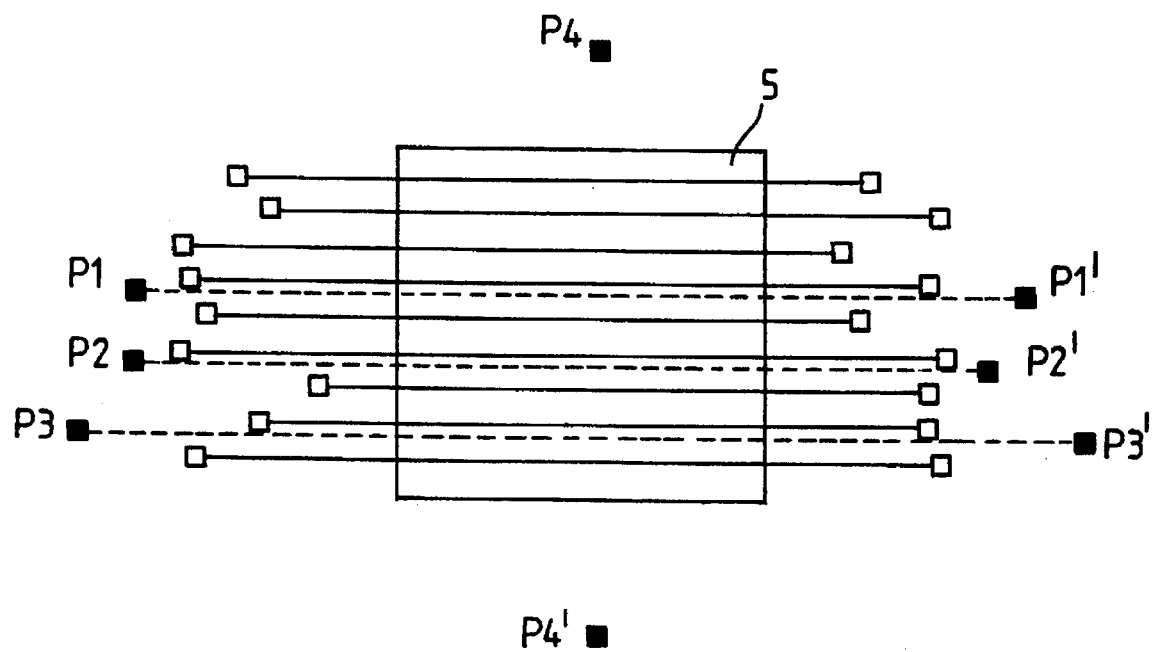

FIG. 6(a) shows the results of this operation when the xy rule is used for wiring in any of the area 5. FIG. 6(b) shows the results of this operation when the xy rule is disregarded for wiring on both wiring layers in the x direction. The area 5, shown in FIG. 6(a), has a very large required number of nets in the x direction. If the wiring directions are determined according to the xy rule, there are nets that cannot pass through the area 5, which have respective net ends points P1–P1', P2–P2', and P3–P3'. If the xy rule is disregarded for both wiring layers in the x direction, as shown in FIG. 6(b), this provides the "effect" that the three nets P1–P1', P2–P2', and P3–P3' can pass through the area in the x direction. However there is then a "side effect" that one net P4–P4' becomes unable to pass through the areas in the y direction. In this example, since the "effect", is greater than the "side effect" a decreased capacity of one net, the area 5 should have the wiring direction of both wiring layers in the x direction.

Figure 7A:
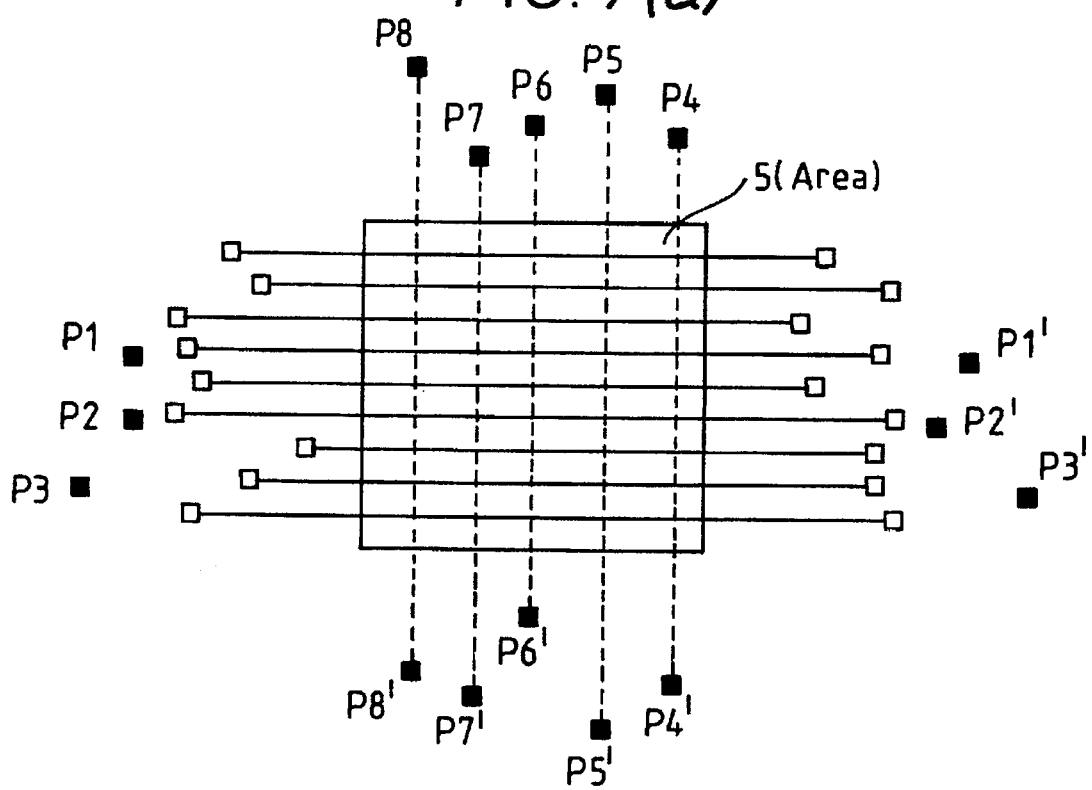
FIGS. 7(a) and 7(b) illustrate another example of a criteria for determining the wiring directions that the side effect is greater than the effect.
Figure 7B:
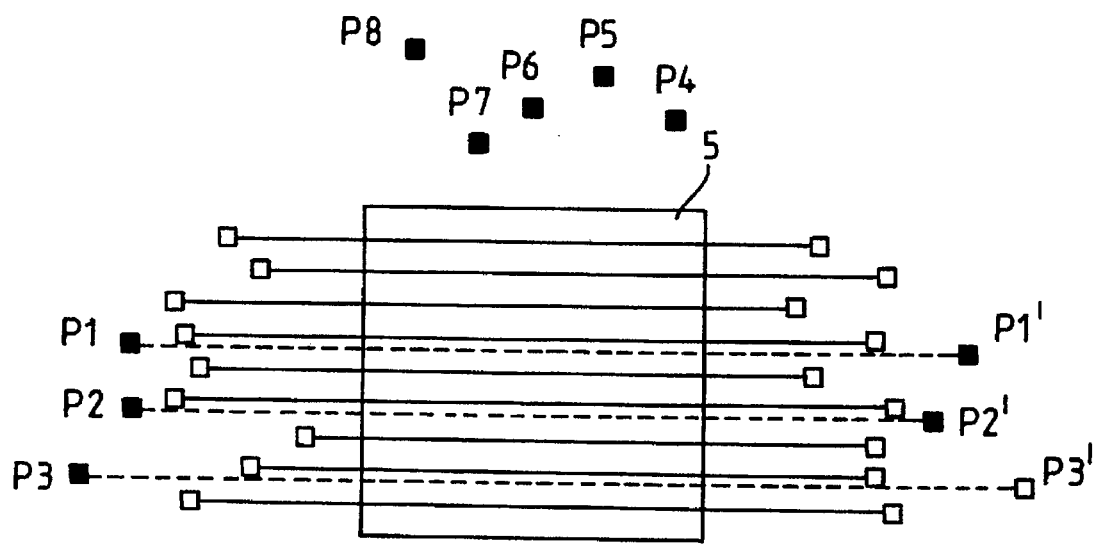

FIG. 7 shows an example in which the "side effect" is greater than the "effect". The area 5, as shown in FIG. 7(a), has a very large required number of nets required in the x direction. If the wiring directions are determined according to the xy rule, there are nets that cannot pass through the area 5, which have respective end points P1–P', P2–P2', and P3–P3'. If the xy rule is disregarded for both wiring layers in the x direction, as shown in FIG. 7(b), this provides the "effect" that the three nets P1–P', P2–P2', and P3–P3' can pass through the area in the x direction. It however provides the "side effect" that five nets P4–P4', P5–P5', P6–P6', P7–P7', and P8–P8' cannot pass through the area in the y direction. In the example, since the "side effect", a decreased capacity of five nets, is greater than the "effect", a increased capacity of three nets, the area 5 should be wired according to the xy rule.

The examples described above were for a circuit board having two wiring layers. Another example will be described in which the method of the present invention is applied to a circuit board having more than two wiring layers.

First, the wiring area is divided longitudinally and laterally, and the required numbers of nets in the x and y directions are determined as was the case with the circuit board having two wiring layers. The wiring direction is determined for each area in terms of the required number of nets, and the wiring patterns are then determined according to the wiring directions. In deciding the wiring directions, a plurality of possible wiring direction candidates should be considered, and the optimum candidate should be selected. For a four-layer circuit board, for example, five candidates can be considered as follows:

(1) xxxx (all layers in x direction), (2) xxxy (1st, 2nd, and 3rd layers in x direction and 4th layer in y direction), (3) xyxy, (4) xyyy, and (5) yyyy.

The optimum candidate should then be selected by checking the increase of the x direction pass through number ("effect") and decrease of the y direction pass through number ("side effect") for each candidate. The optimum candidate to be selected is the one having the largest difference. In other words, the candidate to be selected is the one having the maximum value of difference A' as given below.

A'=(x direction pass through number of candidate−x direction pass through number according to the xy rule)−(y direction pass through number according to the xy rule−y direction pass through number for candidate)

Rearranging this gives:

A=(x direction pass through number of candidate+y direction pass through number for candidate)−(x direction pass through number according to the xy rule+y direction pass through number according to the xy rule).

Since the value of the term (x direction pass through number according to the xy rule+y direction pass through number according to xy rule) is constant irrespective of the candidates, selecting the candidate with a maximum value of difference A is equivalent to selecting the candidate having the maximum value of sum A' below.

A'=(x direction pass through number for candidate+y direction pass through number for candidate).

Suppose the number of nets not allowed to pass through the area be called the "excess number". Since X direction excess number=x direction required number−x direction pass through number, and Y direction excess number=y direction required number−y direction pass through number, then A'=(x direction required number+y direction required number)−(x direction excess number+y direction excess number).

Since the value of the term (x direction required number+y direction required number) is constant irrespective of the candidate, selecting the candidate having the maximum value of difference A is equivalent to selecting the candidate having the minimum value of sum A" below.

A"=x direction excess number+y direction excess number.

As described above, even if a net may be impossible to connect according to the xy rule because of a very large required number of local nets in a certain direction, the method of the present invention can accomplish high wiring efficiency as it determines the wiring direction of each area including the local wirings in accordance with the direction having a large required number of wirings.

The method of the present invention can automatically determine the wiring patterns in short wiring lengths. This is achieved by determining the wiring direction for each area according to any of the methods described above, with the wiring direction then being set for each grid points in a grid table for each wiring layer. With such a table, a plurality of wiring routes are obtained from a grid point of a pin at one end each net to the pin at the other end of the net. A plurality of wiring routes is obtained and one is selected corresponding to shortest wiring route, to give the wiring route for the net.

The method according to the present invention permits the wiring pattern to be determined in a reasonable calculation time by a computer, the optimum wiring direction decision in advance of the wiring route search process provides sufficient wiring results even if the wiring route search process will not iterate the improving process.

Furthermore, the method according to the present invention can achieve a circuit board having wiring patterns at a high wiring density.

2. The First Embodiment

Referring now to FIGS. 8 to 27, a first embodiment of a method according to the present invention will be described in detail.

Figure 8:
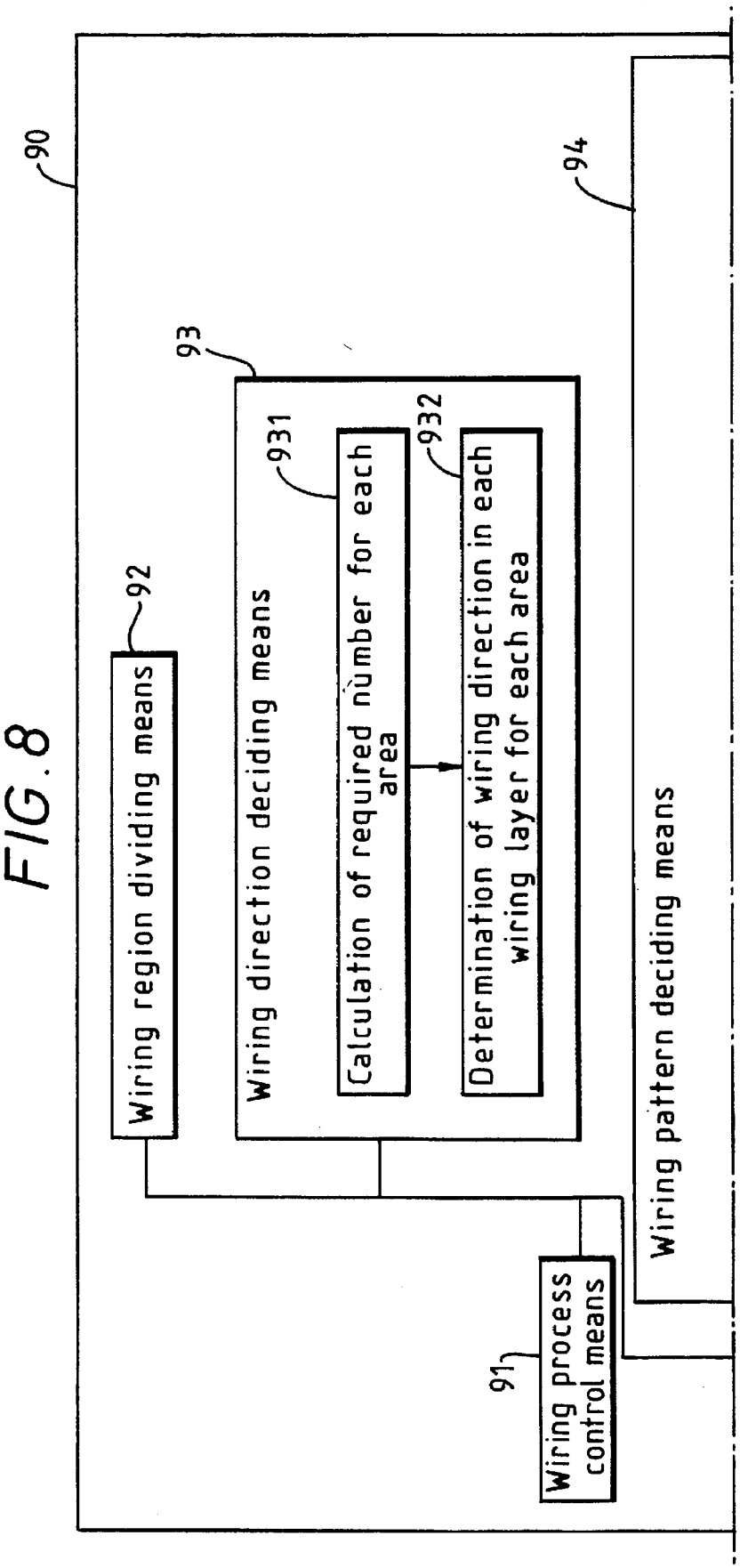
FIG. 8 illustrates the overall construction of a system for carrying out a method according to a first embodiment of the present invention.

(1) The overall construction of the wiring pattern deciding system is shown in FIG. 8. The system is an automatic wiring pattern deciding system for a circuit board of two or more wiring layers. Suppose the wiring layers have wiring patterns in directions (hereinafter referred to as the x and y directions) parallel to perpendicular sides of the circuit board. Also, suppose that the wiring layer has a wiring grid defined in its wiring area and has the wiring patterns drawn on the wiring grid.

First, the overall construction of the wiring pattern deciding system will be described with reference to FIG. 8. The wiring pattern deciding system of the first embodiment is carried out by a program in a computer 90. The computer 90 reads data needed to determine the wiring pattern from a design master file 96, and returns the results to the design master file 96. To permit this, the design master file 96 has wiring pattern data defining the wiring patterns prepared by designers, inhibit data defining inhibited areas in which any wiring pattern is prevented from being drawn on the circuit board, net data defining nets to be used in the wiring pattern determination, and circuit board data defining specifications of the wiring region of the circuit board and the number of wiring layers on the circuit board. The computer 90 has to read the data necessary to execute the wiring pattern determination on the basis of the program. The program comprises a wiring process control means 91, a wiring region dividing means 92, a wiring direction deciding means 93, and a wiring pattern deciding means 94. It should be noted that the term 'means' corresponds to a computer function which may be carried out by one or more specific components.

The wiring process control means 91 activates the wiring region dividing means 92, the wiring direction deciding means 93, and wiring pattern deciding means 94 for controlling the overall wiring process.

The wiring region dividing means 92 divides the whole wiring region of the circuit board in the x and y directions before defining a plurality of areas.

The wiring direction deciding means 93 determines the wiring direction for each of the wiring layers of each of the areas. This process of the wiring direction detecting means may be decomposed into two steps, namely steps 931 and 932.

Step 931: Calculate the number of nets (required in the x direction) predicted to pass through each of the areas in the x direction and the number of nets (required in the y direction) predicted to pass through each of the areas in the y direction, assuming that the nets are wired with the shortest length possible.

Step 932: Determine the wiring direction of each of the wiring layers for each of the areas in terms of the required numbers of nets calculated in step 931.

The wiring pattern deciding means 94 determines the wiring pattern in the maze routing method for each of the nets on the basis of the wiring directions determined by the wiring direction deciding means 93. The process carried out by the wiring pattern deciding means 94 may be decomposed into four steps, namely steps 941 to 944 for execution of the operations defined below, and also includes, a grid table 945, and a cost function table 946.

Step 941: Set up wired pattern data and the inhibit data in the grid table 945, which table represents all grid points in the wiring region of the circuit board. In other words, this step sets a "use" flag at all the grid points occupied by wired patterns and at all the grid points within the inhibit area. Any of the grid points for which there is a "use" flag is inhibited from use for a new wiring pattern.

Step 942: Define a "cost function" for use in wiring route search by the maze routing method for each of the grid points. The cost function is defined as an index for sequentially looking up successive grid points from a start grid point to an end grid point to estimate the length and adequacy of the wiring route, or is defined by a function in a search direction, which is a cost imposed on the search from any of grid points to its adjacent grid point. In other words, first, the cost function is an index corresponding to the length of a wiring route.

Next, in order to avoid wiring in an inhibited direction for each of the areas, a higher cost is defined for a search in such directions. The value of the cost is defined for each search to successive grid points in one direction (e.g. in the positive x direction) and those to successive grid points in the opposite direction (in the negative x direction). The cost function is defined to provide a higher cost for searching in a direction that crosses over the defined wiring direction. For this reason, it is necessary to provide a lower cost for searching within the area in the x direction and a higher cost for searching in the y direction.

The cost function table 946 stores the values of the cost function, and the grid table 945 stores identifier of the cost function at its grid points. This can reduce the amount of memory needed.

Step 943: Execute the wiring route search for each of the nets in the maze routing method, on the basis of the cost function. Since the cost function is defined for each of the grid points, as described above, this step repeatedly increases the value of the cost function whenever the search pass through any of the grid points.

Step 944: Store the wiring route found in the wiring route search step 943 into the design master file 96. For the wiring route searches of successive nets, also, the step puts the "use" flag at the grid points occupied by the stored wiring pattern pass through.

The processes carried out by the wiring process control means 91, the wiring region dividing means 92, the wiring direction deciding means 93, and the wiring pattern deciding means 94 will now be described in detail.

FIG. 9 shows a flow chart illustrating the process carried out by the wiring process control means 91. The process is corresponding to steps 101 to 107 below.

Step 101: Activate the wiring region dividing means 92 for dividing the wiring region into areas.

Step 102: Activate the wiring direction deciding means 93 to determine the wiring direction on each of the wiring layers for each of the areas.

Step 103: Set to an initial value of 1 a number i corresponding to the number of layer groups of wiring layers. The layer group refers to a set of a plurality adjacent wiring layers for which wiring directions are determined. A layer group may include three or more adjacent wiring layers.

Step 104: Activate the wiring pattern deciding means 94 for testing the proposed wiring pattern for all unwired nets on an i'th layer group.

Step 105: Terminate the wiring process if all the nets have been connected.

Step 106: Increase the number i by one (1).

Step 107: Return to step 104 if the number i does not exceed the number of pairs. Otherwise, the step terminates the wiring process.

The wiring region dividing means 92 divides the wiring region in the x and y directions. Although a division width may be chosen as desired, the number of divisions, should preferably be equal in both directions. As a result, all the areas are rectangular and of approximately equal size.

As described above, the wiring direction deciding means 93 comprises steps 931 and 932. Step 931 calculates the number of the wiring patterns required in the x and y directions for each of the areas. Step 932 decides the wiring direction for each of the wiring layers for each of the areas. The processes carried out in steps 931 and 932 will now be described in detail with reference to FIGS. 10 to 16.

Consider first process 931 for calculation of nets required for each area.

The calculation of numbers of nets in the x and y directions in the first embodiment is achieved by defining virtual wiring routes for each net, and numbers of the pass through virtual routes are calculated for each area. It is difficult to predict exactly the routes before searching for the optimum wiring routes, and so a plurality of virtual routes are prepared on the assumption that the routes would have the shortest lengths, and each of the virtual routes should have a probability corresponding to its likeliness of realization. The sum of the probabilities of a plurality of virtual routes is one (1). The number required for an area can be calculated by summing the probabilities of the virtual routes.

FIGS. 10(a) and 10(b) show examples of virtual routes with the probabilities described above. FIG. 10(a) is the virtual route of a net parallel to the x or y direction. The shortest virtual route of the net is a straight line from a start pin to an end pin. Since the net has only one route, the probability is 1. FIGS. 10(b) and 10(c) are examples of nets which are not wholly parallel to one of the x and y directions. FIGS. 10(b) and 10(c) show all the virtual routes having not more than two bends, and assigns a probability of 0.5 to one bend virtual routes in FIG. 10(b) and 0.5 to two bends virtual routes in FIG. 10(c). FIG. 10(b) thus shows two virtual routes having one bend, each of which is given a probability of 0.25. In FIG. 10(c), the number of virtual routes having two bends depends on the number of wiring grids among pins. In the example are shown 10 virtual routes. The remaining probability of 0.5 is equally shared by these 10 virtual routes.

Figure 11A:
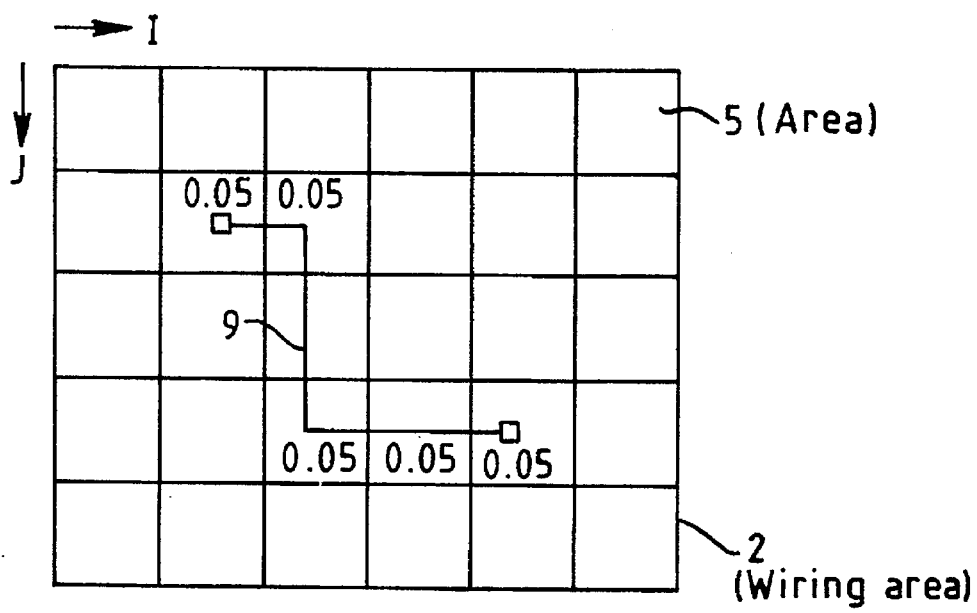
FIGS. 11(a) and 11(b) show an example of the calculation of the required number of nets on the basis of the probabilities of FIGS. 10(a) to 10(c).
Figure 11B:
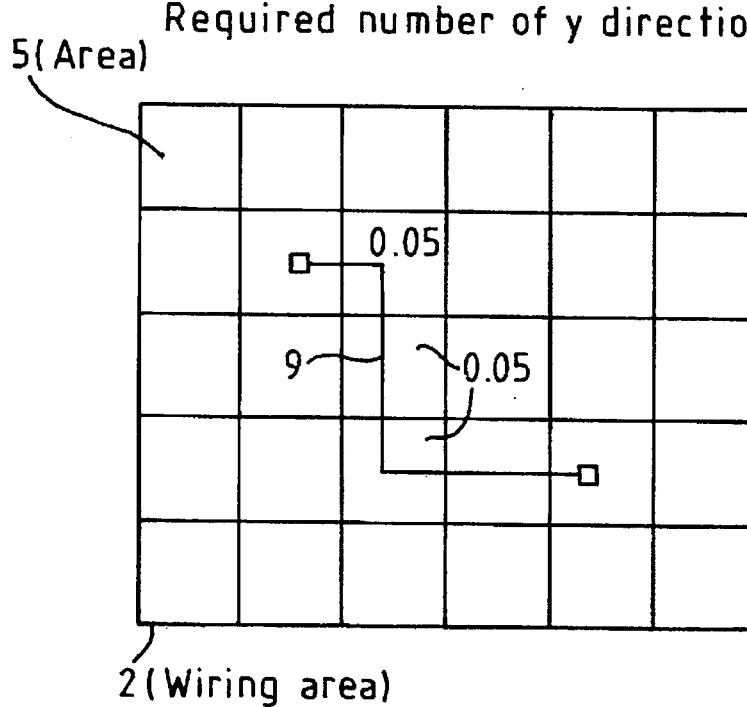

FIGS. 11(a) and 11(b) show an example of the calculation of the required number on the basis of the probabilities described above. They illustrate how one of the virtual routes having two bends is analyzed to calculate the required number of wirings for each divided area. Since the probability of the virtual route is 0.5 as mentioned above, the virtual route adds 0.5 thereto to the required number of nets in the x direction for an area through which the virtual route pass through in the x direction, and similarly adds 0.5 to the required number of nets in the y direction for an area through which the virtual route pass through in the y direction. It should be noted that the passing of a virtual route through any area in the x direction is defined to correspond to the situation where at least part of a segment of the virtual route in the x direction lies within the area or on a border thereof. Similarly, the passing of a virtual route through any area in the y direction is defined to correspond to the situation where at least part of a segment of the virtual route in the y direction lies within the area or on a border thereof.

Suppose that Nx (I, J) is the required number of nets in the x direction in an area (I, J) with I and J being integers, and Ny (I, J) is the required number of nets in the y direction. The required number of nets is given by Equation 1 below.

Equation 1

$$Nx(i, J) = \sum_k \left( \sum_r pr \times \alpha r(I, J) \right)$$

$$Ny(I, J) = \sum_k \left( \sum_r pr \times \beta r(I, J) \right)$$

wherein: k is the net, r is the virtual route of the net k, pr is the probability of the virtual route r, αr (I, J) is 1 if the virtual route r pass through the area (I, J) in the x direction and is 0 if not, and βr (I, J) is 1 if the virtual route r pass through the area (I, J) in the y direction and is 0 if not.

The detailed processing carried out by the area required number calculation 931 will now be described, referring to the flow chart shown in FIG. 12. Note that the process calculates the required numbers of nets before iterating a leveling process for leveling the wiring congestion (i.e. reducing the spread of wiring congestion of the areas). The leveling of the wiring congestion reduces the probabilities of virtual routes passing through areas with high required numbers of nets, but to increase the probabilities of virtual routes not passing through those congested areas. This is because the actual wiring pattern decision process, selects such routes to avoid areas of high wiring congestion, thereby naturally leveling the wiring congestion. Iterating the leveling process for leveling the wiring congestion can gradually decrease the spread of the wiring congestion among the areas of the region. The leveling process is iterated until the spread cannot be changed.

Step 121: Obtain the virtual routes expected for each net.

Step 122: Calculate the required numbers of nets in the x and y directions for each area.

Step 123: Calculate the dispersion σx(0) of the required number of nets in the x direction among the areas and the dispersion σy(0) of the required number of nets in the y direction among the areas. Note that these dispersions correspond to standard deviations of the values.

Step 124: Set to 1 a value j which indicates the number of iterations of the leveling process.

Step 125: Execute the j'th leveling process.

Step 126: End the iteration of the leveling process if the change in the spread due to the j'th iteration is smaller than a predetermined value, otherwise go to step 127.

Step 127: Increase the value j by 1.

Step 128: Return to step 125 if the value j does not exceed a predetermined upper limit, otherwise end the iteration of the leveling process.

Step 125: Follow the following substeps 1251 to 1254.

Step 1251: Choose one net.

Step 1252: Vary the probability of the virtual routes of the net as follows. First, determine sum Sr of the required numbers of nets in areas passed through by the virtual route r. Hence, if a virtual route r passes through an area in the x direction, is the required number of nets in the x direction is increased. If the virtual route r passes through the area in the y direction, on the other hand, the required number of nets in the y direction is increased. In turn, the value of θr/St for each virtual route is obtained, where θr is a weighing factor. The factor θr is set to be 1 if the route r has two bends, and is set to a value larger than 1 if it has one bend. Finally, the probability is proportionally shared among the virtual routes with respect to the value of θr/St. With this process, a virtual route having a greater value of the sum Sr of the required number of nets, or a virtual route passing through a more congested area, is defined to have a lower probability than other virtual routes having the same values of θr.

Step 1253: Re-calculate the required number of nets in each area using Equation 1 on the basis of the probabilities of the virtual routes.

Step 1254: Return to step 1251 if there is a net for which the probabilities of its virtual routes have not been varied in the leveling process, otherwise terminate the leveling process.

Step 126: Evaluate the variation of the probabilities of the virtual routes.

Step 1261: Calculate the dispersion σx(j) of the required number of nets in the x direction of the areas and the dispersion σy(j) of the required number of nets in the y direction of the areas.

Step 1262: End the leveling process if the difference between σx(j) and σx(j−1), and that between σy(j) and σy(j−1) are both smaller than a predetermined value δ, otherwise go to step 127.

Consider now the process 932 for determining wiring direction on each wiring layer for each area. The wiring direction decision process 932 will now be described in detail, referring to FIGS. 13 to 16. First, the wiring direction can be decided by listing possible candidates and then selecting the optimum one. The procedures are described in order below.

FIG. 13 illustrates candidates of combinations of the wiring directions on the wiring layers. Since the first embodiment handles only x and y directions, any of the wiring layers in an area takes either the x direction or the y direction. The first embodiment employs the idea that the xy rule should be used unless any wiring complication occurs in a specific direction. This is why the process first defines the wiring directions following the xy rule, and then alters them according to wiring congestions. The wiring directions specified by the xy rule are referred to as the "standard directions". Candidate wiring directions are listed on the basis of their wiring directions.

Figure 13A:
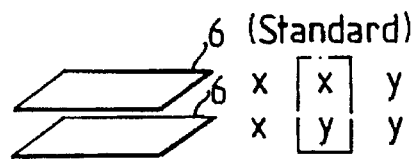
FIGS. 13(a) to 13(f) show an example of candidates of combinations of wiring directions, including standard wiring directions, on the wiring layers.
Figure 13B:
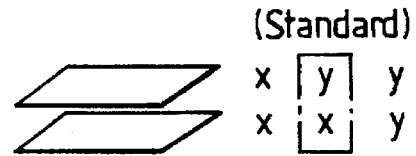
Figure 13C:
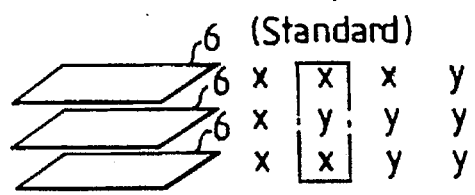
Figure 13D:
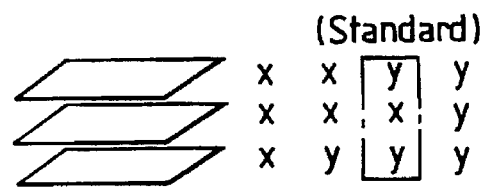
Figure 13E:
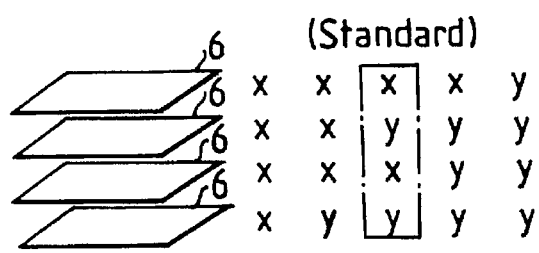
Figure 13F:
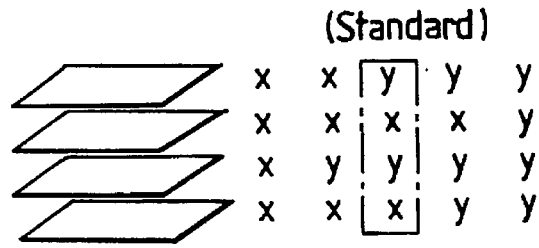

FIGS. 13(a) and 13(b) show candidate wiring directions in a two-layer circuit board. FIG. 13(a) shows three candidates xx, xy, and yy, the standard wiring direction corresponding to the first layer having an x direction wiring direction and the second layer having a y direction wiring direction. FIG. 13(b) shows three candidates xx, yx, and yy, with the standard wiring direction corresponding to the first layer having a y direction wiring direction, and the second layer having a y direction wiring direction. FIGS. 13(c) and 13(d) show candidate wiring directions in a three-layer circuit board. In FIG. 13(c), a candidate xyx represents three types of direction combinations, xxy, xyx, and yxx each of which has two x direction wiring layers and one wiring layer. In FIG. 13(d), the candidate wiring layer has a combination of one x direction and two y direction wiring layers. FIGS. 13(e) and 13(f) show further candidates for wiring directions in a four-layer circuit board.

A method for selecting the optimum wiring directions from among the listed candidates will now be described with reference to FIGS. 14(a) and 14(b). FIGS. 13(a) and 13(b) are examples of a method in which optimum candidates are selected from among five candidates xxxx, xxxy, xyxy, xyyy, and yyyy. The wiring pattern deciding system in this embodiment uses a candidate which has the minimum value of the sum of the excess number of nets in the x direction and the excess number of nets in the y direction. The excess numbers are calculated using the following relationships.

Excess number in x direction=0,
if (required number in x direction)≦(wiring capacity (passing number) in x direction);

Excess number in x direction=(required number in x direction)−(wiring capacity (passing number) in x direction), if (required number in x direction)>(wiring capacity (passing number) in x direction);

Excess number in y direction=0, if (required number in y direction)≦(wiring capacity (passing number) in y direction);

Excess number in y direction=(required number in y direction)−(wiring capacity (passing number) in y direction), if (required number in y direction) (wiring capacity (passing number) in y direction).

If the standard wiring directions (xyxy in this example) allow both the x- and y- excess numbers of nets to be 0, the standard wiring directions are selected.

The wiring capacity is calculated for each of the candidate wiring directions. If the number capable of passing through an area in the x direction and the number in the y direction are all five per layer, for example, the second candidate in FIG. 14(a) includes three layers with wiring directions in the x direction and one layer with wiring direction in the y direction. Thus, the wiring capacity in the x direction is 5 multiplied by 3, i.e. 15, and the wiring capacity in the y direction is 5 multiplied by 1, by i.e. 5. Note that if a wired pattern or inhibited area exists in the area, the wiring capacity calculated above should be reduced to the value which will prevent the nets from passing therethrough.

Figure 14A:

In the example of FIG. 14(a) the candidate xxxy is selected to get the wiring directions in the area as its excess number of nets is minimum. These wiring directions xxxy have an advantage over the standard wiring directions xyxy as described below. The excess number of wirings in the x direction is increased from 10 to 15. The "effect" by disregarding the xy rule is an increase of 5. The excess number of wirings in the y direction, on the other hand, is decreased from 7 to 5. The "side effect" of disregarding the xy rule is of 2. This means an improvement by the difference of 3. In the example of FIG. 14(b), the standard wiring directions xyxy are selected as the wiring directions as they give the minimum excess number of wirings. Note that an excess of 2 occurs in the x direction. In spite of this, the candidates xxxy and xxxx having larger wiring capacities in the x direction are not selected. The reason is that deviation out of the xy rule causes too much "side effect". Thus, if the candidate xxxy is used, the pass through number in the x direction is increased from 10 to 12, but the pass through number in the y direction is decreased from 9 to 5. If the candidate xxxxy is used, the pass through number in the x direction is increased from 10 to 12, but the pass through number in the y direction is decreased from 9 to 0.

Figure 15:
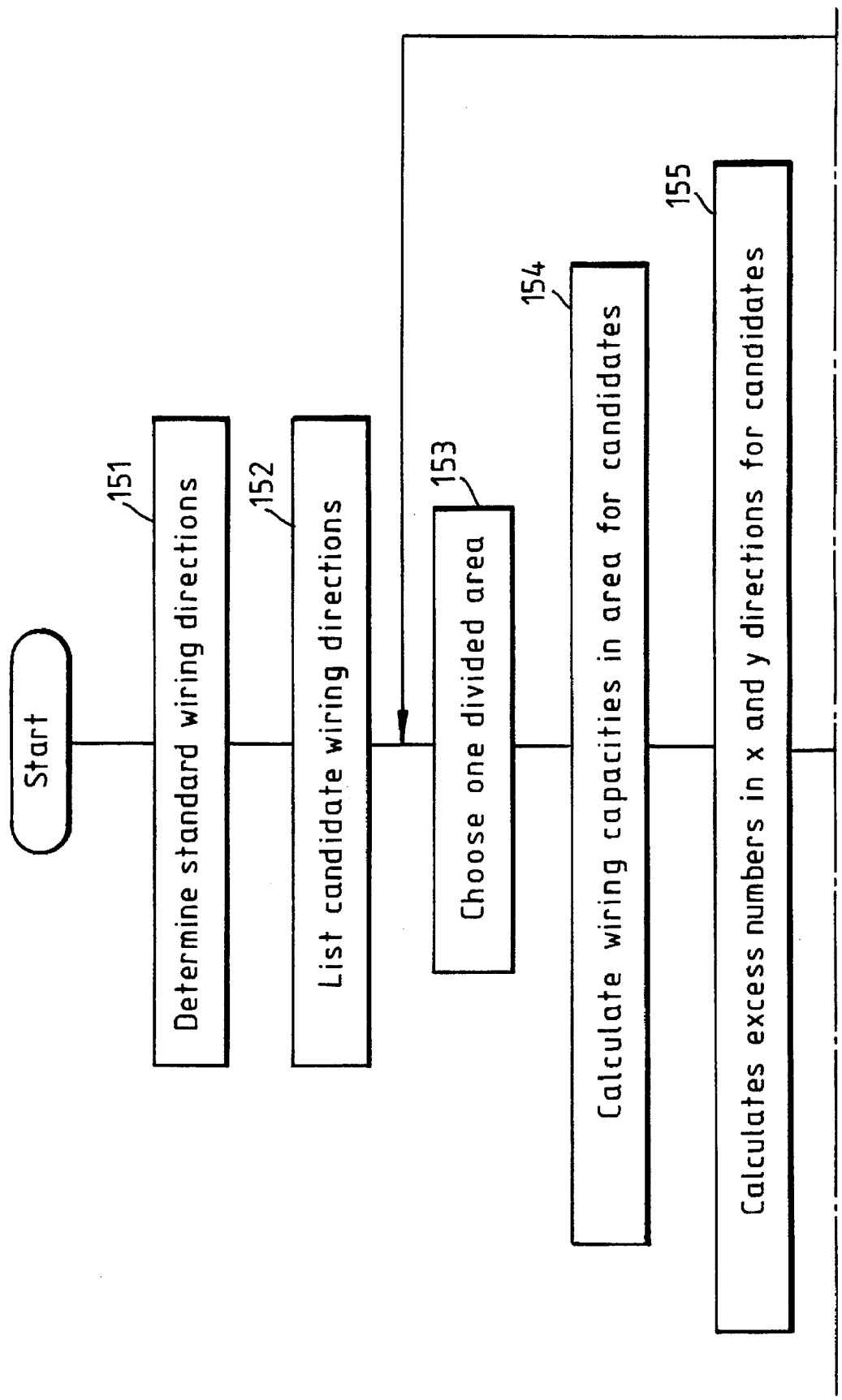
FIG. 15 is a flow chart illustrating the wiring direction deciding process.

The wiring direction deciding process 932 mentioned above will now be described in detail, referring to the flow chart of FIG. 15.

Step 151: Determine the wiring direction, using the xy rule as the standard wiring direction. For a four-layer circuit board, the standard wiring directions decided are xyxy or yxyx.

Step 152: List candidate wiring directions.

Step 153: Choose one area.

Step 154: Calculate the wiring capacities in the x and y directions in the area for the candidates.

Step 155: Calculate the excess numbers of nets in the x and y directions for the candidates.

Step 156: Go to step 158 if the excess numbers of nets in the x and y directions in the standard wiring direction are all 0, otherwise go to step 157.

Step 157: Select the candidate for which the wiring directions in the area give the minimum sum of excess numbers of nets in the x and y directions.

Step 158: Select the standard wiring directions as the wiring directions in the area.

Step 159: Return to step 153 if there is an area for which wiring directions have not yet been decided.

FIG. 16 shows an example of the wiring direction decision for a two-layer circuit board. FIG. 15(a) shows the results of calculations of the required numbers of nets. FIG. 16(a) shows the required numbers of nets (on the upper figures) in the x direction and the ones (lower figures) in the y direction. FIGS. 16(b), 16(c), and 16(d) show the excess numbers of nets (the sums of excess numbers of nets in the x and y directions) for three candidates. Hence, FIG. 16(b) shows the excess numbers of nets using the standard wiring directions (xy rule, x direction on the first layer, and y direction on the second layer). FIG. 16(c) shows the excess numbers of nets for the candidate xx (x direction on both the first and second layers). FIG. 16(d) shows the excess numbers of nets for the candidate yy (y direction on both the first and second layers). Note that the numbers of nets capable of passing through the area in the x and y directions are all 5 per wiring layer.

For the areas having excess numbers of zero in FIG. 16(b), the wiring directions are unconditionally determined to be the standard wiring directions. For the seven areas having positive excess numbers of nets an assessment is made to decide which candidate is optimum before the wiring directions are decided. The excess number of nets in the area (4, 2), for example, is 3.0 for the standard wiring directions, 1.4 for the candidate xx, and 8.0 for the candidate yy. Since the candidate xx has the minimum excess number of nets, the candidate xx is selected. Similarly, the excess number of nets in the area (4, 3) is 0.8 for the standard wiring directions, 2.6 for the candidate xx, and 5.8 for the candidate yy. Since the standard wiring directions have the minimum excess number of nets, the standard wiring directions are selected. The other five areas can have their wiring directions determined in a similar way.

FIGS. 16(e) and 16(f) show the wiring directions on the first layer 6X and second layer 6Y, respectively. The areas enclosed by bold lines in FIGS. 16(e) and 16(f) indicate areas in which wiring directions different from the standard wiring directions are allocated.

The wiring pattern deciding means 94 executes the wiring pattern decision by the maze routing method for each net using the wiring direction determined for each area in the wiring direction deciding means 93 described above. This operation must prevent a wiring pattern being established in a direction different from the decided direction. Therefore, the wiring pattern deciding system in this embodiment defines a cost function for each grid point, which is used for searching for the wiring route.

The wiring pattern decision will now be described in detail with reference to FIGS. 17 to 26.

(5.1) Process 941 for Setting Wired Patterns and Inhibits on Grid Table

Figure 21:
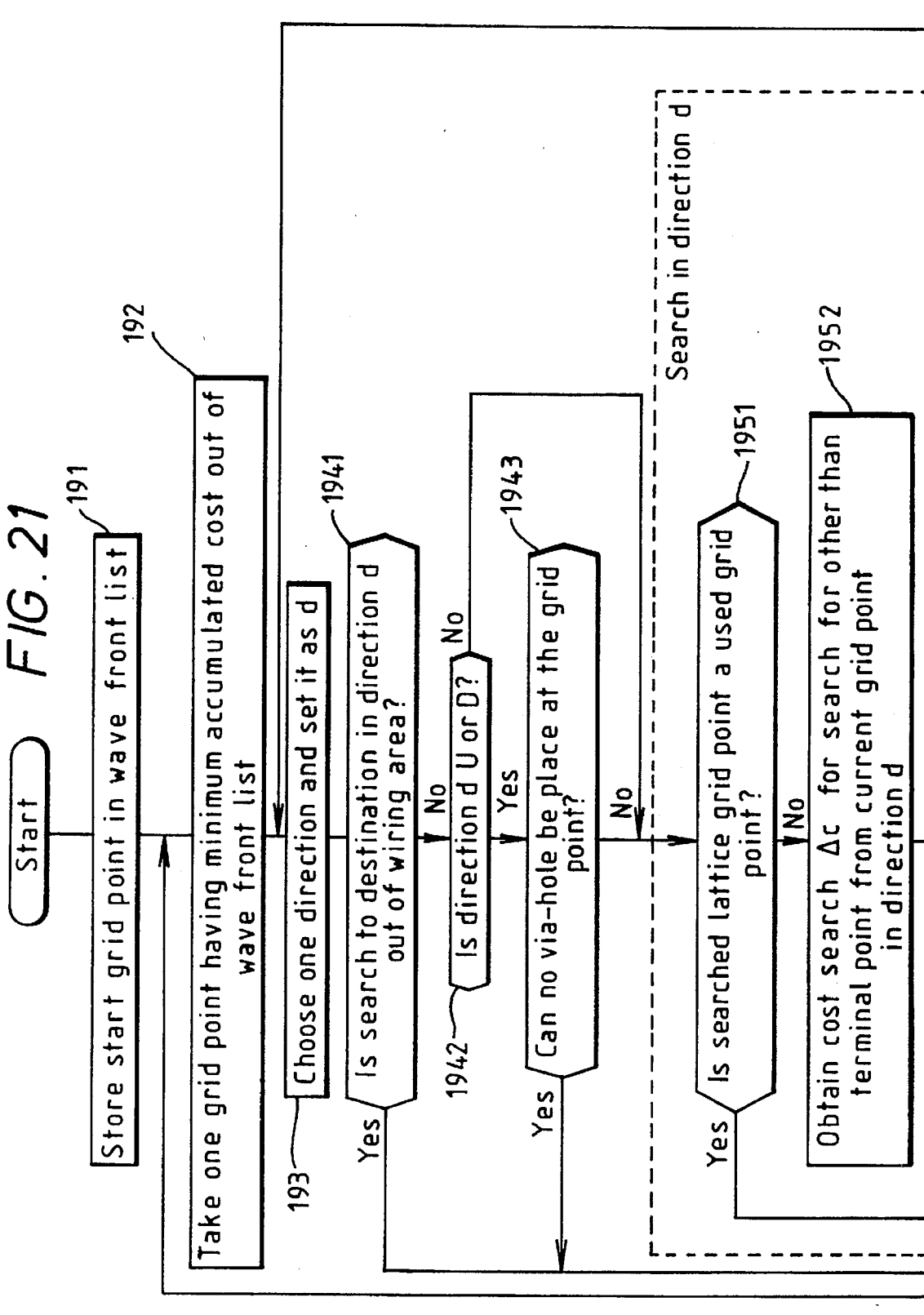
FIG. 21 is a flow chart illustrating the wiring route search.

First, wired pattern data and inhibit data are set on the grid table 945 shown in FIG. 17 which is a table representing all the grid points in the wiring area, as shown in detail in FIG. 21. In other words, "use" flags are set at all the grid points which are occupied by the wiring patterns and at all the grid points existing within inhibited areas.

A cost function is defined at each grid point on the grid table 945. This process is described below with reference to FIGS. 17, 18 and 19.

Figure 17A:
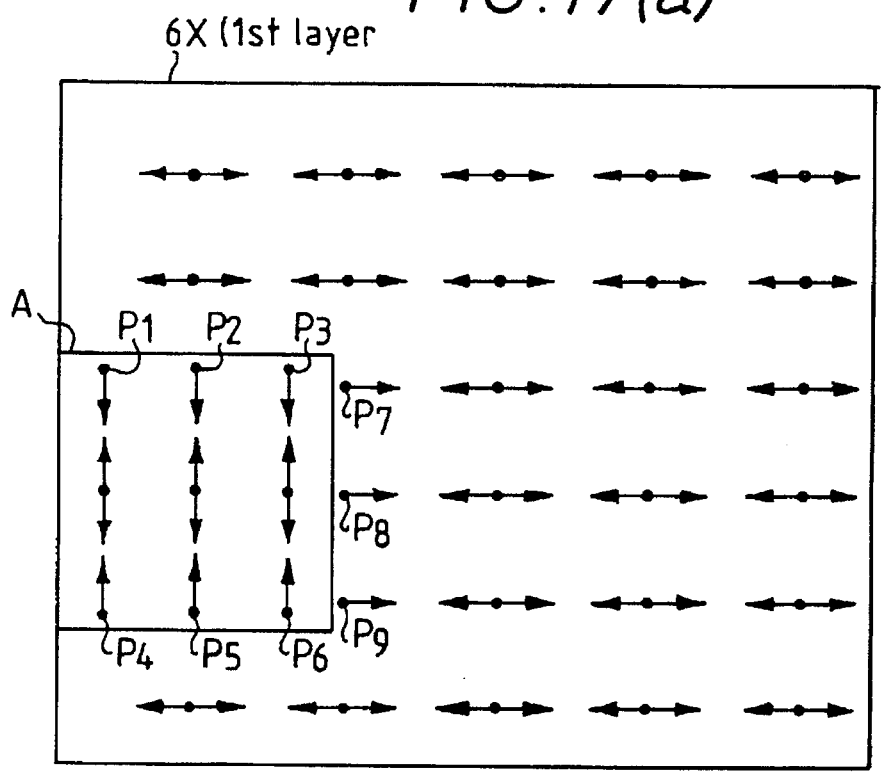
FIGS. 17(a) and 17(b) illustrate the definition of cost functions.
Figure 17B:
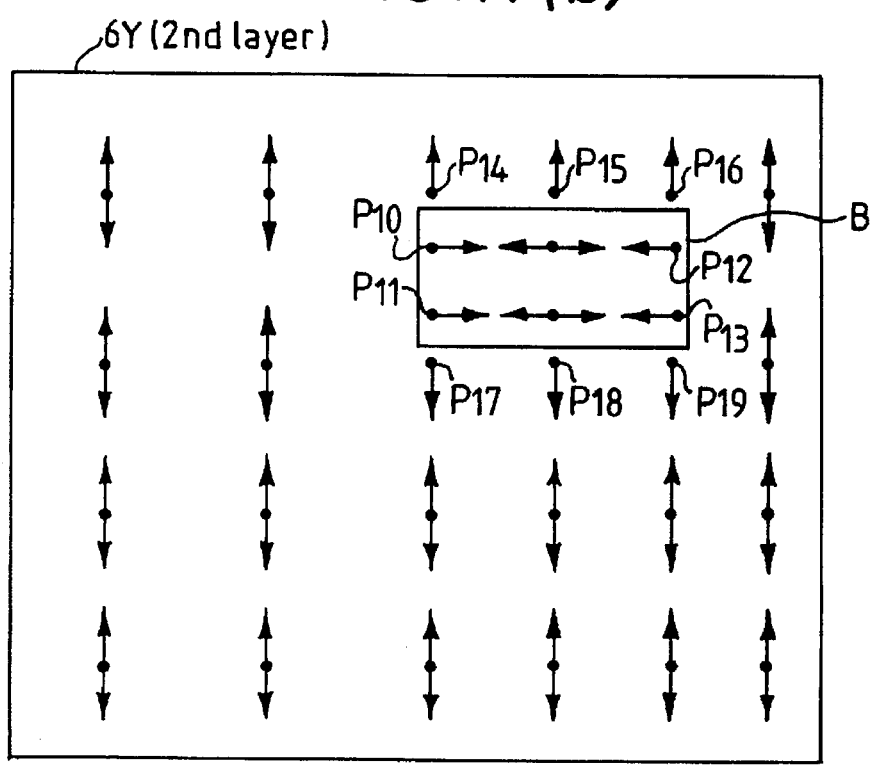

FIGS. 17(a) and 17(b) illustrate the concept of the definition of cost function. FIGS. 17(a) and 17(b) show a model of the method of defining the cost function according to the wiring directions (FIGS. 16(e) and 16(f)) determined by the wiring direction deciding means 93. The cost function defines the cost given to the route search to an adjacent grid point. It is a function of the search direction. In FIGS. 17(a) and 17(b), some of the grid points with wiring directions are indicated by arrows.

Since the wiring direction in the area A in the first layer 6X is the y direction as shown in FIG. 17(a), a low cost is given to searching in the y direction. However, the upper and lower side grid points P1, P2, P3, P4, P5, and P6 in the area A have low cost given to searching into the area A only. If searching toward the outside of the area A also has a low cost, this prevents nets being formed in the x direction outside the area A. Since the wiring direction outside the area A in the first layer is the x direction, a low cost is given to the searching in the x direction. However, the grid points P7, P8, and P9 adjoining the area A have a low cost given to the searching outside the area A only. If the searching into the area A also has a low cost, this prevents nets being formed wiring in the y direction inside the area A.

Since the wiring direction in the area B in the second layer 6Y is the x direction as shown in FIG. 17(b), a low cost is given to the searching in the x direction. However, the right and left side grid points P10, P11, P12, and P13 in the area B have a low cost given to the searching into the area B only. If searching toward the outside of the area B also has a low cost, this prevents nets being formed in the y direction outside the area B. Since the wiring direction outside the area B in the second layer is the y direction, a low cost is given to the searching in the y direction. However, the grid points P14, P15, P16, P17, P18, and P19 adjoining the area B have a low cost given to searching outside the area B only. If searching into the area B also has a low cost, this prevents nets being formed in the x direction inside the area B.

It is clear from the above description that the cost function at any of the grid points is one of the following six types.

(1) Low cost in E and W directions.

(2) Low cost in N and S directions.

(3) Low cost only in E direction.

(4) Low cost only in N direction.

(5) Low cost only in W direction.

(6) Low cost only in S direction.

In this list, N is the direction towards the top of the paper, S is the direction towards the bottom of the paper, and E and W are directions towards the right and left sides respectively.

Figure 18B:
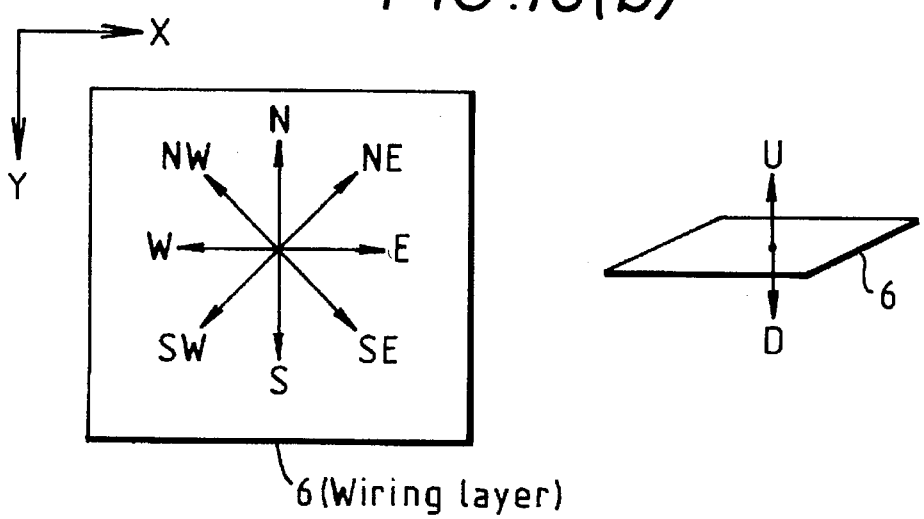

FIG. 18(a) shows examples of the cost functions defined on the basis of the above six types. The cost function table, as shown in FIG. 18(a), is a table storing the contents of the cost functions. The six cost functions are identified by cost function identifier 1 to 6. FIG. 18(b) shows the definitions of the directions used in the cost function table 946. The directions E, N, W, S, NE, NW, SW, and SE are parallel to the plane of the wiring layer 6, and further directions U and D are defined in directions perpendicular to the plane of the wiring layer 6. The direction D is directed towards the wiring layer directly below the wiring layer 6, and the direction U is directed towards the wiring layer directly above the wiring layer 6.

The cost function represented by the identifier 1 is a cost function for use within an area having the x direction allocated thereto. A lower cost is defined for the x direction (E and W), and a higher cost is given to the directions N, S, NE, NW, SW, and SE. For this reason, it is easy to form a wiring pattern with nets extending in the x direction within an x direction area i.e. an area in which the preferred direction is the x direction.

The cost function represented by the identifier 2 is a cost function for use within an area having the y direction allocated thereto. A lower cost is defined for the y direction (N and S), and a higher cost is given to the directions N, S, NE, NW, SW, and SE. For this reason, it is easy to form a wiring pattern with nets extending in the y direction within a y direction, i.e. an area in which the preferred direction is the y direction.

The cost functions represented by the identifier 3, 4, 5, and 6 are cost functions for use at boundaries at which the wiring direction changes. A lower cost is given to the directions E, N, W, and S.

Figure 19:
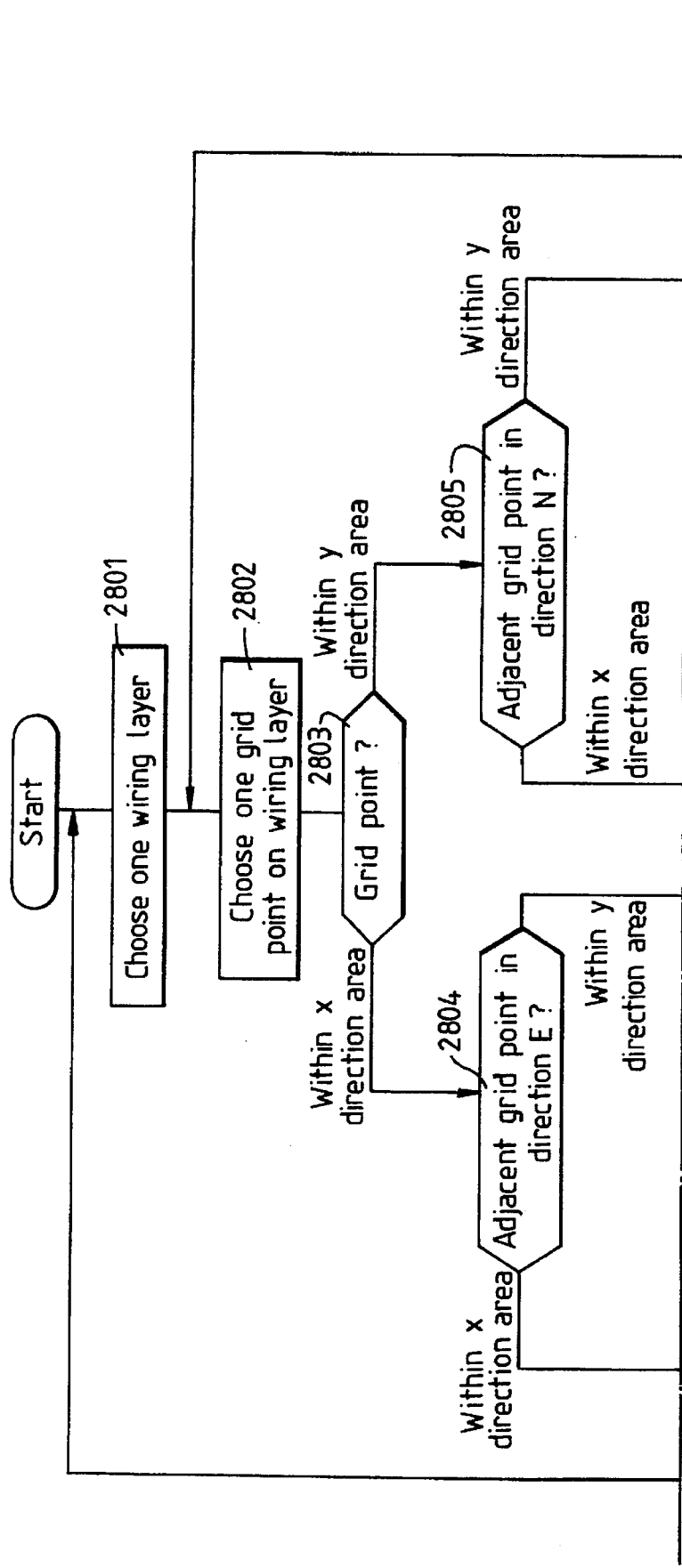
FIG. 19 is a flow chart illustrating the cost function defining process.

The cost function identifier described above are defined according to a flow chart for the cost function defining process 942, which is shown in FIG. 19, and are set at the respective grid points in the grid table 945. Steps shown in FIG. 19 will now be described.

Step 2801: Choose one wiring layer.

Step 2802: Choose one grid point on the wiring layer.

Step 2803: Go to step 2804 if the grid point is within an x direction area, or go to step 2805 if it is within a y direction area.

Step 2804: Go to step 2806 if a grid point adjacent to the grid point in the E direction is within an x direction area, or go to step 2812 if it is within a y direction area.

Step 2805: Go to step 2813 if a grid point adjacent to the grid point in the N direction is within an x direction area, or go to step 2807 if it is within a y direction area.

Step 2806: Go to step 2810 if a grid point adjacent to the grid point in the W direction is within an x direction area, or go to step 2811 if it is within a y direction area.

Step 2807: Go to step 2814 if a grid point adjacent to the grid point in the S direction is within an x direction area, or go to step 2815 if it is within a y direction area.

Step 2810: Make use of the cost function from the identifier 1 as the cost function to be used at the grid point. Thus, the cost function identifier 1 is set in the storage area of the grid point in the grid table 945.

Step 2811: Make use of the cost function from the identifier 3 as the cost function to be used at the grid point. Thus, the cost function identifier 3 is set in the storage area of the grid point in the grid table 945.

Step 2812: Make use of the cost function from the identifier 5 as the cost function to be used at the grid point. Thus, the cost function identifier 5 is set in the storage area of the grid point in the grid table 945.

Step 2813: Make use of the cost function from the identifier 6 as the cost function to be used at the grid point. Thus, the cost function identifier 6 is set in the storage area of the grid point in the grid table 945.

Step 2814: Make use of the cost function from the identifier 4 as the cost function to be used at the grid point. Thus, the cost function identifier 4 is set in the storage area of the grid point in the grid table 945.

Step 2815: Make use of the cost function from the identifier 2 as the cost function to be used at the grid point.

Thus, the cost function identifier 2 is set in the storage area of the grid point in the grid table 945.

Step 2816: Return to step 2802 if there is a grid point having an undefined cost function on the wiring layer, otherwise go to step 2817.

Step 2817: Return to step 2801 if there is a wiring layer having an undefined cost function, otherwise end the cost function definition process.

FIGS. 20(a) and 20(b) show the results of setting the cost function identifier on the grid table 945 according to FIG. 19 on the basis of the wiring directions shown in FIGS. 16(e) and 16(f). FIG. 19(a) shows the content of the storage areas in the grid table corresponding to the first layer 6X, and FIG. 20(b) shows the content of the storage areas in the grid table corresponding to the second layer 6Y. In FIGS. 20(a) and 20(b), the small blocks indicate storage areas corresponding to the respective grid points. The areas enclosed by bold lines indicate areas having allocated wiring directions which are different from the standard wiring directions. The cost function for identifier 1 are set at grid points included in areas in the x direction, and the cost function from identifier 2 are set at grid points included in areas in the y direction, and the cost function from identifier 3, 4, 5, and 6 are set at grid points at the boundaries of the areas in the x and y directions.

The cost function from the identifier 3 is used to ensure that a route does not come from an x direction area to an adjacent one which is a y direction area. As an example, the area enclosed by bold lines in the first layer 945X, which is a y direction area, has the identifier 3 set at the grid point adjacent to the area in the E direction. As another example, the area enclosed by bold lines in the second layer 945Y, which is an x direction area, has the identifier 3 set at the grid point farthest W in the area. When the identifier 3 is set at the boundaries as described above, it is hard to search in the W direction, or to search from an x direction area to a y direction area. The cost function from the identifier 5 is used to prevent ensure that a route does not come from an x direction area to the adjacent one which is a y direction area. However, unlike the cost function from the identifier 3, this also ensures that a route does not come in the E direction. The cost function from the identifier 4 and 6, are used to ensure that a route does not come from a y direction area to an adjacent one which is an x direction area. They also ensure that a route does not come in the S an N directions, respectively.

The wiring route search 943 process searches for a wiring route for each of the nets using the cost function set. The wiring route search process 943 is described in detail below, referring to FIG. 21. The wiring route search 943 in the first embodiment, as will subsequently be made clear, uses several types of cost functions for each grid point as compared with the usual maze routing method.

The storing unit for each grid point in the grid table 945 contains data, including (i) a "use" flag indicating whether the grid point has been used or not, (ii) search flag indicating whether the grid point has been searched or not, (iii) starting flag indicating whether the grid point is at the start pin or not, (iv) target flag indicating whether the grid point is at the target pin or not, (v) accumulated cost, (vi) incoming direction indicating from what direction the search reached the grid point, and (vii) cost function identifier.

The "use" flag is set at the grid point at which the wiring pattern has existed and at the grid points included in an inhibited area. The search flag is set at the grid point which the search has currently been reached by the search. The accumulated cost is a cost which has been accumulated for the search from the start to an adjacent grid point. The cost for the search to the adjacent grid point is defined by a cost function. The incoming direction indicates a "trace" in the wiring route search 943, being used in a back-trace process in a wiring route registration, which will be described later. The cost function identifier, as described above, defines the cost function for searching from the grid point.

The wiring route search 943 in this embodiment uses a wave front list. The wave front means the leading edge of the searching operation, and the wave front list is a list for storing grid points belonging to the wave front. The wiring route search 943 is executed such that a grid point having the minimum accumulated cost is taken out of the table, and search is extended from the grid point to adjacent grid points, and this is repeated.

Step 191: Set the grid point at the start in the wave front list.

Step 192: Take one grid point having the minimum accumulated cost out of the wave front list.

Step 193: Choose one direction and sets it as d.

Step 194: The next process is branched depending on whether search in the d direction is permitted.

Step 1941: Skips search step 195 in the d direction, or go to step 196, if searching to a destination in the d direction is out of the wiring area, otherwise go to step 1942.

Step 1942: Go to step 1943 if the direction is U or D, otherwise go to step 1951.

Step 1943: Skip search step 195 in the d direction, or go to step 196, if the current grid point from step 192 cannot place a via hole, otherwise go to step 1951.

Step 195: Search for an adjacent grid point in the d direction.

Step 195 is as follows.

Step 1951: Go to step 196 if the grid point searched for, or the adjacent grid point in the d direction, is not at a target pin and has been used, otherwise go to step 1952.

Step 1952: Obtain the cost ΔC for the search for the adjacent grid point in the d direction so that a cost function identifier is obtained by reference to the grid table before the cost ΔC is obtained by reference to the cost function table.

Step 1953: Add the cost ΔC to the accumulated cost stored at the current grid point, and set the sum as C.

Step 1954: Go to step 1955 if the looking grid point searched for has not yet been searched, otherwise go to step 1957.

Step 1955: Set the sum C at the searched grid point as the accumulated cost, and sets the incoming direction as d.

Step 1956: Stores the searched grid point in the wave front list, unless that the searched grid point is at the target pin.

Step 1957: Go to step 1958 if the sum C is smaller than the accumulated cost set at the searched grid point, otherwise go to step 196.

Step 1958: Set the sum C at the searched grid point as accumulated cost, and sets the incoming direction as d.

Step 196: Return to step 193 if there is a un-searched direction, or end the search from the grid point before going to step 197.

Step 197: Return to step 192 if the wave front list has a grid point, otherwise end the wiring route search.

The wiring route storing 944 inputs the wiring route using the results of the wiring route search process 943 so that a trace is made back to the incoming direction set in the grid table 945 to decide the wiring route from the target pin to the start before it is stored in the design master file 96. The wiring route storing 944 is described in detail below with reference to FIG. 22.

Step 201: Choose the grid point having the minimum accumulated cost from among the ones at the target pin.

Step 202: Record coordinates at the grid point.

Step 203: Set a "use" flag at the grid point.

Step 204: Go to step 206 if the grid point is at the start, otherwise go to step 205.

Step 205: Obtain the adjacent grid point in the opposite direction set before returning to step 202.

Step 206: Convert the series of recorded grid points to line data.

Step 207: Store the line data in the design master file 96 as the wiring pattern.

i) An Example of the Execution of the Wiring Route Search Process

A first example of the execution of the wiring route search process on the basis of the wiring route search 943 will be described with reference to FIGS. 23 to 25.

Figure 23A:
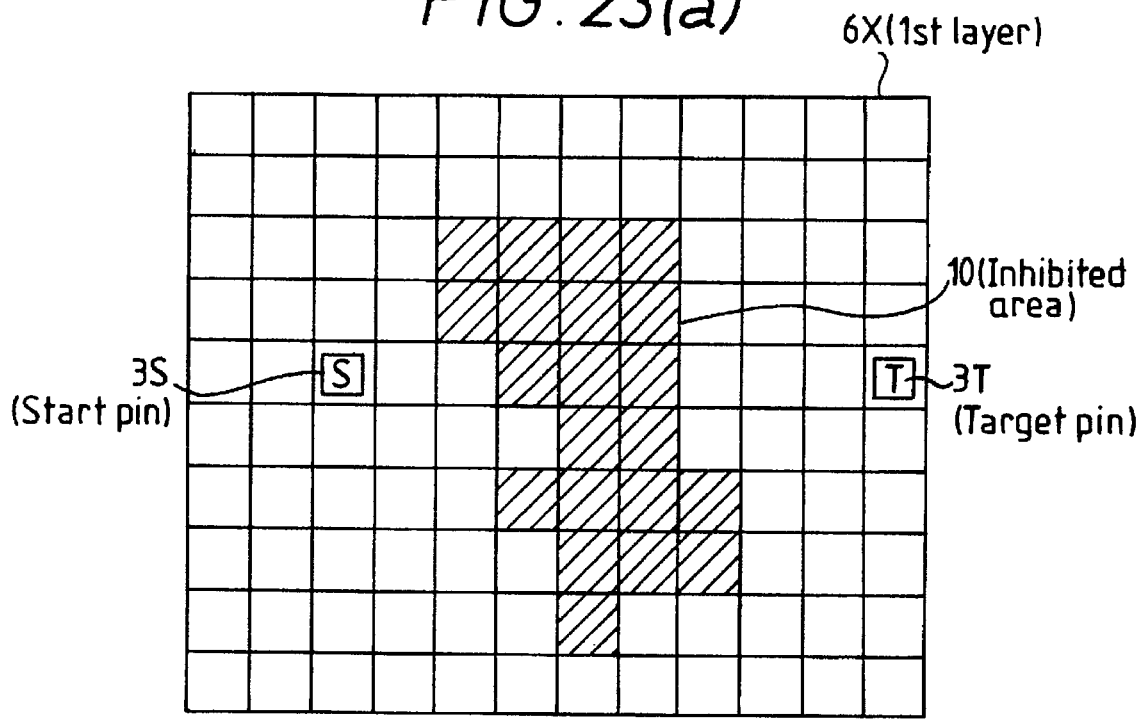
FIGS. 23(a) and 23(b) show an example of execution of the wiring route search, and show the states of wiring layers as preconditions for the execution of the wiring route search.
Figure 23B:
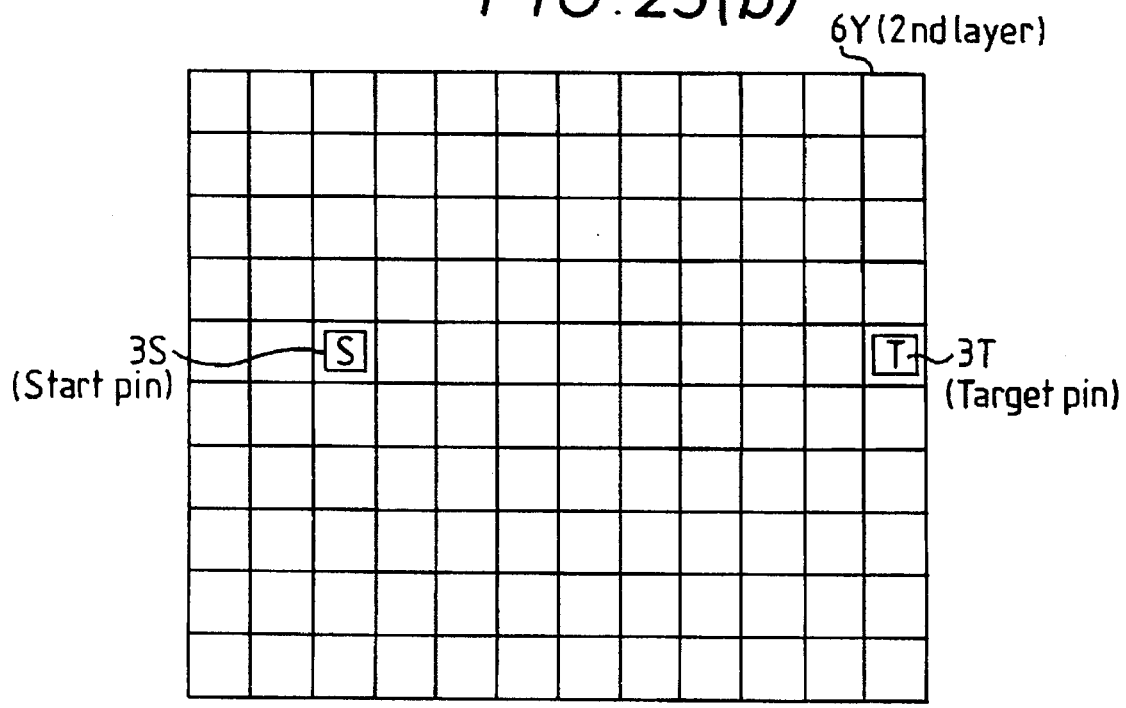
Figure 24B:
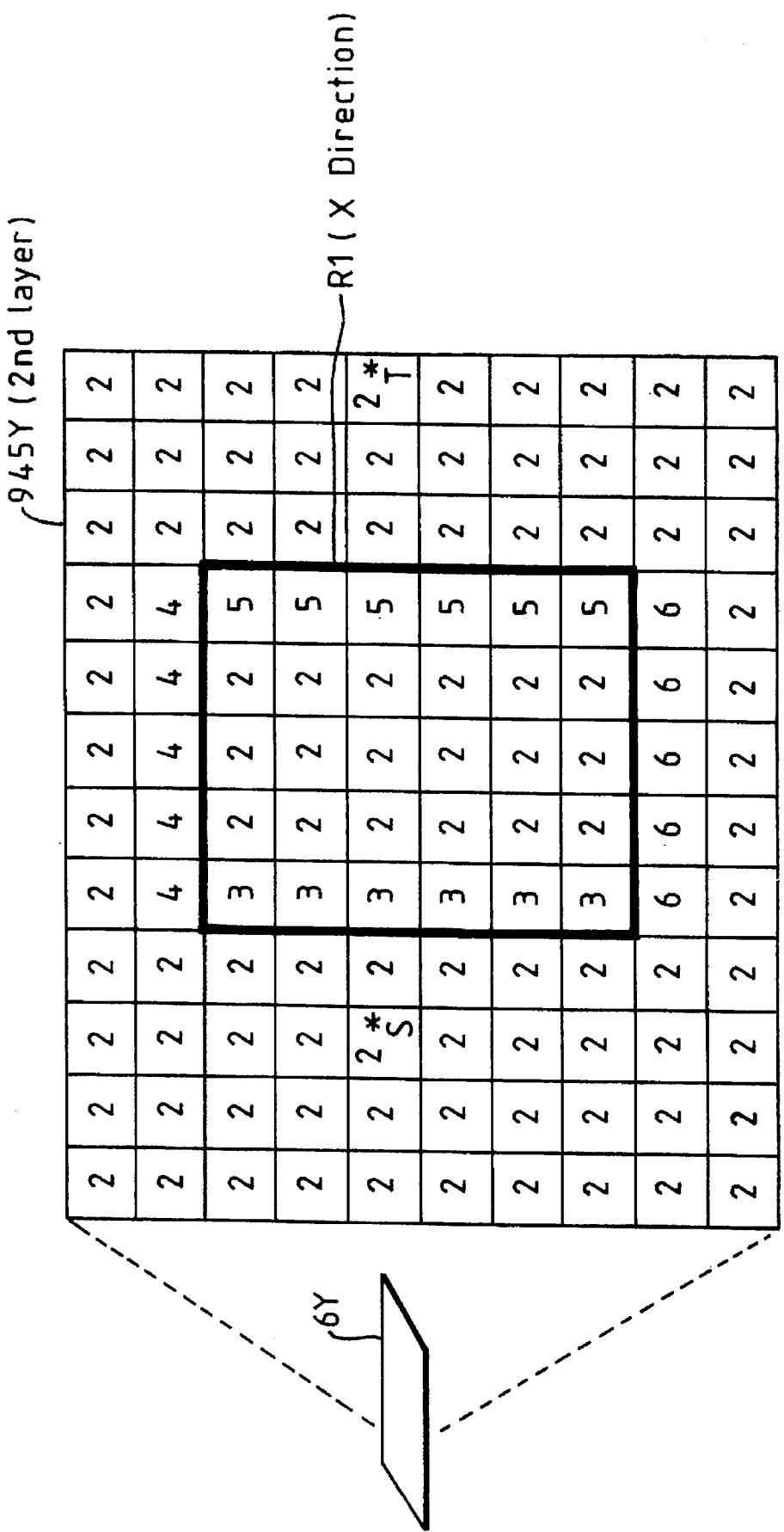

FIGS. 23(a) and 23(b) show the states of the first layer 6X and the second layer 6Y before the wiring route search 943 is executed. The first layer 6X has an inhibited area 10 between a start pin 3S and a target pin 3T. Hence, the grid table 945 shown in FIG. 24 has a start flag S, a target flag T, a use flag *, and cost function identifier stored therein. FIG. 24(a) illustrates the storage area corresponding to the first layer 6X, and FIG. 23(b) illustrates the storage area corresponding to the second layer 6Y. The small blocks represent the storing units corresponding to the grid points. Nets on the first layer 6X are in the x direction for all the areas, and nets on the second layer 6Y are in the y direction except for an area R1 enclosed by bold lines. Nets in the area R1 are in the x direction.

Figure 25A:
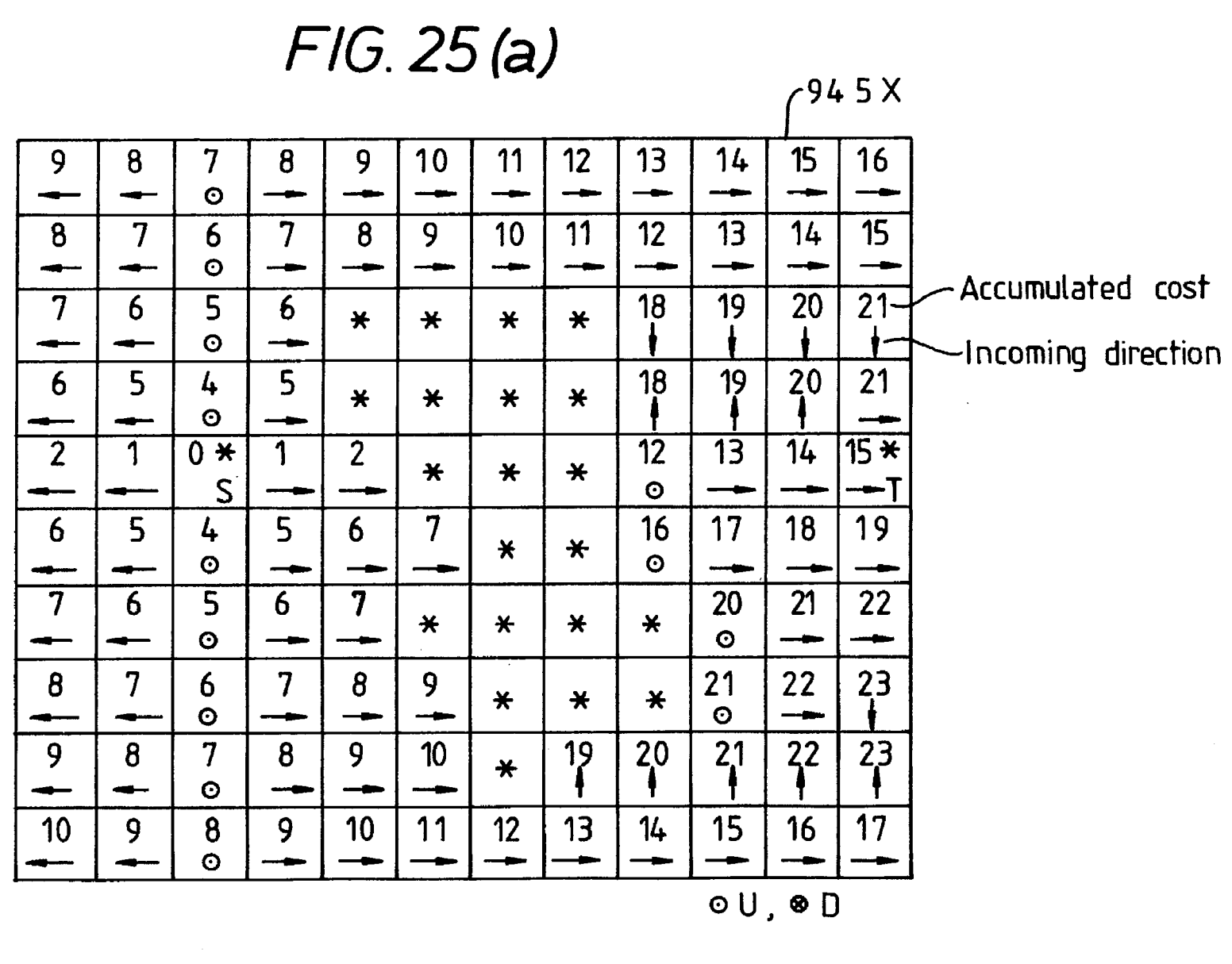

FIGS. 25(a) and 25(b) show accumulated costs (figures) and incoming directions (arrows U and D) set at the grid points in the grid table 945 after the execution of wiring route search. The incoming directions identify that the searching reached the grid point in the direction indicated by arrows. In the example are shown the results of searching for wiring routes using only the horizontal directions, i.e. the E, N, W, and S directions and the vertical directions, i.e. the U and D directions to simplify the explanation. It can be seen from FIGS. 25(a) and 25(b) that the wiring route having an accumulated cost of 15 reached the target.

(ii) An Example of the Execution of Wiring Route Storing Process

Figure 26A:
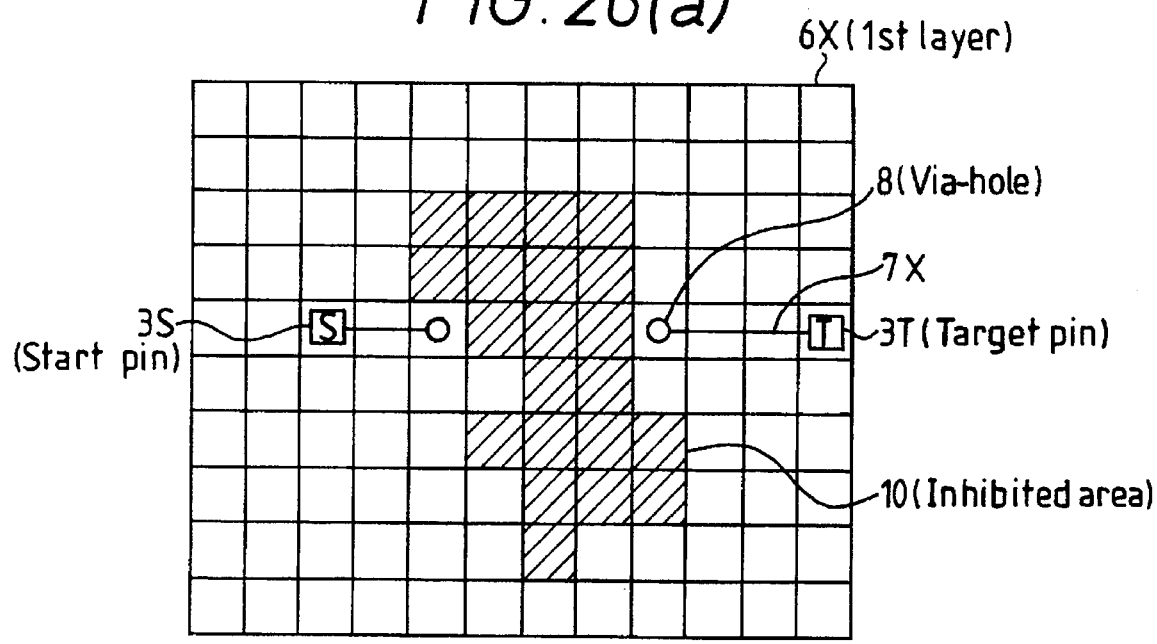
FIGS. 26(a) and 26(b) show an example of execution of wiring route storing, and shows the state of wiring layers as preconditions for the execution of the wiring route storing.
Figure 26B:
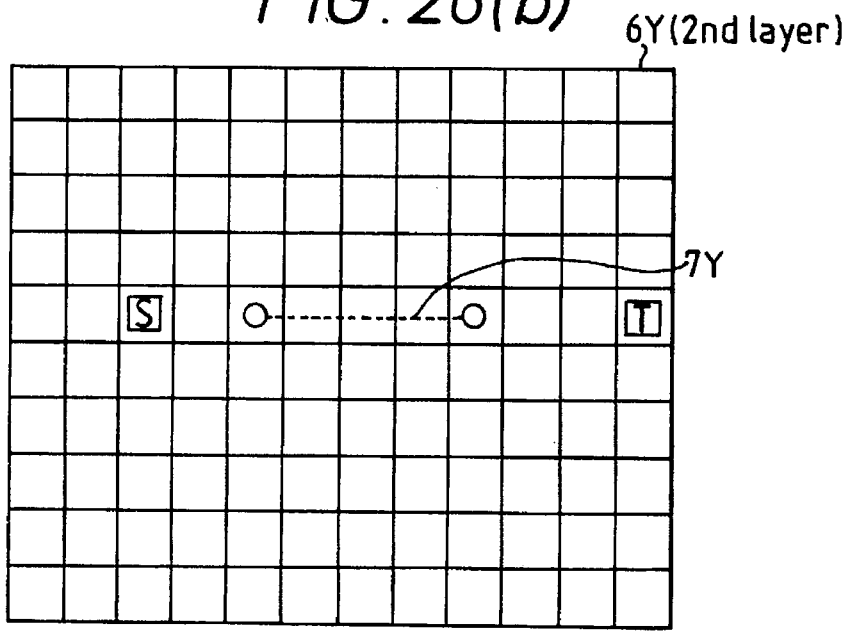

The following describes an example of the execution of the wiring route storing process on the basis of the wiring route storing 944, and with reference to FIGS. 25 and 26.

A trace operation is carried out for the results of the wiring route search 943 shown in FIG. 25 from the target. First, since the incoming E direction is set at the target, an adjacent grid point is in a direction opposite to E, i.e. in the W direction. As a result, the trace operation reaches a grid point having an accumulated cost of 14. In turn, the incoming E direction set at the grid point is obtained, and then an adjacent grid point is obtained in the opposite direction, the W direction. As a result, the trace operation reaches a grid point having an accumulated cost of 13. In that way, the trace operation continues until it reaches the start to obtain a series of grid points from the target to the start: 15, 14, 13, and 12 on the first layer, 9, 8, 7, 6, and 5 on the second layer, and 2, 1, and 0 on the first layer.

FIG. 26 shows a wiring pattern obtained after the trace operation described above has been performed. As can be seen from FIG. 26, a via hole 8 is provided to connect a wire 7X on the first layer 6X with a wire 7Y on the second layer 6Y.

The first embodiment described so far provides several advantages.

It can significantly reduce local congestions in particular wiring directions so that the wiring pattern can be determined with a high wiring efficiency. This is accomplished because the wiring region is divided into a plurality of areas, the congestion of the required wirings in each sub-area is estimated, the wiring directions on a plurality of wiring layers are determined for each of the areas and, on the basis of this, the wiring route for each net is determined.

Also, it has the advantage that a high wiring efficiency is accomplished as the wiring pattern decision is made by the maze routing method. In addition, it cannot only search for short wiring routes, but also can use a computer to accomplish the processes as it has the grid table to define the cost functions for execution of the search process when the maze routing method is used.

It has the further advantage that it provides a good wiring pattern to be obtained for which there is little or no change to the wiring directions in any of the wiring layers. This is because the wiring direction for each area is decided on the basis that the standard wiring directions are used initially, the wiring directions having change from the standard wiring directions are listed, and the optimum wiring direction is selected from among them. This prevents cases in which the wiring direction xy in one area and yx in another area. Similarly, it prevents cases in which the wiring directions xxxy in one divided area and xyxx in another divided area.

Furthermore, it has the advantage that it can prevent inter-layer crosstalk from being generating as parallel wiring patterns on different wiring layers can be minimized. This is achieved because the wiring congestion can be predicted with a high accuracy by way of the iterated leveling processes so that the xy rule is disregarded only for areas for which such disregarding is essential.

The wiring pattern determined by the wiring pattern deciding system of the first embodiment also provides the following features.

(a) The divided areas are rectangular so that the wiring region is divided longitudinally and laterally. Each rectangular area can be recognized in the wiring direction different from the surrounding areas even if they are on the same wiring layer when the wiring patterns are formed on the circuit board, as the individual rectangular areas have respective directions.

(b) The wiring region can be divided to an extent sufficient for the number of the nets crossing over the boundaries forming the rectangles can be made to be more than that of the nets containing all the pins in the rectangles.

Figure 27:
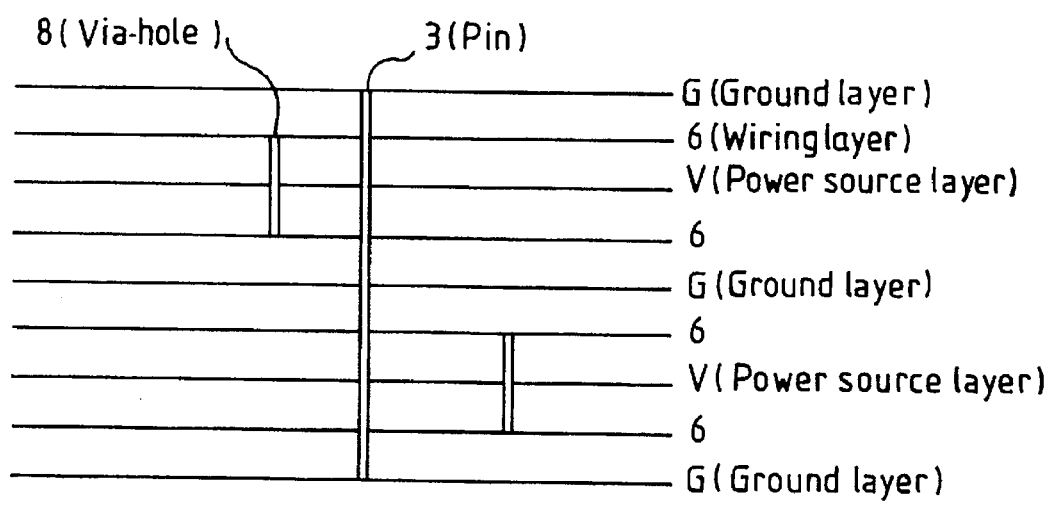
FIG. 27 is a cross-sectioned view of a circuit board produced by an embodiment of the present invention, wherein ground layers or power source layers are inserted between wiring layers to prevent inter-layer crosstalk noise.

Note that the circuit board with a wiring pattern determined by the method described above may involve areas in which wires are parallel and in the same direction on adjacent wiring layers. Such parallel wires may cause noise due to inter-layer crosstalk. Therefore, as shown in FIG. 27, it is preferable to insert conduction layers, such as ground layers G and power source layers V, between adjacent wiring layers 6. The ground layers G or the power source layers V can shield the wiring patterns from each other so that the noise (inter-layer crosstalk) induced therebetween can be reduced. Note that the ground layers G and the power source layers V have conductive patterns formed on their entire surfaces except for those points corresponding to the pin 3 and the via holes 8. The pin 3 penetrates all the layers, and the via holes 8 go through two adjacent wiring layers 6 in which the ground or power source layer is inserted.

3. Other Embodiments (a) Second Embodiment

In the first embodiment described above, the "excess number" in the wiring direction deciding process 932 was defined as the difference between the required number and the wiring capacity. However, it is difficult to use all the available wiring capacity for wiring patterns. For this reason, the excess number of net can be defined as follows.

Excess number in the x direction=0, if (required number in the x direction)≦k1×(wiring capacity in the x direction);

Excess number in direction x=(required number in the x direction)−k1×(wiring capacity in the x direction), if (required number in the x direction)>k1×(wiring capacity in the x direction);

Excess number in the y direction=0, if (required number in the y direction)≦k2×(wiring capacity in the y direction);

Excess number in the y direction=k2×(required number in the y direction)−k2×(wiring capacity in the y direction), if (required number in the y direction)>k2×(wiring capacity in the y direction); where k1 and k2 are constants. The constants k1 and k2 may be set e.g. to 0.8.

Apart from this difference in the second definition of the excess number, the second embodiment may be the same as the first embodiment.

Using the definition of the second embodiment, the wiring congestion can be predicted with a high accuracy. This provides the advantage that shorter wiring patterns can be selected. It also has the advantage that the wiring efficiency can be made high.

(b) Third Embodiment

In the first embodiment, the excess number of wirings was calculated for each area. Any excess net was made to bypass the area. Some nets, however, cannot have their wiring pattern re-routed as they are required to have a short length in order for them to permit suitably rapid signal transmission time. In these circumstances, it is necessary to give a weight to the net depending on its importance, so that all the nets can be treated equivalently. As an example, assume that an allowable upper limit of the length is determined for each net in terms of the upper limit of the signal transmission time, and wiring be made in order of the magnitude of the allowable upper limit of the length, those net predicted to exceed the upper limit(s) can be obtained. The net should be calculated as having a number q depending on the allowable upper limit of the length, where q is equal to or greater than 1. Thus, the weighed excess number of nets can be calculated.

Using the excess number of nets defined as described above, it is possible for those nets which require a short length to be given more direct routes than others, in dependence on their signal transmission time and electrical characteristics. This provides the advantage of obtaining a wiring pattern which has improved signal transmission characteristics and/or electrical characteristics.

(c) Fourth Embodiment

In the first embodiment it was assumed that the wiring patterns be drawn parallel to the perpendicular sides (x and y directions) of the circuit board. The circuit board may also have inclined nets thereon, i.e. nets which are not parallel to the sides of the circuit board.

Figure 28A:
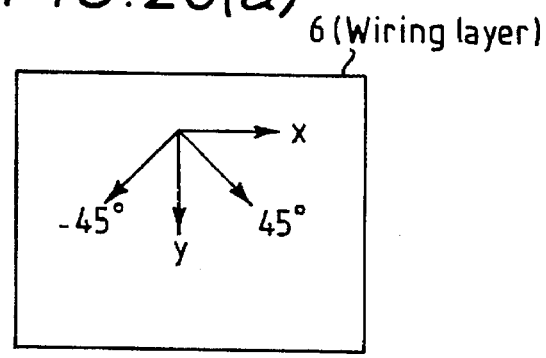
FIGS. 28(a) and 28(b) illustrate a method in which wiring directions including inclined directions are used to determine the optimum wiring directions.
Figure 28B:
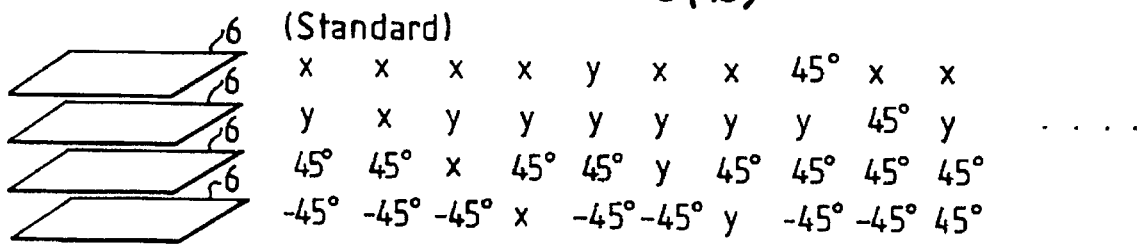

FIG. 28 shows a method in which four directions, including inclined directions, are used to determine optimum wiring direction in a circuit board having four wiring layers. FIG. 28(a) defines the four directions. FIG. 28(b) shows some candidate wiring directions. Using a process similar to that described for the first embodiment, the optimum wiring directions can be obtained, and the cost function can be defined on the basis of the wiring direction before the wiring pattern for each net is decided according to the cost function.

The third embodiment has the advantage that it can use inclined directions and orthogonal directions so that the lengths of the nets may be made shorter.

(d) Fifth Embodiment

The process of the first embodiment was based on the assumption that the net had two pins. A net having three or more pins may be processed if a change is made to the area required number calculation 931. The change required is that some virtual routes should be determined depending on wiring conditions, for example, daisy chain, Steiner tree, or spanning tree, on the net before the correct probabilities are given to the respective virtual routes. This allows a calculation to be made of the required numbers of nets in the processes given in the first embodiment.

(e) Sixth Embodiment

In the first embodiment, the wiring congestions were leveled in the area required number calculation 931, but variation of the wiring capacity due to the determination of the wiring directions was not taken into account. In other words, in the area required number calculation 931 of the first embodiment, the required number of nets in the area was used as the index to indicate the degree of congestion when the probability of each virtual route was altered to level the wiring congestion. Strictly speaking, the degree of wiring congestion is different depending on the wiring direction in the wiring layer. For example, an area having wiring directions xyxy may have a different degree of congestion than another area having wiring directions xxxy even if the required number of nets is equal.

For this reason, after the process 932 is executed, the area required number calculation 931 should be repeated to give a more precise calculation of the required number of nets. In other words, an index indicating the degree by which the area is congested for the virtual routes may be used. This index may be, for example, the value of the required number of nets subtracted from the wiring capacity when the probability of the virtual route is altered.

As described above, the results of the determination of the directions can be fed back to the area required number calculation 931 so that the wiring congestion can be estimated with a higher accuracy, in order to determine, the optimum wiring directions. This has the advantage that the nets can be given a shorter length, and the wiring pattern can be determined with a higher efficiency.

(f) Seventh Embodiment

As described previously, the present invention determines the wiring directions for each area in dependence on the local wiring congestion and the wiring pattern is determined on the basis of the wiring directions thus determined. In any of the embodiments described above, the wiring pattern decision process is accomplished by suitably defining the "cost function" in the wiring direction deciding process 932. In other words, the determination of the desired wiring patterns is accomplished such that a low cost is given to a direction parallel to the wiring directions determined. It should be noted that the wiring pattern decision process also can be accomplished by suitably limiting the "search direction." Searching in the y direction can be initiated for grid points in the wiring areas in the x direction and searching in the x direction for grid points in the wiring areas in the y direction.

FIG. 29 shows a process for defining inhibited directions for searching for grid points in the wiring layers. The inhibited directions for the search thus defined are stored in the grid table in the form of identifier, as will be described below. During the wiring route search 943, use is made of such identifier to identify the inhibited directions for the search, to allow searching only in searchable directions.

Step 2901: Choose one wiring layer.
Step 2902: Choose one grid point on the wiring layer.
Step 2903: Go to step 2904 if the grid point is within the area in the x direction, or go to step 2905 if it is within the area in the y direction.
Step 2904: Go to step 2906 if a grid point adjacent to the grid point in the E direction is within the area in the x direction, or go to step 2912 if it is within the area in the y direction.
Step 2905: Go to step 2913 if a grid point adjacent to the grid point in the N direction is within the area in the x direction, or go to step 2907 if it is within the area in the y direction.
Step 2906: Go to step 2910 if a grid point adjacent to the grid point in the W direction is within the area in the x direction, or go to step 2911 if it is within the area in the y direction.
Step 2907: Go to step 2914 if a grid point adjacent to the grid point in the S direction is within the area in the x direction, or go to step 2915 if it is within the area in the y direction.
Step 2910: Inhibit searching in N and S directions. Set the cost function identifier 1 in the storage area at the grid point in the grid table 945.
Step 2911: Inhibit searching in N, NW, W, SW, and S directions. Set the cost function identifier 3 in the storage area at the grid point in the grid table 945.
Step 2912: Inhibit searching in directions N, NE, E, SE, and S directions. Set the cost function identifier 5 in the storage area at the grid point in the grid table 945.
Step 2913: Inhibit search in W, NW, N, NE, and E directions. Set the cost function identifier 6 in the storage area at the grid point in the grid table 945.
Step 2914: Inhibit searching in W, SW, S, SE, and E directions. Set the cost function identifier 4 in the storage area at the grid point in the grid table 945.
Step 2915: Inhibit searching in W and E directions. Set the cost function identifier 2 in the storage area at the grid point in the grid table 945.
Step 2916: Return to step 2902 if a grid point having an undefined search inhibited direction for the search exists on the wiring layer, otherwise go to step 2917.
Step 2917: Return to step 2901 if there is a wiring layer having an undefined inhibited direction for the search, otherwise end the process for defining the inhibited directions for the search.

In the wiring route search, the cost defined for each searching operation accumulates whenever a search operation is carried out. In the seventh embodiment cost functions with the same value are defined in the x and y directions. For example, the E direction has a cost function value of 1, the value in the N direction is 1, the value in the W direction is 1, the value in the S direction is 1, the value in the NE direction is 6, the value in the NW direction is 6, the value in the SW direction is 6, the value in the SE direction is 6, the value in the U direction is 3, and the value in the D direction is 3.

Figure 30:
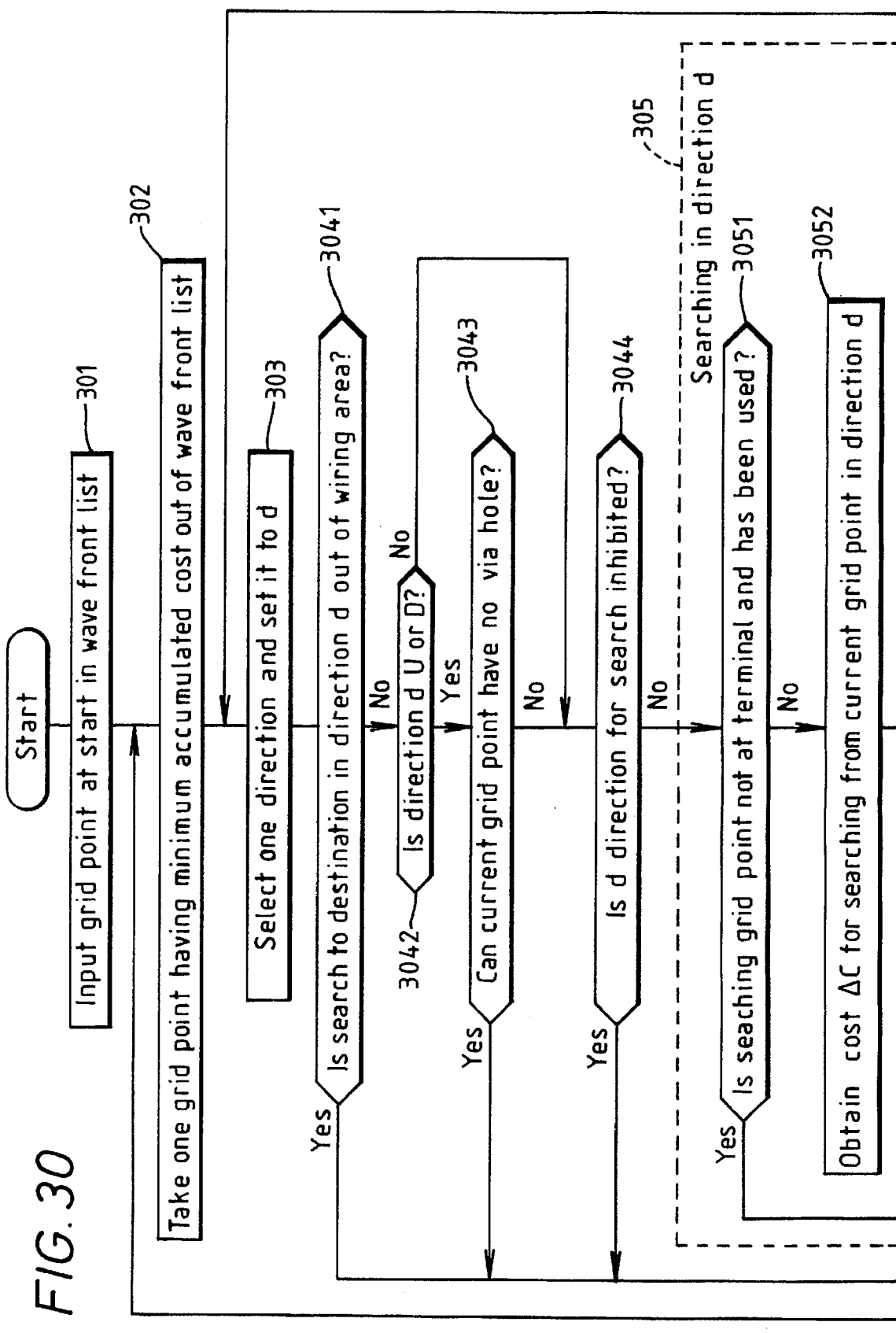
FIG. 30 is a flow chart of an alternative wiring route search.
Figure 31A:
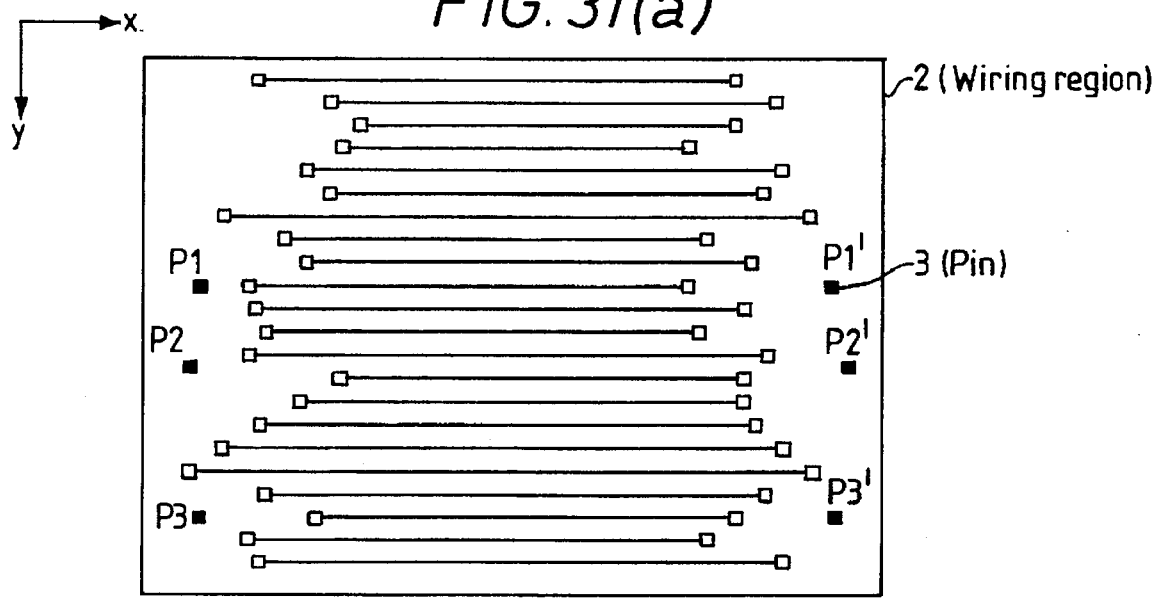
FIGS. 31(a) and 31(b) illustrates problems to be solved by the present invention.
Figure 31B:
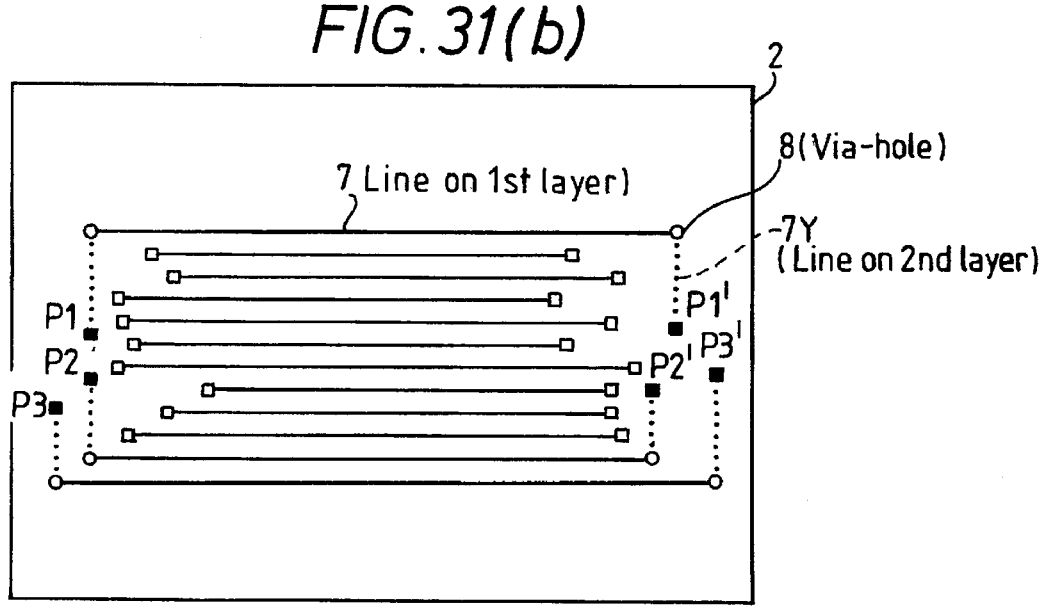

The wiring route search process is described in detail below with reference to FIG. 30. The process is generally similar to that of the flow chart described in FIG. 18 except that it has an additional search inhibited direction reference process (step 3044).

Step 301: Stores the grid point at the start in the wave front list.
Step 302: Take one grid point having the minimum accumulated cost out of the wave front list.
Step 303: Choose one direction and sets it as d.
Step 304: The next process branches depending on whether searching in the d direction is permitted.

Step 3041: Skip searching 305 in the d direction, or go to step 306, if searching to a destination in the d direction is out of the wiring area, otherwise go to step 3042.

Step 3042: Go to step 3043 if the d direction is U or D, otherwise go to step 3051.

Step 3043: Skip searching 305 in the d direction, or go to step 306, if the current grid point taken out at step 302 cannot place a via hole, otherwise go to step 3051.

Step 3044: Skip searching 305 in the d direction, or go to step 306, if searching is inhibited in the d direction, otherwise go to step 3051.

Step 305: Search for an adjacent grid point in the d direction.

Step 306: Return to step 303 if there is a direction which has not been searched, or end the searching from the grid point before going to step 307.

Step 307: Return to step 302 if the wave front list has a grid point, otherwise end the wiring route search.

Step 305 is as follows.

Step 3051: Go to step 306 if the current grid point, or the adjacent grid point in the d direction, is not at a target and has been used, otherwise go to step 3052.

Step 3052: Obtain the cost ΔC for searching of the adjacent grid point in the d direction so that cost function identifier is obtained by reference to the grid table before the cost ΔC is obtained by reference to the cost function table.

Step 3053: Add the cost ΔC to the accumulated cost stored at the current grid point, and sets the sum as C.

Step 3054: Go to step 3055 if the grid point has been not yet been searched, otherwise go to step 3057.

Step 3055: Set the sum C at the current grid point as the accumulated cost, and set the incoming direction as d.

Step 3056: Store the current grid point in the wave front list, unless the current grid point is at the target.

Step 3057: Go to step 3058 if the sum C is smaller than the accumulated cost set at the current grid point, otherwise go to step 306.

Step 3058: Set the sum C at the looking grid point as accumulated cost, and sets the incoming direction as d.

The seventh embodiment has the advantage that it can completely prevent generation of any pattern cross-over in any wiring direction as it inhibits searching in a direction crossing the wiring direction.

3. Conclusion

As described above, a method according to the present invention permits the advantage that it permits a high wiring efficiency to be achieved, as the wiring directions of any of the wiring layers can be decided so as to contain as many nets as possible in each of the areas even if a large number of nets are needed in a particular xy direction.

Also, a method according to the present invention permits the advantage that the wiring patterns of short length can be found, as the wiring directions in each wiring layer are determined so that each of the areas can pass through as many nets as possible even if some nets have to be re-routed because of concentration of nets required in a particular direction in an area.

Further, a method according to the present invention permits the advantage that the wiring pattern can be determined in a reasonable calculation time, using a computer, as the determination of the wiring direction in advance of the wiring route search process provides a sufficient improvement even if the wiring route search process does not iterate the leveling process.

What is claimed is:

1. A method of determining routes for a plurality of wiring connections for at least one predetermined area of a circuit board having a plurality of layers by first determining a wiring direction for routing said wiring connections for each area of said circuit board prior to determining a routing pattern for said wiring connections for each of said layers, said method comprising the steps of:

establishing a plurality of wiring directions for said plurality of wiring connections for said at least one predetermined area by selecting candidates from preset combinations of wiring directions for areas of said plurality of layers corresponding to the same position of said at least one predetermined area;

assigning a respective first one of said plurality of wiring directions to each of said plurality of layers for said predetermined area;

determining, for said at least one predetermined area, a predicted number of said plurality of wiring connections corresponding to each of said plurality of wiring directions;

determining, for said at least one predetermined area, whether said predicted number of wiring connections exceeds a predetermined degree of congestion in any of said plurality of wiring directions; and assigning a respective second one of said plurality of wiring directions to at least one of said plurality of layers for said at least one predetermined area when said predicted number of wiring connections exceeds said predetermined degree of congestion for said predetermined area;

thereby to determine said routes for said plurality of wiring layers for said predetermined area on the basis of said respective second one of said plurality of wiring directions assigned to said at least one of said plurality of layers and said respective first one of said plurality of wiring directions assigned to said plurality of wiring layers.

2. A method according to claim 1, wherein said step of assigning a respective second one of said plurality of wiring directions is such as to eliminate said predetermined degree of congestion in said any of said plurality of wiring directions.

3. A method according to claim 1, wherein said plurality of wiring directions comprise first and second orthogonal wiring directions.

4. A method according to claim 1, wherein said plurality of wiring directions comprise first and second orthogonal wiring directions and at least one further wiring direction.

5. A method according to claim 1, wherein said at least one predetermined area is in the form of rectangle and at least one of said plurality of wiring directions is parallel to a side of said rectangle.

6. A method according to claim 1, wherein said step of determining, for said at least one predetermined area, a predicted number of wiring interconnections comprises:

determining a plurality of virtual routes for each of said wiring connections;

assigning a probability to each of said virtual routes; and calculating said predicted number on the basis of said probability of each of said virtual routes.

7. A method according to claim 1, wherein the step of assigning a respective first one of said plurality of wiring directions is done according to an xy rule wherein alternative layers of the circuit board have predetermined wiring directions that are perpendicular to one another.

8. A method according to claim 1, wherein said method is carried out without iterative processing for determining said routing pattern for said wiring connections for each of said layers.

9. A method of determining routes for a plurality of wiring connections for a plurality of predetermined areas of a circuit board having a plurality of layers by first determining a wiring direction for routing said wiring connections for each area of said circuit board prior to determining a routing pattern for said wiring connections for each of said layers, comprising the steps of:

establishing a plurality of wiring directions for said plurality of wiring connections for said plurality of predetermined areas by selecting for each of said plurality of predetermined areas, candidates from preset combinations of wiring directions for areas of said plurality of layers corresponding to the same position of each of said plurality of predetermined areas;

assigning a respective first one of said plurality of wiring directions to each of said plurality of layers for said plurality of predetermined areas;

determining, for said plurality of predetermined areas, a predicted number of said plurality of wiring connections corresponding to each of said plurality of wiring directions;

determining, for said plurality of predetermined areas, whether said predicted number of wiring connections exceeds a predetermined degree of congestion in any of said plurality of wiring directions; and assigning a respective second one of said plurality of wiring directions to at least one of said plurality of layers for said at least one of said plurality of predetermined areas when said predicted number of wiring connections exceeds said predetermined degree of congestion for said at least one of said predetermined areas;

thereby to determine said routes for said plurality of wiring layers for said plurality of predetermined areas on the basis of said respective second one of said plurality of wiring directions assigned to said at least one of said plurality of layers and said respective one first of said plurality of wiring directions assigned to said plurality of wiring layers.

10. A method according to claim 9, wherein said step of assigning a respective second one of said plurality of wiring directions is carried out independently for each of said plurality of predetermined areas.

11. A method according to claim 9, wherein said step of assigning a respective second one of said plurality of wiring layers is carried out such as to minimize the total over all said plurality of predetermined areas by which said predicted number of wiring connections exceed said corresponding predetermined degree of congestion for each of said plurality of predetermined areas.

12. A method according to claim 9, wherein said step of determining, for said at least one predetermined area, a predicted number of wiring interconnections comprises:

determining a plurality of virtual routes for each of said wiring connections;

assigning a probability to each of said virtual routes; and calculating said predicted number on the basis of said probability of each of said virtual routes.

13. A method according to claim 9, wherein the step of assigning a respective first one of said plurality of wiring directions is done according to an xy rule wherein alternate layers of the circuit board have predetermined wiring directions that are perpendicular to one another.

14. A method according to claim 9, wherein said method is carried out without iterative processing for determining said routing pattern for said wiring connections for each of said layers.

15. A method of determining routes for a plurality of wiring connections for at least one predetermined area of a circuit board having a plurality of layers by first determining a wiring direction for routing said wiring connections for each area of said circuit board prior to determining a routing pattern for said wiring connections for each of said layers, comprising:

establishing a plurality of wiring directions for said plurality of wiring connections for said at least one predetermined area by selecting candidates from preset combinations of wiring directions for areas of said plurality of layers corresponding to the same position of said at least one predetermined area;

determining a plurality of degrees of congestion of a predicted number of said wiring connections for said at least one predetermined area for said plurality of wiring directions, each of said plurality of degrees of congestion corresponding to a selected assignment of a respective area of said plurality of wiring directions to each of said plurality of layers for said at least one predetermined area; and selecting a desired one of said plurality of wiring directions, for said at least one area, for each of said wiring layers on the basis of said plurality of degrees of congestion;

thereby to determine said routes for said plurality of wiring connections on the basis of said selecting of said desired one of said plurality of wiring directions for each of said plurality of wiring layers.

16. A method according to claim 15, wherein said selecting of said desired one of said wiring directions for each of said plurality of wiring layers corresponds to a one of said plurality of degrees of congestion which has a minimum value among said plurality of degrees of congestion.

17. A method according to claim 15, wherein the step of establishing a plurality of wiring directions is done according to an xy rule wherein alternate layers of the circuit board have predetermined wiring directions that are perpendicular to one another.

18. A method according to claim 15, wherein said method is carried out without iterative processing for determining said routing pattern for said wiring connections for each of said layers.

19. A method of determining routes for a plurality of wiring connections for a plurality of predetermined areas of a circuit board having a plurality of layers, by first determining a wiring direction for routing said wiring connections for each area of said circuit board prior to determining a routing pattern for said wiring connections for each of said layers, comprising the steps of:

establishing a plurality of wiring directions for said plurality of wiring connections for said plurality of predetermined areas by selecting for each of said plurality of predetermined areas, candidates from preset combinations of wiring directions for areas of said plurality of layers corresponding to the same position of each of said plurality of predetermined areas;

determining a plurality of degrees of congestion of a predicted number of said wiring connections for said plurality of predetermined areas for said plurality of wiring directions, each of said plurality of degrees of congestion corresponding to a selected assignment of a respective one of said plurality of wiring directions to each of said plurality of layers for each of said plurality of predetermined areas; and selecting a desired one of said plurality of wiring directions, for said each plurality of predetermined areas, for each of said wiring layers on the basis of said plurality of degrees of congestion;

thereby to determine said routes for said plurality of wiring connections on the basis of said selecting of said desired one of said plurality of wiring directions for each of said plurality of wiring layers.

20. A method according to claim 19, wherein said selecting of said desired one of said wiring directions for each of said wiring layers corresponds to a selection for which the sum over all said plurality of predetermined areas of said plurality of degrees of congestion is minimum.

21. A method according to claim 19, comprising:

establishing a plurality of wiring directions for said plurality of wiring connections for said at least one predetermined area;

determining a plurality of degrees of congestion of a predicted number of said wiring connections for said at least one predetermined area for said plurality of wiring directions, each of said plurality of degrees of congestion corresponding to a selected assignment of a respective area of said plurality of wiring directions to each of said plurality of layers for said at least one predetermined area; and selecting a desired one of said plurality of wiring directions, for said at least one area, for each of said wiring layers on the basis of said plurality of degrees of congestion;

thereby to determine said routes for said plurality of wiring connections on the basis of said selecting of said desired one of said plurality of wiring directions for each of said plurality of wiring layers.

22. A method according to claim 19, wherein said method is carried out without iterative processing for determining said routing pattern for said wiring connections for each of said layers.

23. A method of determining routes for a plurality of wiring connections for at least one predetermined area on a circuit board having a plurality of layers by first determining a wiring direction for routing said wiring connections for each area of said circuit board prior to determining a routing pattern for said wiring connections for each of said layers, wherein, for said at least one predetermined area of said circuit board, candidates from preset combinations of wiring directions for areas of said plurality of layers corresponding to the same position of said at least one predetermined area are successively selected, and a wiring direction is determined for each layer on the basis of a degree of congestion of a predicted number of said wiring connections for said at least one predetermined area for said selected candidates of preset combinations of wiring directions, over all said plurality of layers.

24. A method according to claim 23, wherein initial wiring directions for each layer, before the degree of congestion is determined, are assigned according to an xy rule wherein alternate layers of the circuit board have predetermined wiring directions that are perpendicular to one another.

25. A method according to claim 23, wherein said method is carried out without iterative processing for determining said routing pattern for said wiring connections for each of said layers.

26. A method of determining routes for a plurality of wiring connections on a predetermined area of a circuit board, said circuit board having a plurality of layers by first determining a wiring direction for routing said wiring connections for each area of said circuit board prior to determining a routing pattern for said wiring connections for each of said layers, comprising:

a) establishing a plurality of wiring directions for said plurality of wiring connections for said at least one predetermined area by selecting candidates from preset combinations of wiring directions for areas of said plurality of layers corresponding to the same position of said at least one predetermined area;

b) assigning a respective one of said plurality of wiring directions to each of said plurality of layers;

c) determining an excess number value, said excess number value being the sum of the amounts by which a predicted number of wiring connections exceeds a predetermined value for each of said plurality of wiring directions on the basis of said assigning of said respective one of said plurality of wiring directions to each of said plurality of layers;

d) assigning at least one further one of said plurality of wiring directions to at least some of said wiring layers and repeating step c) on the basis of said assigning of said at least one further one of said plurality of wiring directions, thereby to determine a plurality of excess number values; and e) determining the minimum excess number value, thereby to determine an optimum assigning of said plurality of wiring directions to each of said plurality of layers.

27. A method according to claim 26, wherein the step of assigning a respective one of said plurality of wiring directions is done according to an xy rule wherein alternate layers of the circuit board have predetermined wiring directions that are perpendicular to one another.

28. A method according to claim 26, wherein said method is carried out without iterative processing for determining said routing pattern for said wiring connections for each of said layers.

* * * * *